United States Patent
Ebisui et al.

(10) Patent No.: US 10,627,297 B2
(45) Date of Patent: Apr. 21, 2020

(54) INPUT DEVICE PRESSING UNIT

(71) Applicant: SONY CORPORATION, Tokyo (JP)

(72) Inventors: Akira Ebisui, Kanagawa (JP); Hiroshi Mizuno, Kanagawa (JP); Tomoko Katsuhara, Kanagawa (JP); Taizo Nishimura, Kanagawa (JP); Yoshiaki Sakakura, Kanagawa (JP); Toshio Kano, Kanagawa (JP); Toshiyuki Onodera, Miyagi (JP); Takeshi Takahashi, Miyagi (JP); Toru Takahashi, Miyagi (JP); Tatsuo Suzuki, Miyagi (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/086,598

(22) PCT Filed: Mar. 21, 2017

(86) PCT No.: PCT/JP2017/011185
§ 371 (c)(1),
(2) Date: Sep. 19, 2018

(87) PCT Pub. No.: WO2017/169974
PCT Pub. Date: Oct. 5, 2017

(65) Prior Publication Data
US 2019/0107447 A1    Apr. 11, 2019

(30) Foreign Application Priority Data

Mar. 28, 2016 (JP) .................. 2016-064658

(51) Int. Cl.
*H01H 13/48* (2006.01)
*H03K 17/96* (2006.01)
*G01L 1/14* (2006.01)
*H01H 13/00* (2006.01)
*H03K 17/975* (2006.01)
*G06F 3/041* (2006.01)

(52) U.S. Cl.
CPC ............ *G01L 1/146* (2013.01); *G06F 3/0414* (2013.01); *H01H 13/00* (2013.01); *H01H 13/48* (2013.01);
(Continued)

(58) Field of Classification Search
CPC ...... G06F 3/0414; G06F 3/0202; G06F 3/044; G06F 3/02; H01H 13/48;
(Continued)

(56) References Cited

U.S. PATENT DOCUMENTS 3,728,509 A * 4/1973 Shimojo ................ H01H 1/029
200/512
4,677,268 A * 6/1987 Nemeth ............... H01H 13/702
200/513
(Continued)

FOREIGN PATENT DOCUMENTS

CN    1906719 A    1/2007
JP    07-29729 A    6/1995
(Continued)

OTHER PUBLICATIONS

International Search Report and Written Opinion of PCT Application No. PCT/JP2017/011185, dated Jun. 27, 2017, 12 pages of ISRWO.

*Primary Examiner* — Vanessa Girardi
(74) *Attorney, Agent, or Firm* — Chip Law Group

(57) ABSTRACT

A sensor includes a base layer and a pressing unit protruding with respect to the base layer. The pressing unit includes a first structure unit and a hollow second structure unit disposed on the first structure unit and having a bottom side opened. The second structure unit has a shape portion on a surface facing the base layer.

27 Claims, 49 Drawing Sheets

(52) U.S. Cl.
CPC ......... *H03K 17/962* (2013.01); *H03K 17/975* (2013.01)

(58) Field of Classification Search
CPC ... H01H 13/702–704; H01H 2227/016; H01H 2227/02; H01H 2227/022; H01H 2215/004; H01H 2215/008; H01H 2215/018; H01H 2215/022; H03K 17/9622; H03K 17/975; H03K 2217/960755
See application file for complete search history.

(56) References Cited

U.S. PATENT DOCUMENTS

| | | | | |
|---|---|---|---|---|
| 7,301,113 | B2* | 11/2007 | Nishimura | H01H 13/48 200/406 |
| 10,394,339 | B2* | 8/2019 | Ebisui | G06F 3/0414 |
| 2002/0130024 | A1 | 9/2002 | Kawaguchi et al. | |
| 2008/0164133 | A1 | 7/2008 | Hayafune | |

FOREIGN PATENT DOCUMENTS

| | | |
|---|---|---|
| JP | 07-029729 U | 6/1995 |
| JP | 2000-100281 A | 4/2000 |
| JP | 2002-245895 A | 8/2002 |
| JP | 2007-141871 A | 6/2007 |
| JP | 2010-176438 A | 8/2010 |
| JP | 2010-244795 A | 10/2010 |
| JP | 2012-109272 A | 6/2012 |
| JP | 2013-020765 A | 1/2013 |
| KR | 10-2006-0055582 A | 5/2006 |
| WO | 2004/055848 A1 | 7/2004 |
| WO | 2005/124805 A1 | 12/2005 |

* cited by examiner

INPUT DEVICE PRESSING UNIT

CROSS REFERENCE TO RELATED APPLICATIONS

This application is a U.S. National Phase of International Patent Application No. PCT/JP2017/011185 filed on Mar. 21, 2017, which claims priority benefit of Japanese Patent Application No. JP 2016-064658 filed in the Japan Patent Office on Mar. 28, 2016. Each of the above-referenced applications is hereby incorporated herein by reference in its entirety.

TECHNICAL FIELD

The present technology relates to a sensor, an input device including the sensor, and an electronic apparatus including the sensor. Specifically, the present technology relates to a sensor, an input device including the sensor, and an electronic apparatus including the sensor.

BACKGROUND ART

In recent years, it is required for a mobile personal computer (PC) or a tablet PC to be thin. It is also required for an input device (keyboard) attached to the PCs to be thin. As a thin input device, a device in which a pressing unit is constituted by a resin film, a metal thin plate, or the like has been proposed (see, for example, Patent Documents 1 to 3).

CITATION LIST

Patent Document

Patent Document 1: Japanese Patent Application Laid-Open No. 2012-109272
Patent Document 2: Japanese Patent Application Laid-Open No. 2010-244795
Patent Document 3: Japanese Patent Application Laid-Open No. 2013-020765

SUMMARY OF THE INVENTION

Problems to be Solved by the Invention

However, the pressing unit constituted by a resin film, a metal thin plate, or the like easily causes returning failure.

An object of the present technology is to provide a sensor, an input device, and an electronic apparatus capable of suppressing returning failure of a pressing unit.

Solutions to Problems

In order to solve the above-described problem, a first technique is a sensor including a base layer and a pressing unit protruding with respect to the base layer, in which the pressing unit includes a first structure unit and a hollow second structure unit disposed on the first structure unit and having a bottom side opened, and the second structure unit has a shape portion on a surface facing the base layer.

A second technique is a sensor including a base layer and a pressing unit protruding with respect to the base layer, in which the pressing unit includes a first structure unit and a hollow second structure unit disposed on the first structure unit and having a bottom side opened, and the base layer has a shape portion at a position facing the second structure unit and/or at a position facing a boundary portion between the first structure unit and the second structure unit.

A third technique is a sensor including a base layer and a pressing unit protruding with respect to the base layer, in which the pressing unit includes a first structure unit and a hollow second structure unit disposed on the first structure unit and having a bottom side opened, and the base layer has a hole portion at a position facing the second structure unit and/or at a position facing a boundary portion between the first structure unit and the second structure unit.

A fourth technique is a sensor including a base layer and a pressing unit protruding with respect to the base layer, in which the pressing unit includes a first structure unit and a hollow second structure unit disposed on the first structure unit and having a bottom side opened, and the second structure unit has a through hole.

A fifth technique is a sensor including a base layer and a pressing unit protruding with respect to the base layer, in which the pressing unit includes a first structure unit and a hollow second structure unit disposed on the first structure unit and having a bottom side opened, the base layer has unevenness on a surface facing the pressing unit, and the unevenness has an arithmetic average roughness Ra of 0.48 µm or more.

A sixth technique is a sensor including a base layer and a pressing unit protruding with respect to the base layer, in which the pressing unit includes a first structure unit and a hollow second structure unit disposed on the first structure unit and having a bottom side opened, the pressing unit has unevenness on a surface facing the base layer, and the unevenness has an arithmetic average roughness Ra of 0.48 µm or more.

A seventh technique is an input device including the sensor according to any one of the first to sixth techniques.

An eighth technique is an electronic apparatus including the sensor according to any one of the first to sixth techniques.

In the present technology, the shape portion of the second structure unit is a protruding shape portion protruding toward the base layer or a recessed shape portion recessed in a direction away from the base layer.

In the present technology, the shape portion of the base layer is a protruding shape portion protruding with respect to a surface of the base layer or a recessed shape portion recessed with respect to the surface of the base layer.

Effects of the Invention

As described above, according to the present technology, it is possible to suppress returning failure of the pressing unit.

Figure 13A:
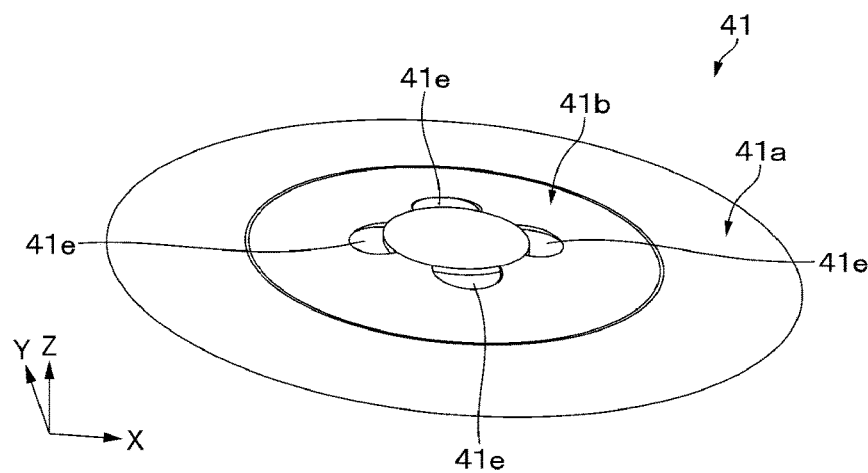
Figure 13B:
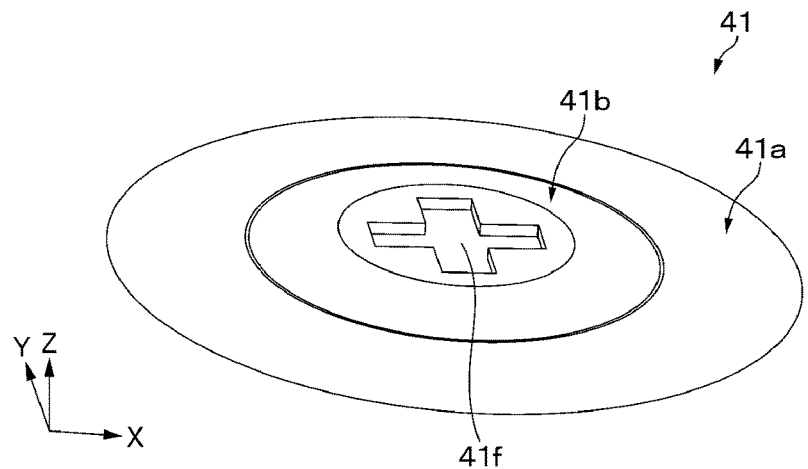

Each of FIGS. 13A and 13B is a perspective view illustrating an example of a configuration of a pressing unit of a sensor according to a modified example of the first embodiment of the present technology.

Figure 14A:
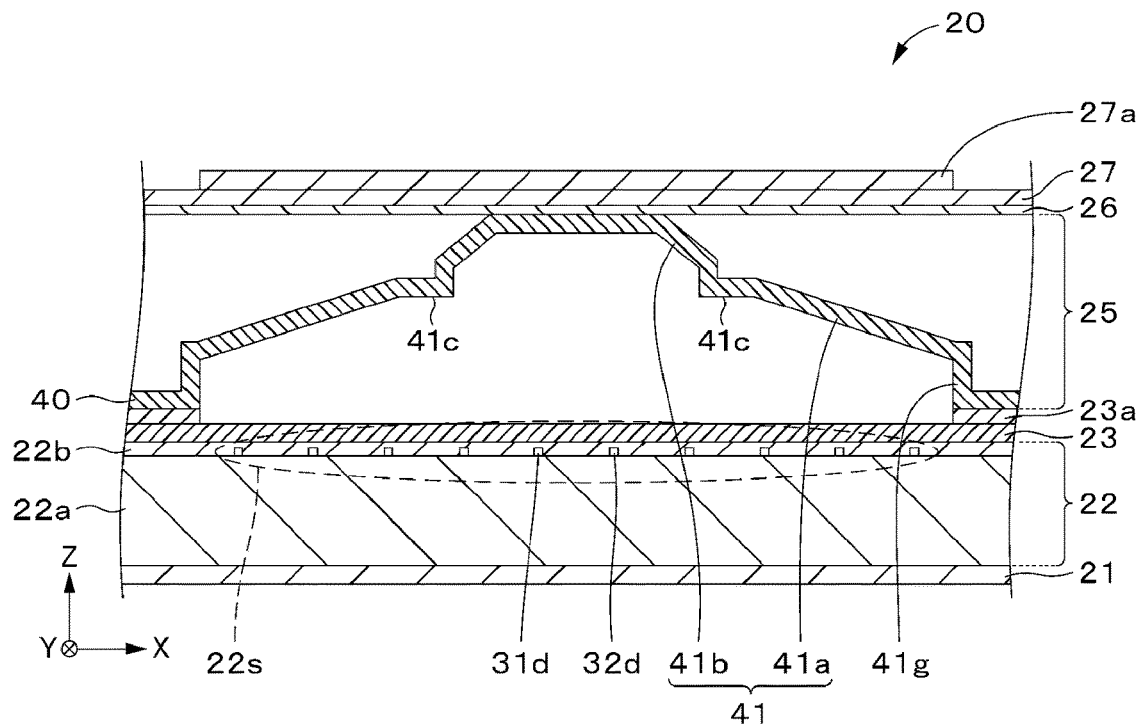
Figure 14B:
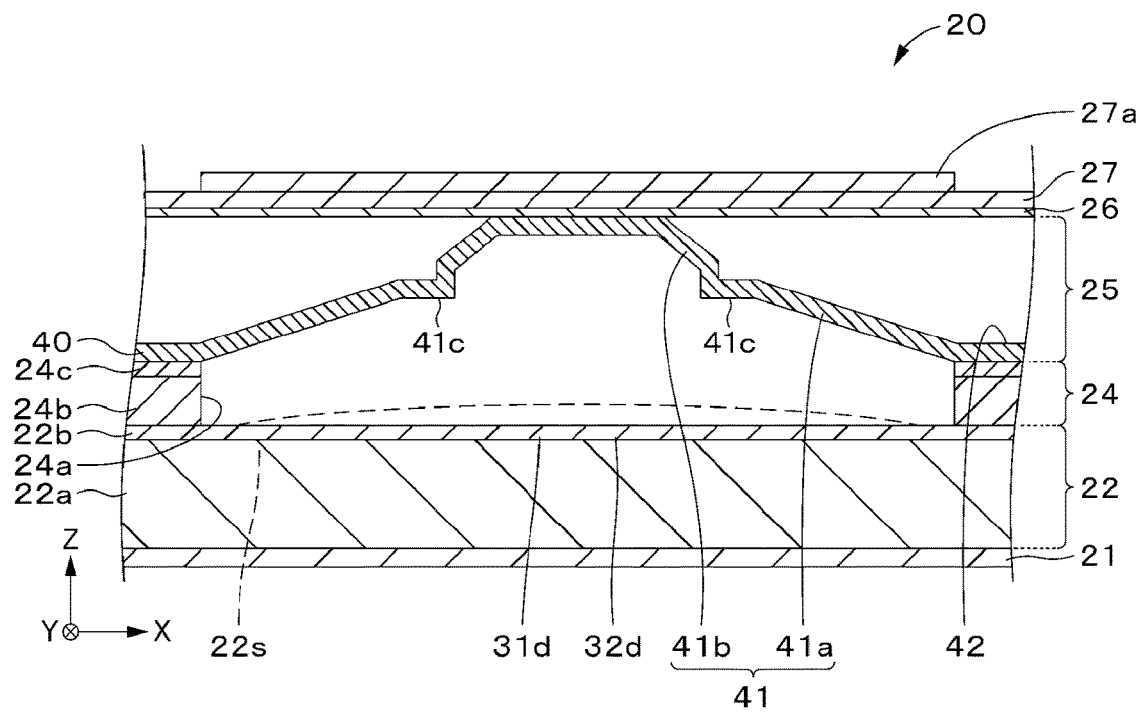

Each of FIGS. 14A and 14B is a cross-sectional view illustrating an example of a configuration of a sensor according to a modified example of the first embodiment of the present technology.

Figure 15A:
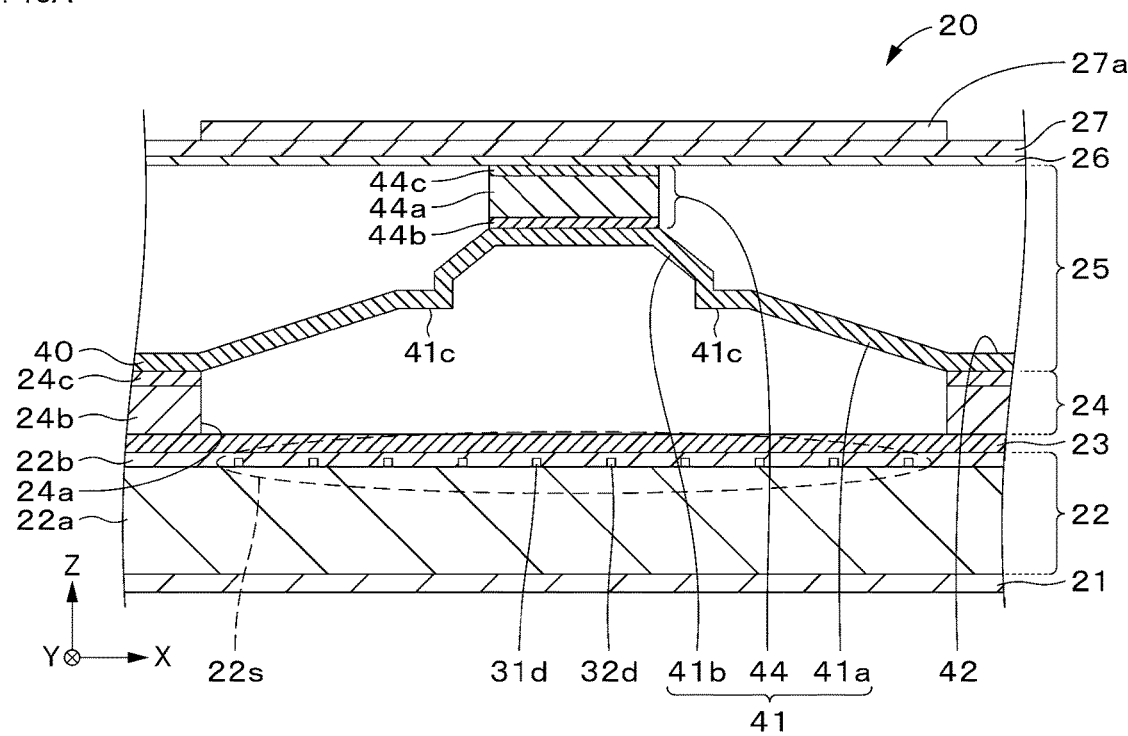
Figure 15B:
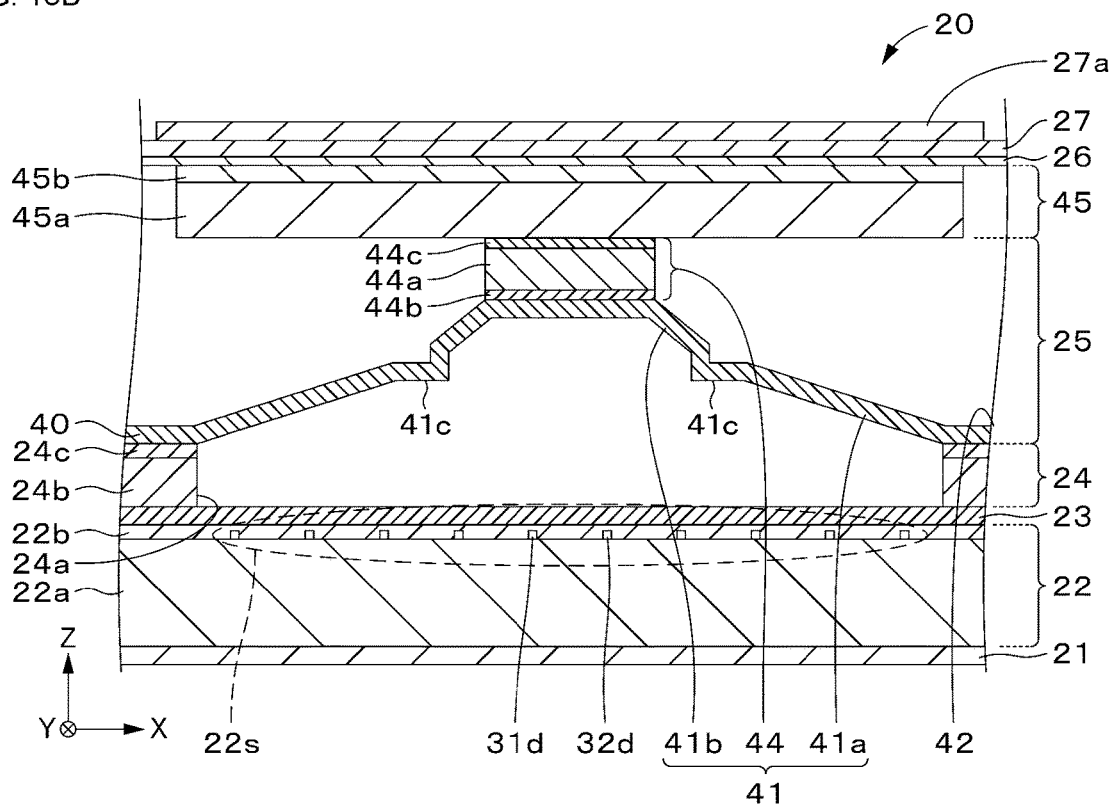

Each of FIGS. 15A and 15B is a cross-sectional view illustrating an example of a configuration of a sensor according to a modified example of the first embodiment of the present technology.

Figure 16:
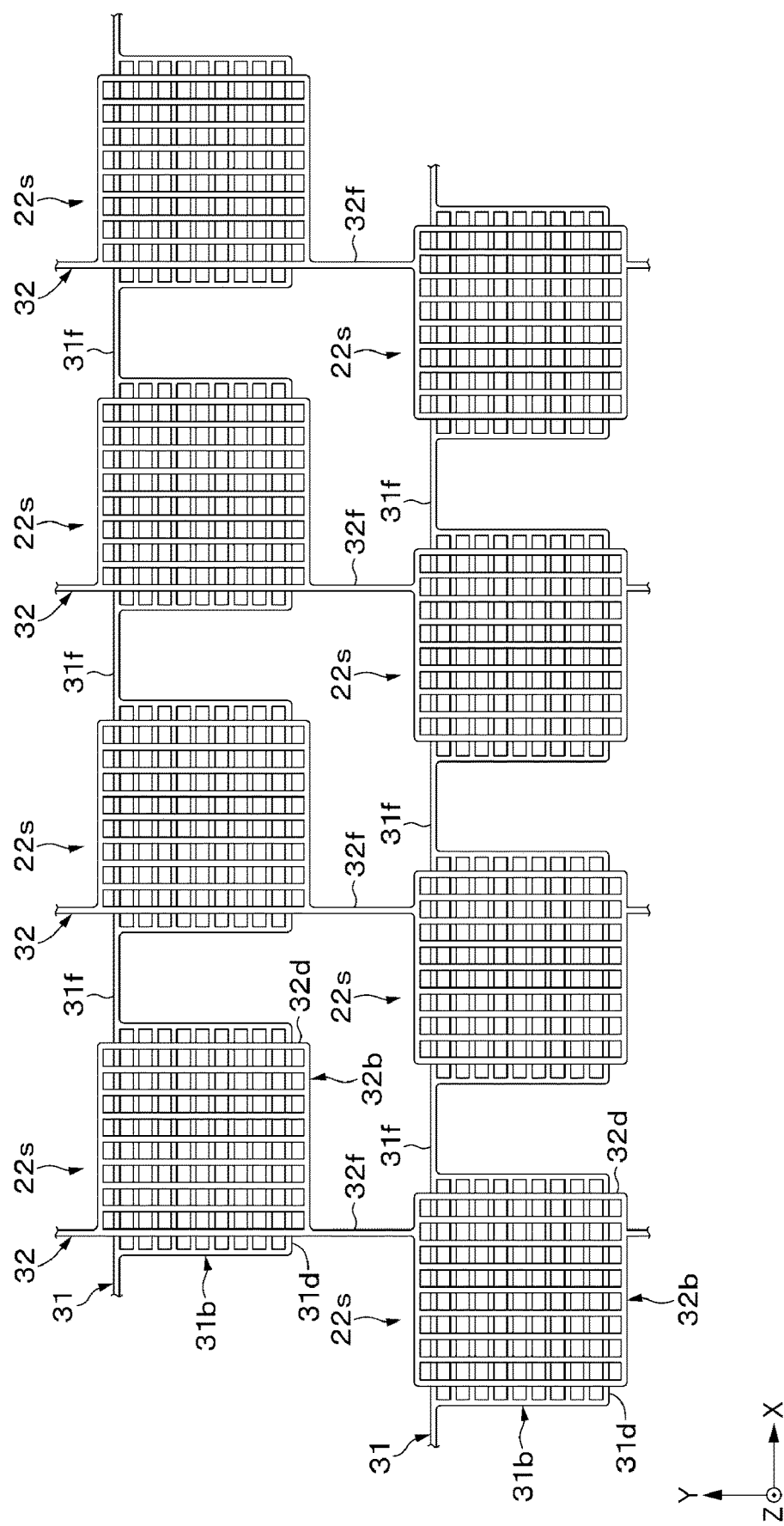

FIG. 16 is a plan view illustrating an example of a configuration of X and Y electrodes of a sensor according to a modified example of the first embodiment of the present technology.

Figure 17A:
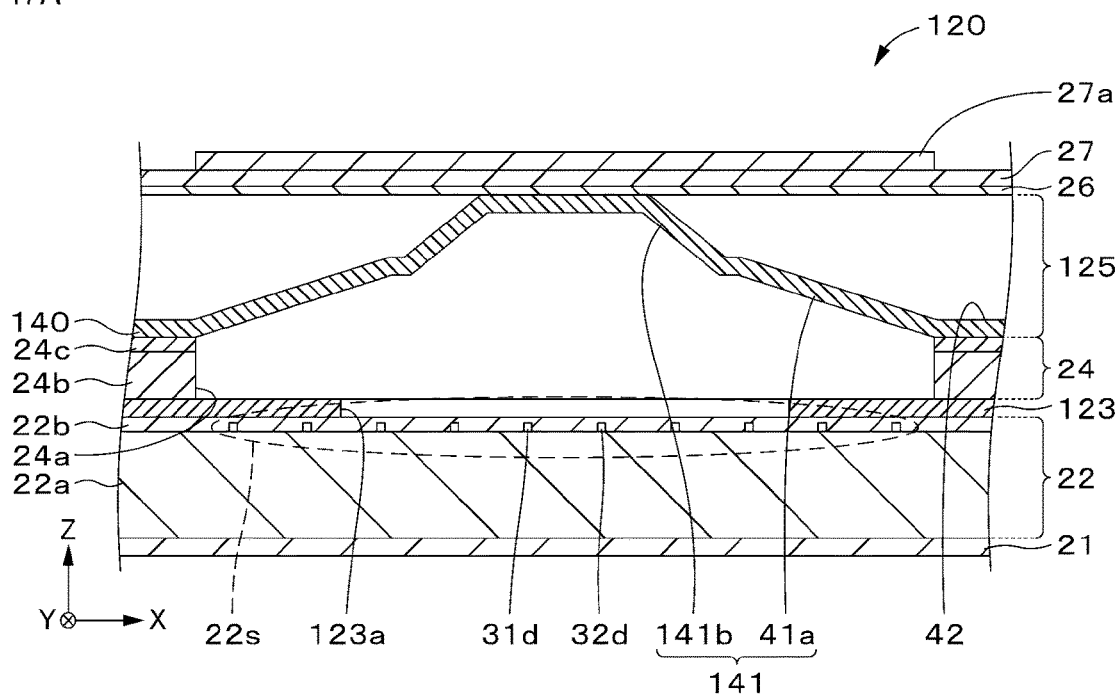

FIG. 17A is a cross-sectional view illustrating an example of a configuration of a sensor according to a second embodiment of the present technology.

Figure 17B:
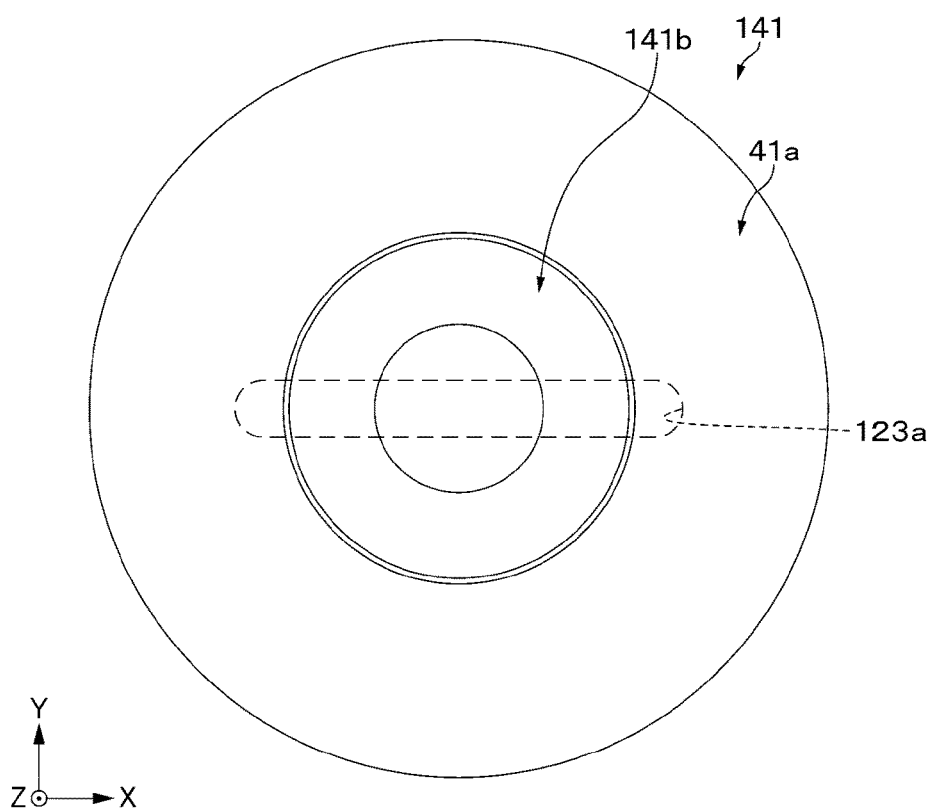

FIG. 17B is a plan view illustrating an example of a configuration of a hole portion of a substrate.

Figure 18:
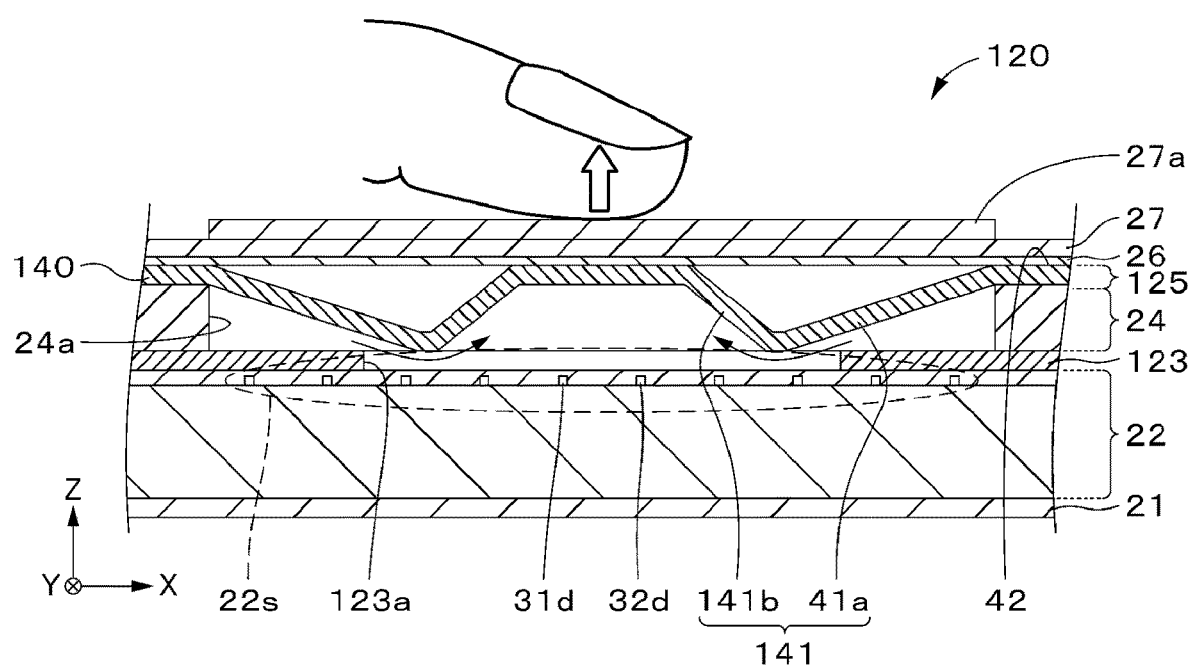

FIG. 18 is a cross-sectional view illustrating an example of a state of a sensor when pressing of a key is released.

Figure 19A:
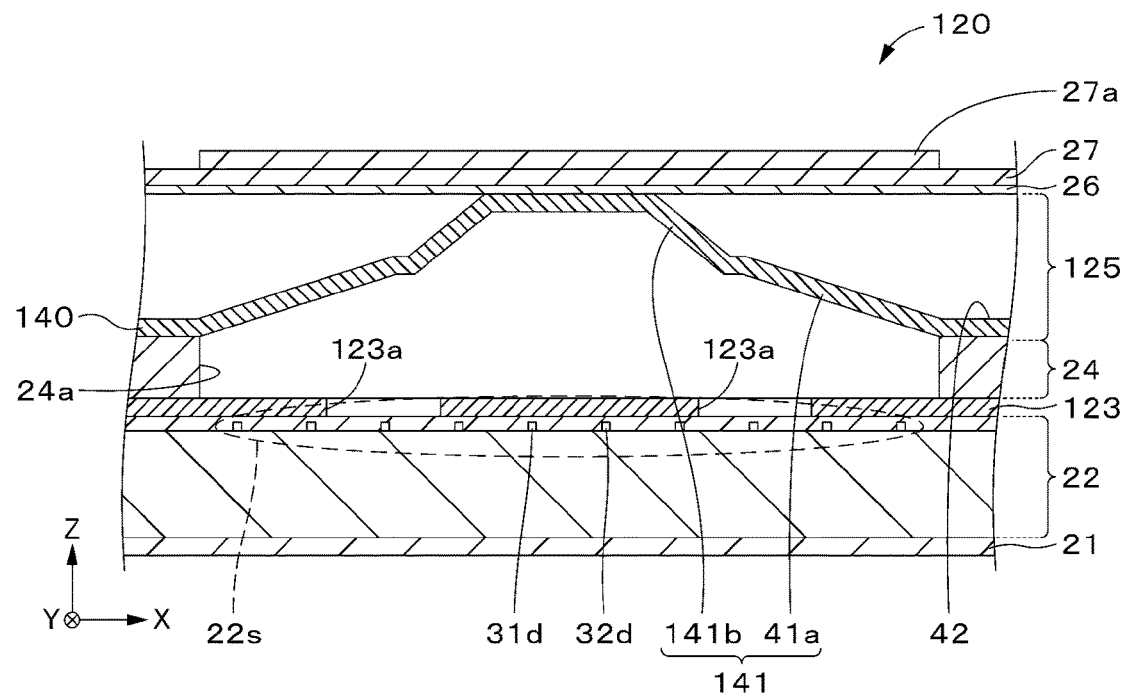

FIG. 19A is a cross-sectional view illustrating an example of a configuration of a sensor according to a modified example of the second embodiment of the present technology.

Figure 19B:
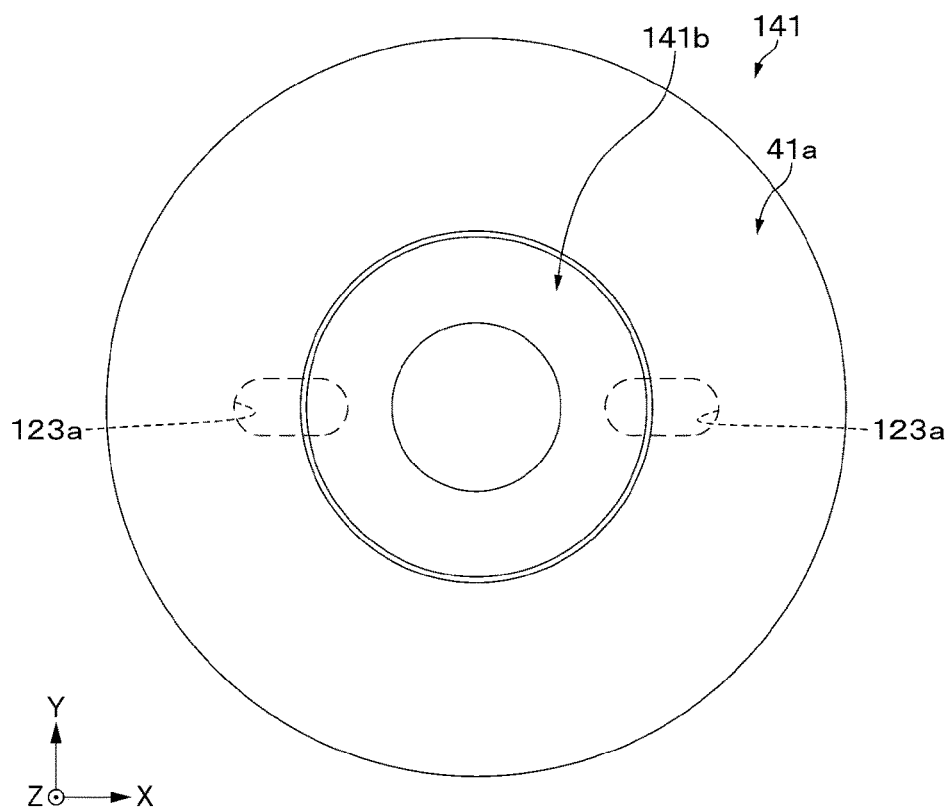

FIG. 19B is a plan view illustrating an example of a configuration of a hole portion of a substrate.

Figure 20A:
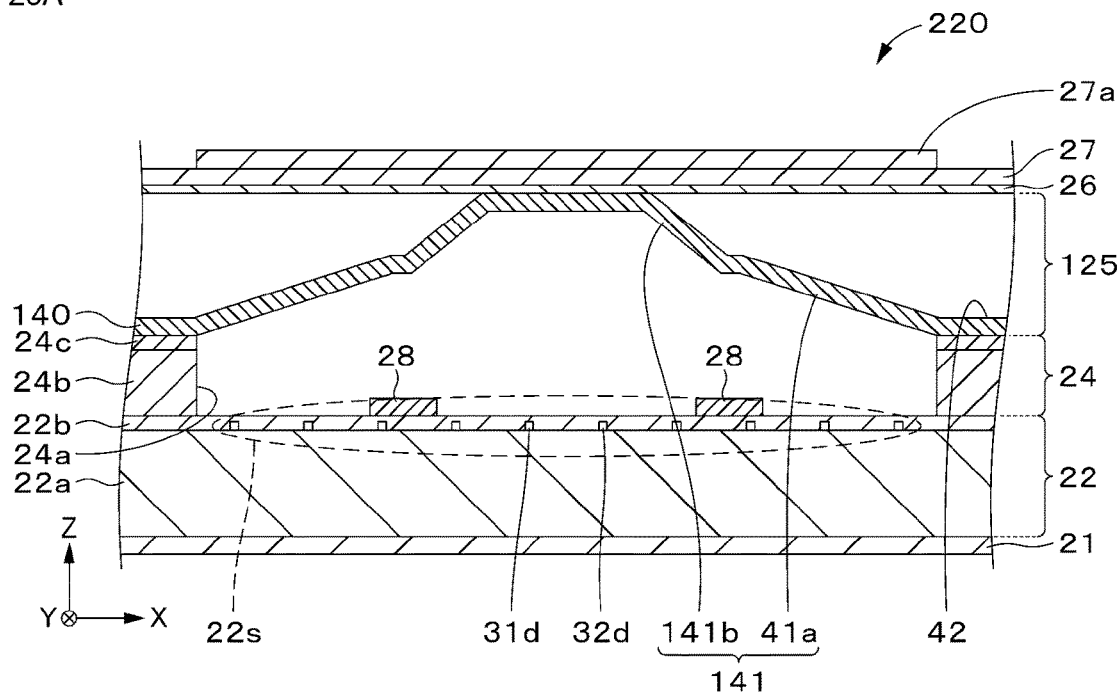
Figure 20B:
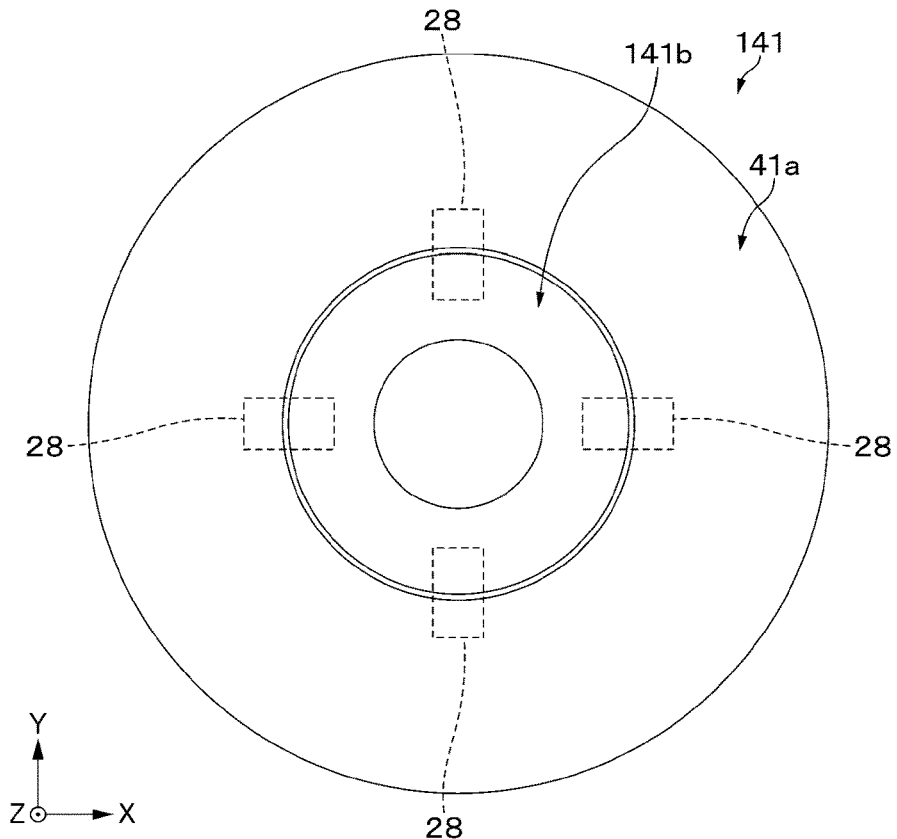

FIG. 20A is a cross-sectional view illustrating an example of a configuration of a sensor according to a third embodiment of the present technology. FIG. 20B is a plan view illustrating an example of a configuration of a shape portion formed on a surface of a sensor layer.

Figure 21:
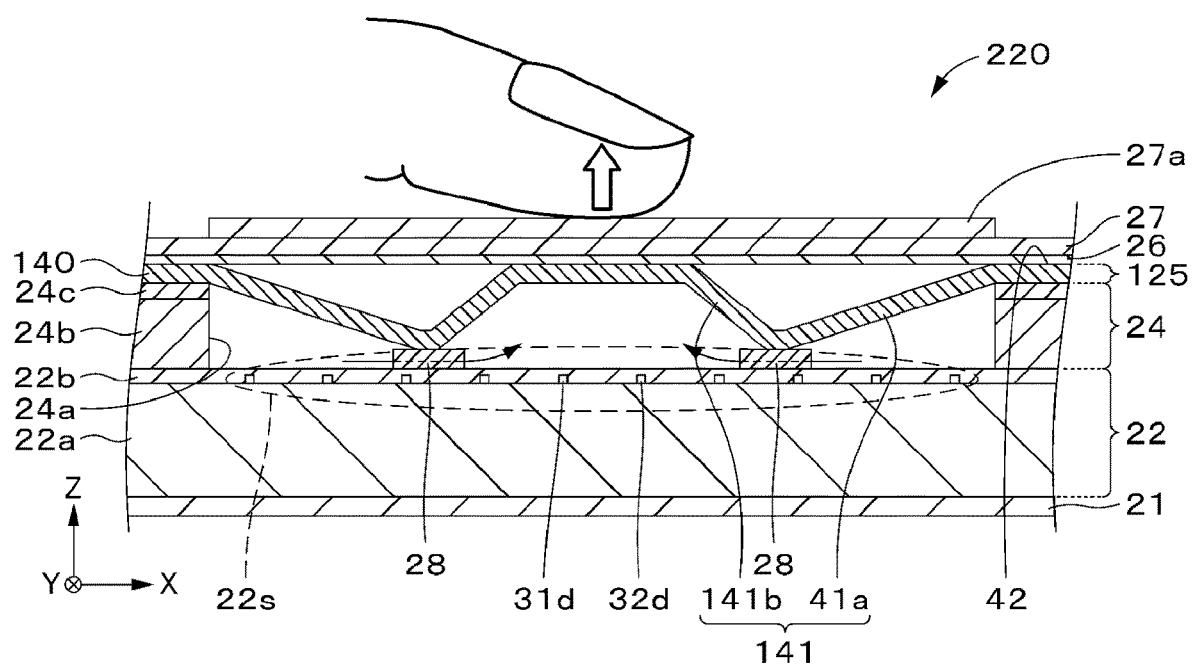

FIG. 21 is a cross-sectional view illustrating an example of a state of a sensor when pressing of a key is released.

Figure 22A:
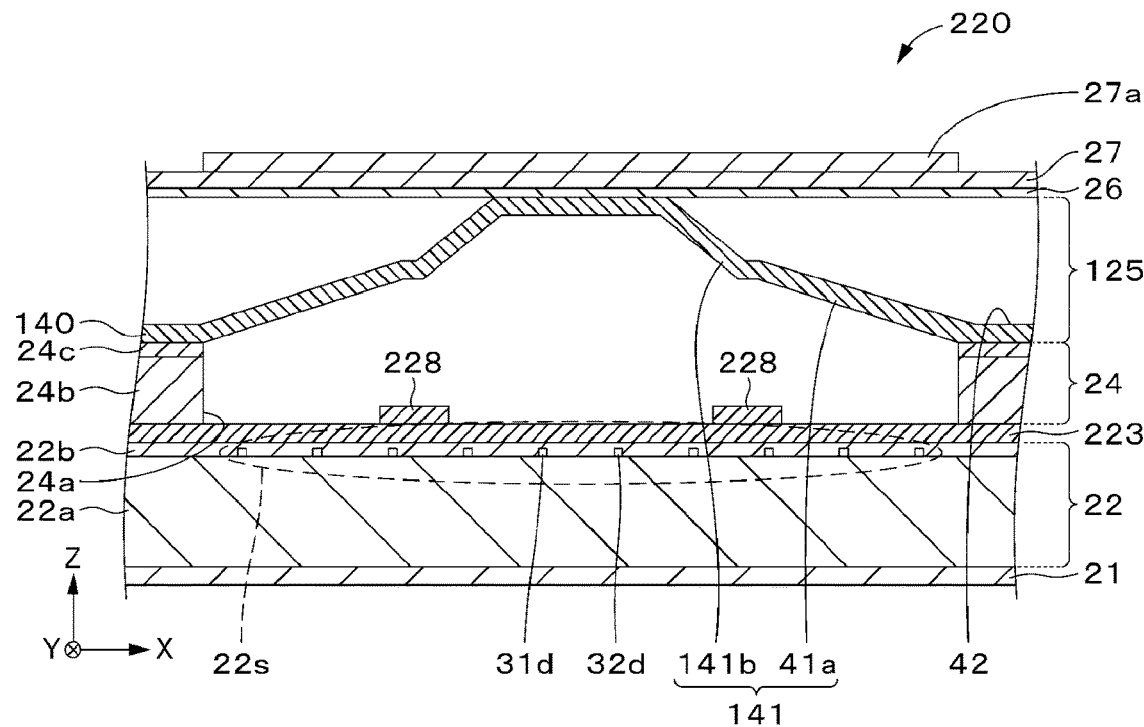
Figure 22B:
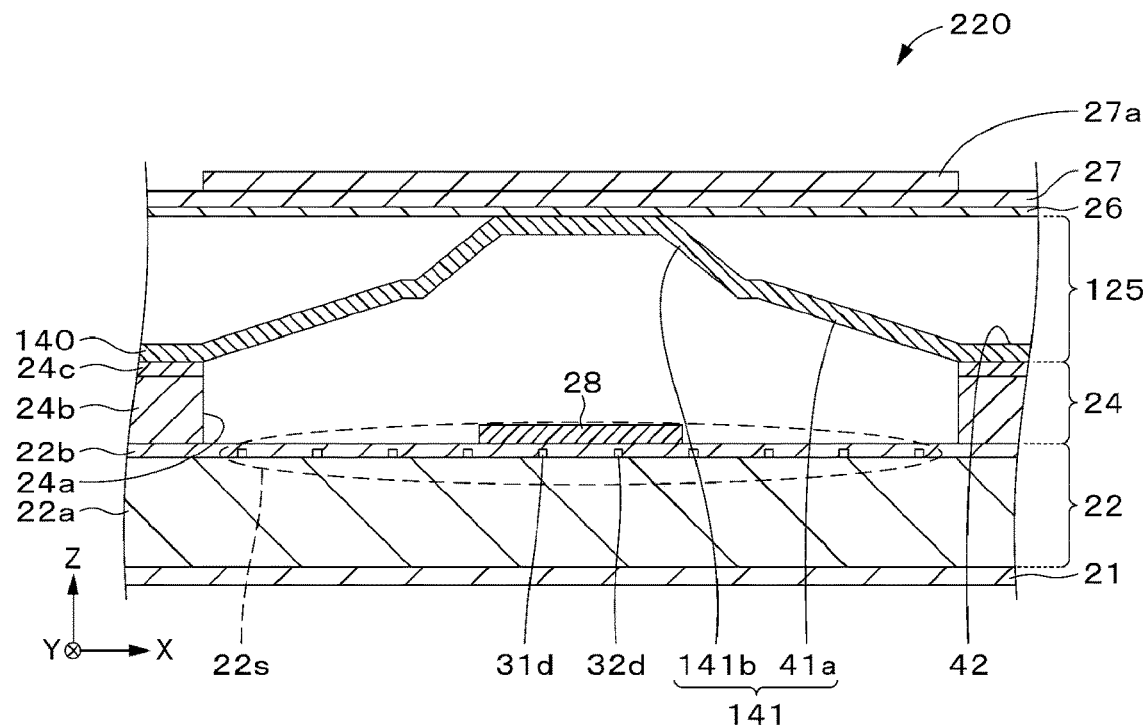

Each of FIGS. 22A and 22B is a cross-sectional view illustrating an example of a configuration of a sensor according to a modified example of the third embodiment of the present technology.

Figure 23:
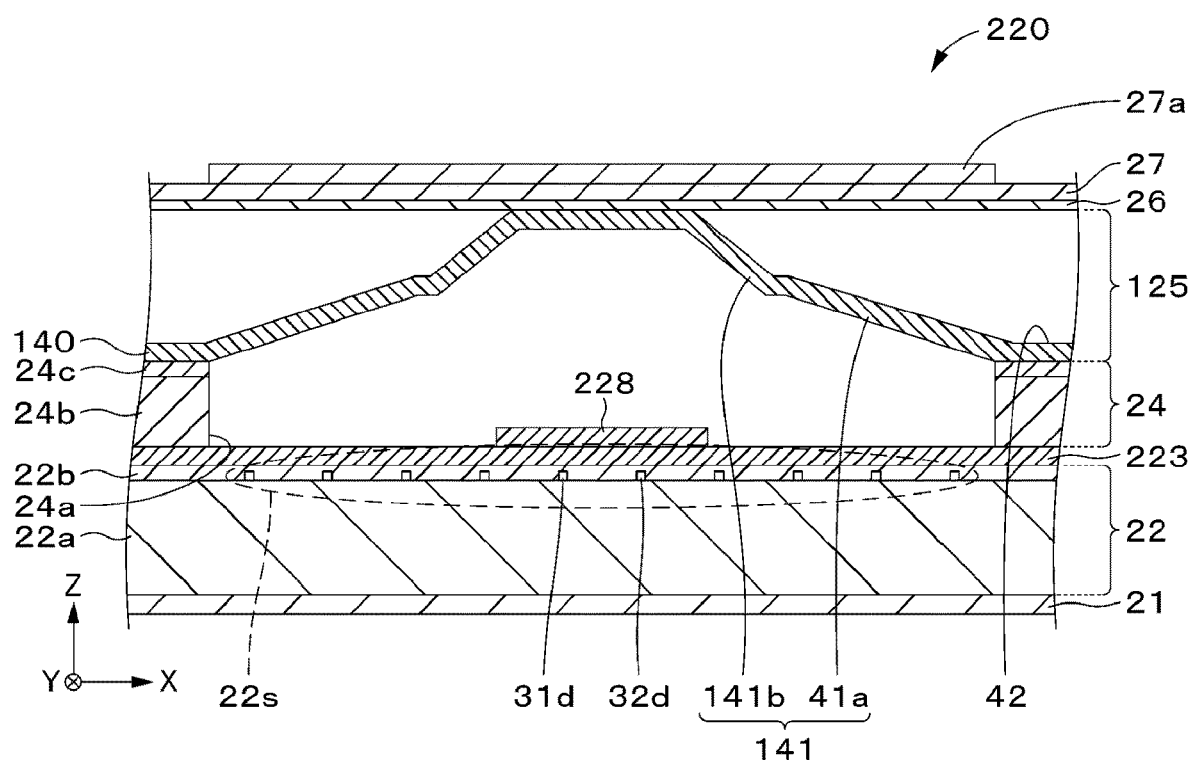

FIG. 23 is a cross-sectional view illustrating an example of a configuration of a sensor according to a modified example of the third embodiment of the present technology.

Figure 24A:
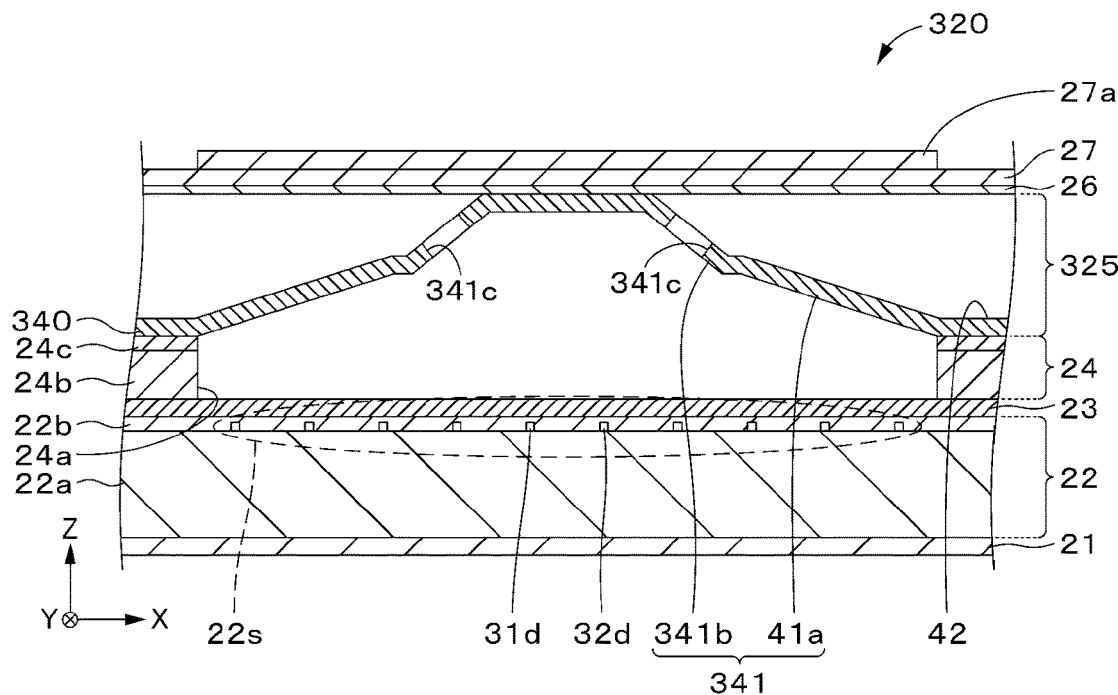

FIG. 24A is a cross-sectional view illustrating an example of a configuration of a sensor according to a fourth embodiment of the present technology.

Figure 24B:
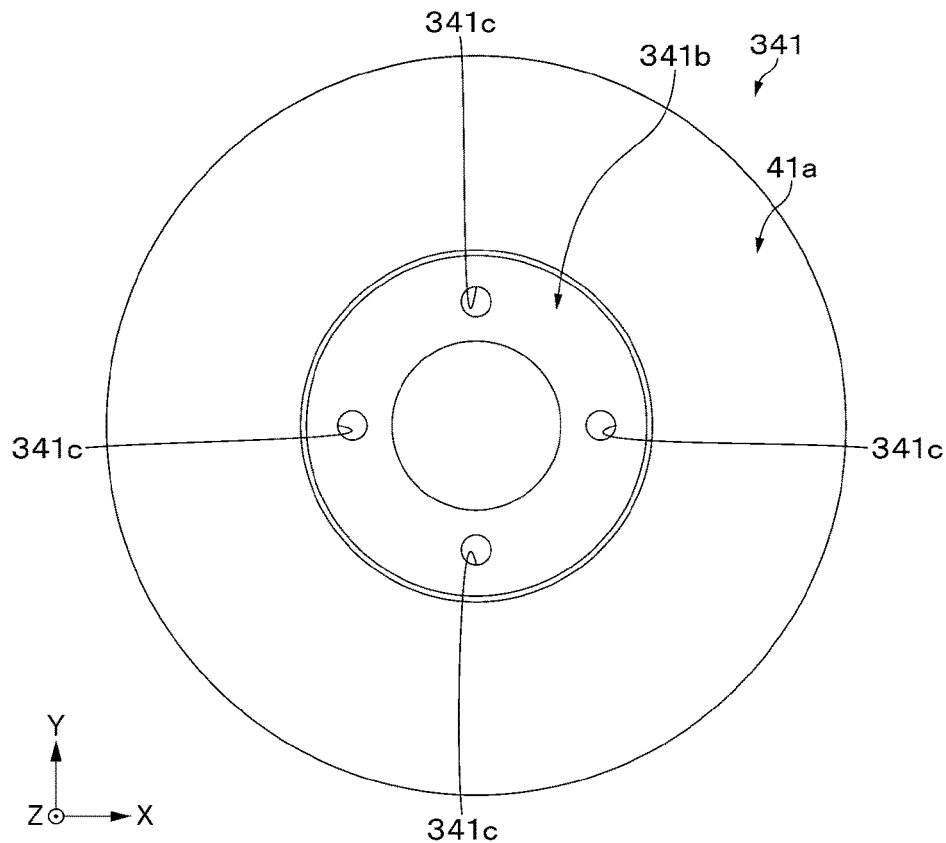

FIG. 24B is a plan view illustrating an example of a configuration of a pressing unit.

Figure 25:
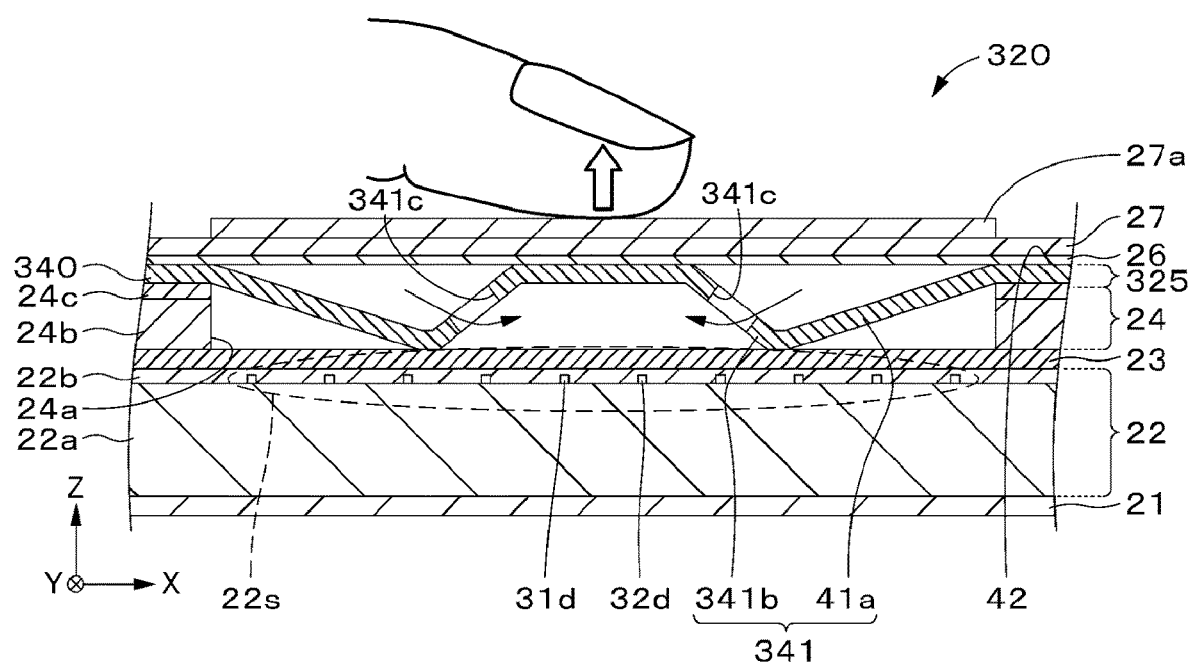

FIG. 25 is a cross-sectional view illustrating an example of a state of a sensor when pressing of a key is released.

Figure 26A:
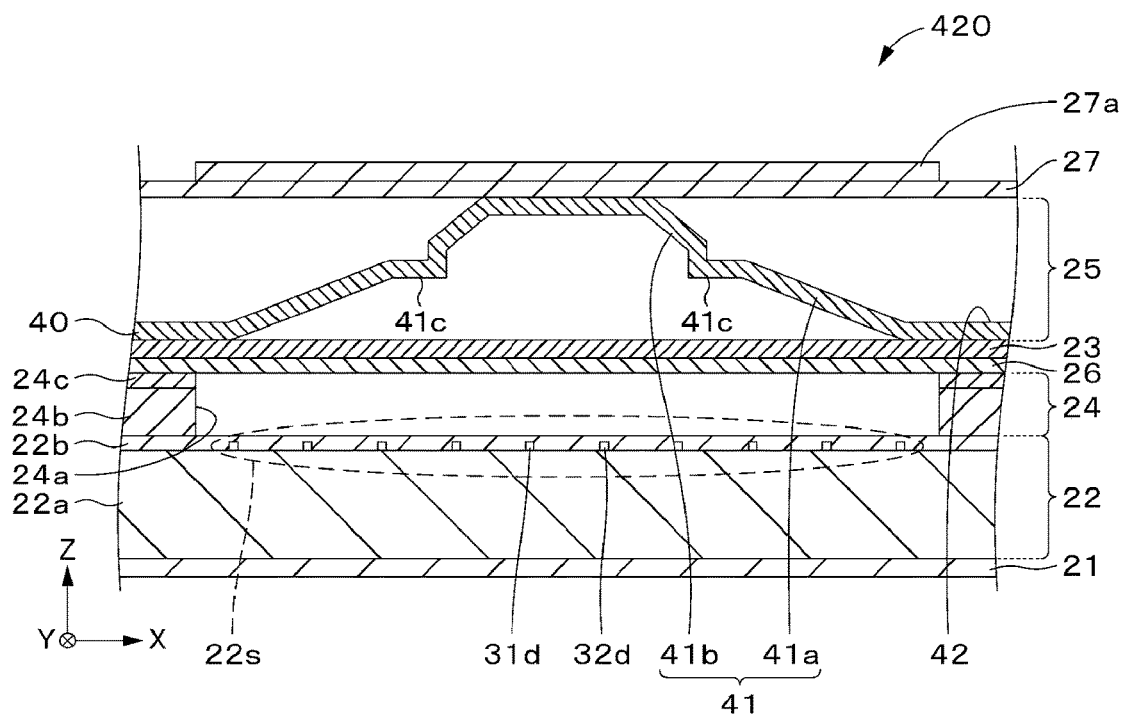

FIG. 26A is a cross-sectional view illustrating an example of a configuration of a sensor according to a fifth embodiment of the present technology.

Figure 26B:
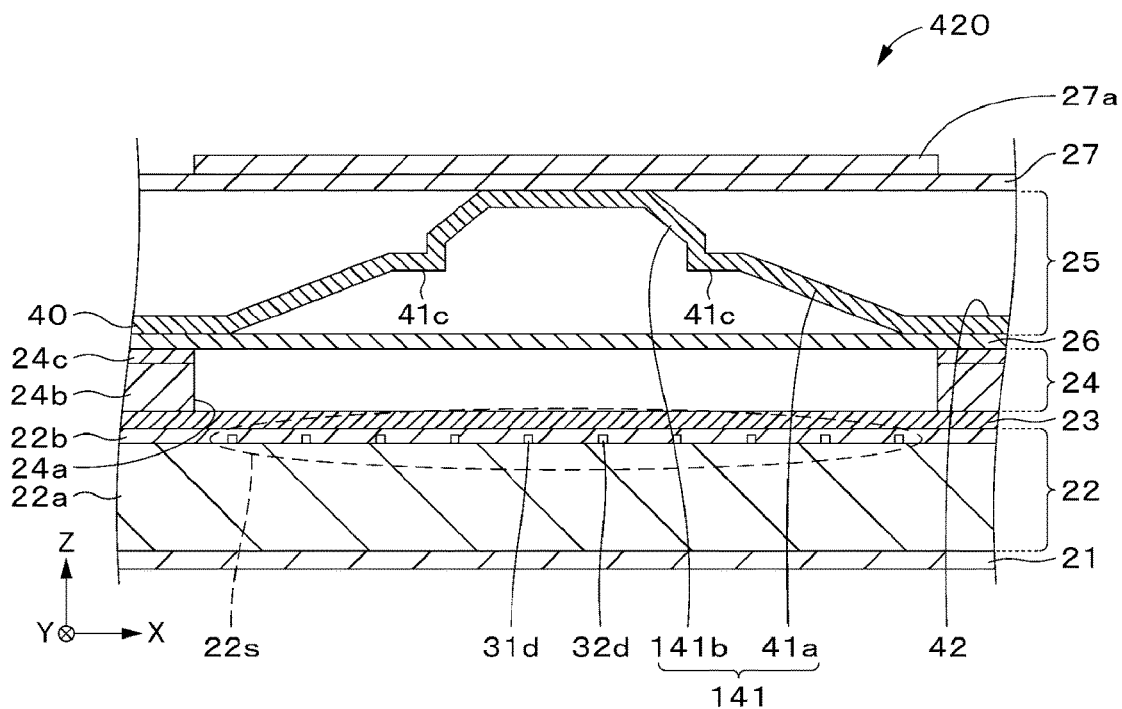

FIG. 26B is a cross-sectional view illustrating an example of a configuration of a sensor according to a modified example of the fifth embodiment of the present technology.

Figure 27A:
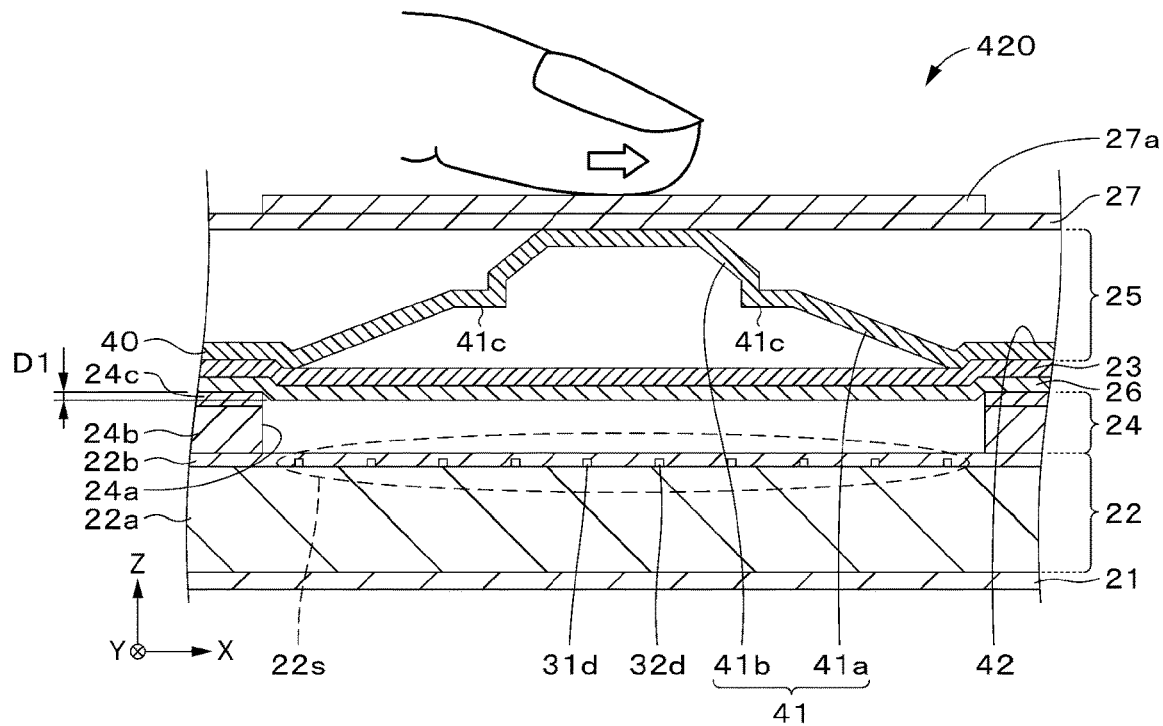

FIG. 27A is a cross-sectional view for explaining an example of an operation of a sensor when a gesture input operation is performed.

Figure 27B:
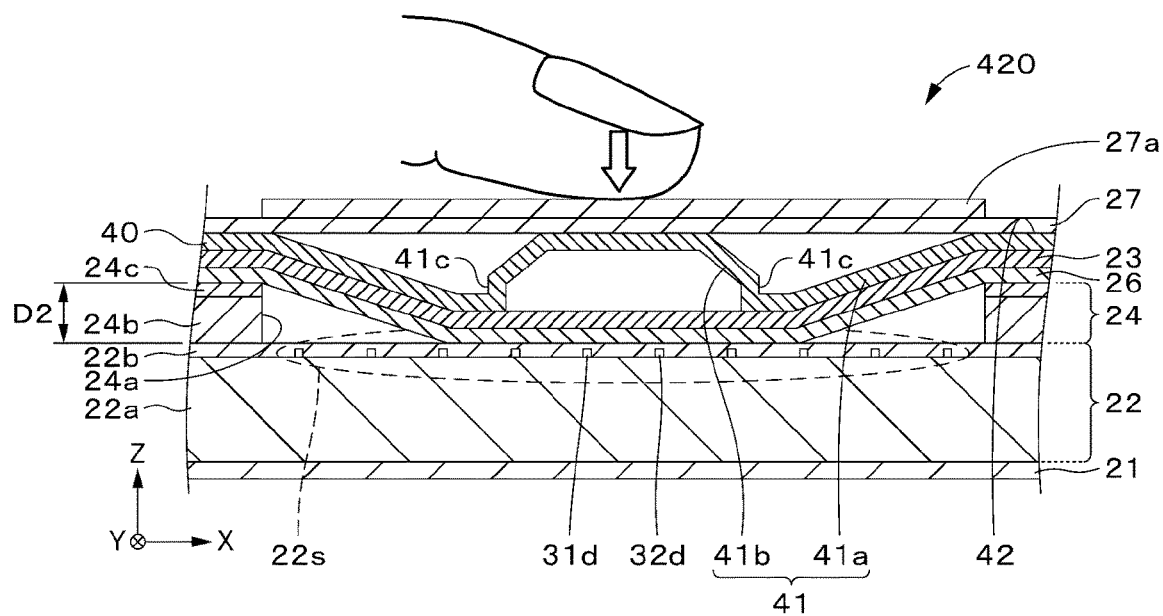

FIG. 27B is a cross-sectional view for explaining an example of an operation of the sensor when a key input operation is performed.

Figure 28A:
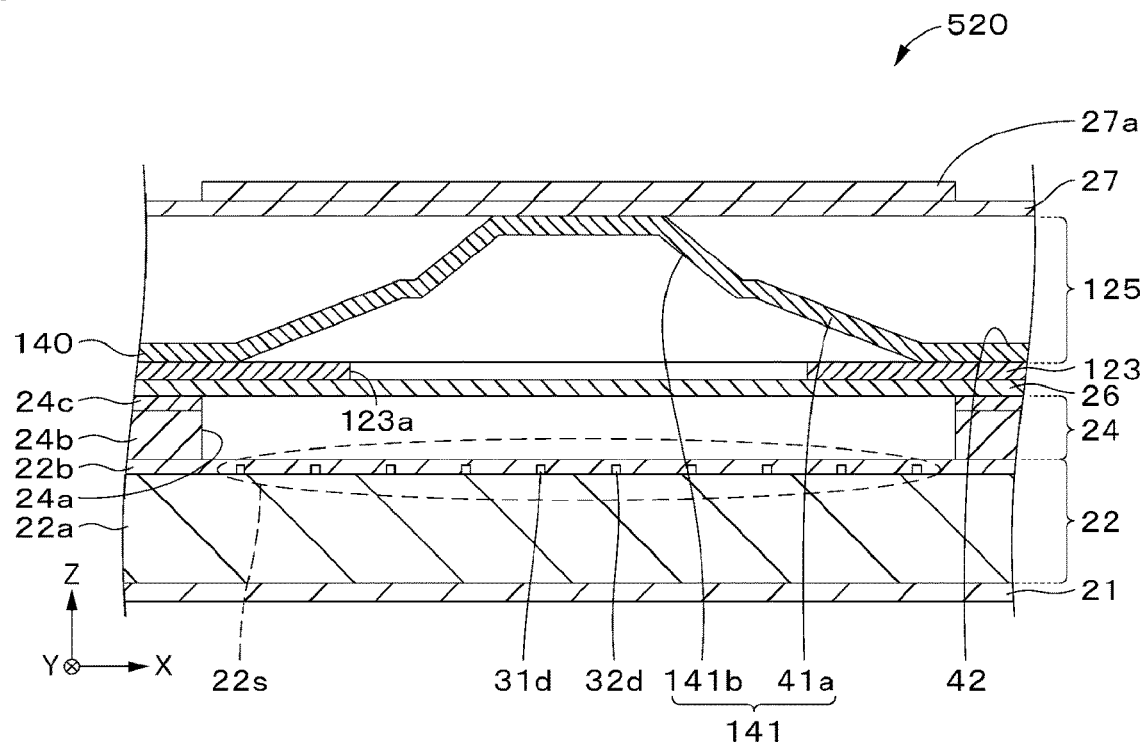

FIG. 28A is a cross-sectional view illustrating an example of a configuration of a sensor according to a sixth embodiment of the present technology.

Figure 28B:
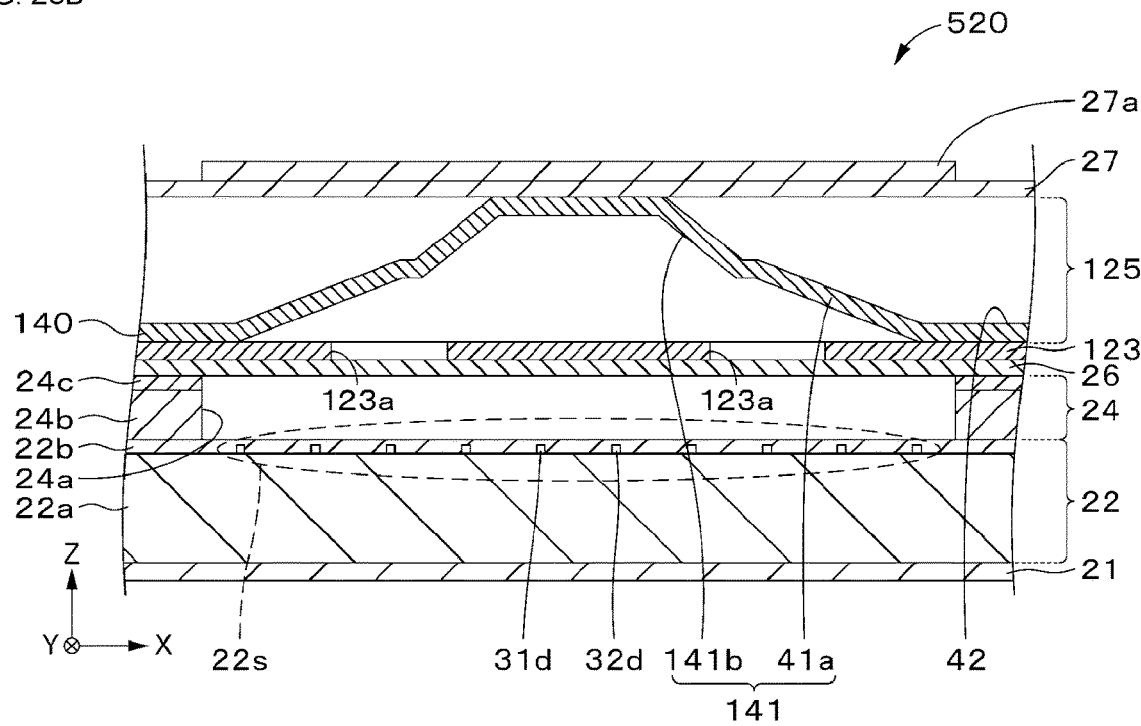

FIG. 28B is a cross-sectional view illustrating an example of a configuration of a sensor according to a modified example of the sixth embodiment of the present technology.

Figure 29A:
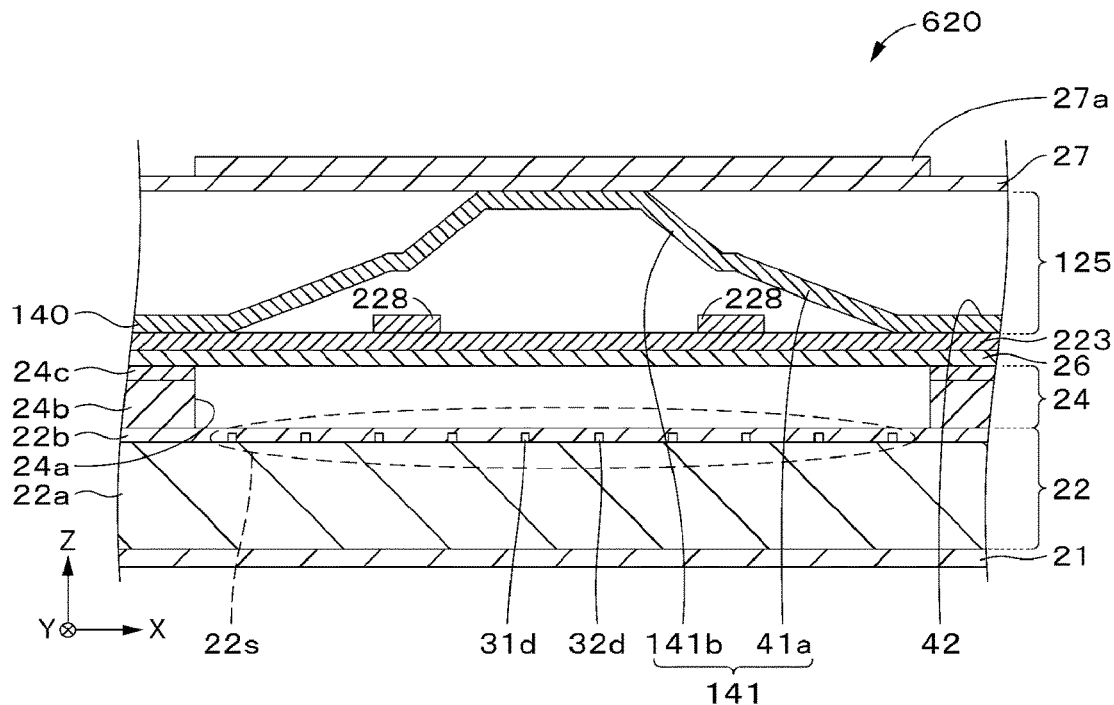

FIG. 29A is a cross-sectional view illustrating an example of a configuration of a sensor according to a seventh embodiment of the present technology.

Figure 29B:
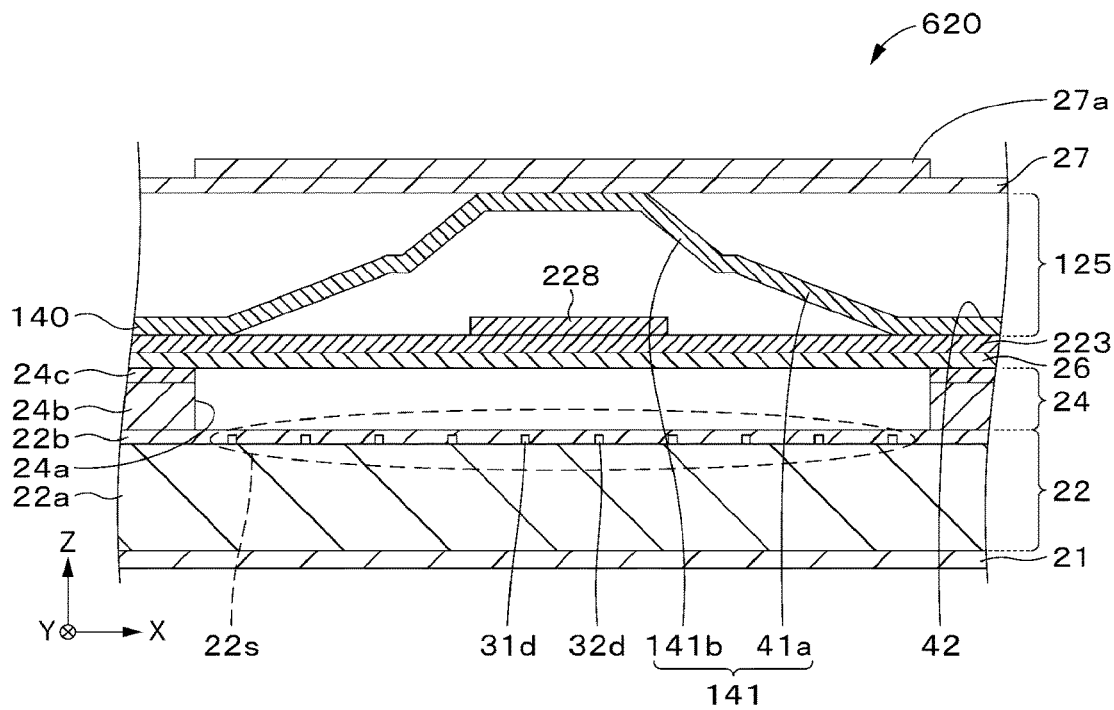

FIG. 29B is a cross-sectional view illustrating an example of a configuration of a sensor according to a modified example of the seventh embodiment of the present technology.

Figure 30:
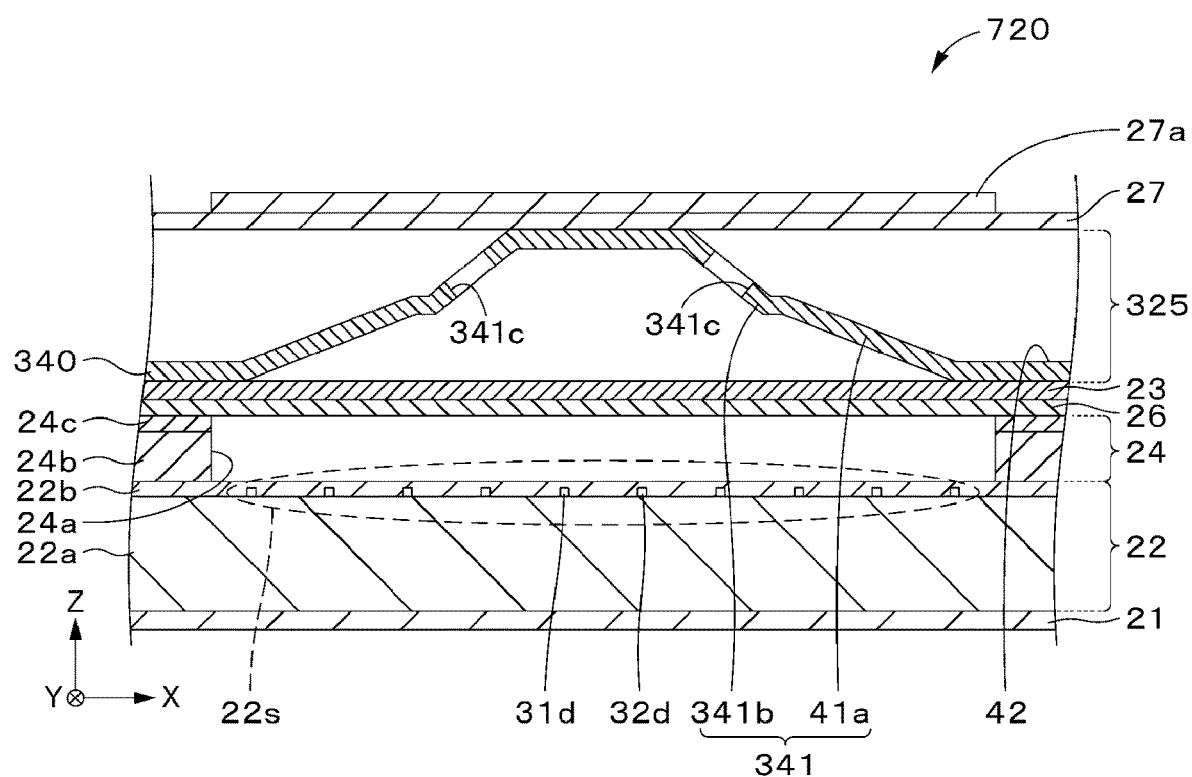

FIG. 30 is a cross sectional view illustrating an example of a configuration of a sensor according to an eighth embodiment of the present technology.

Figure 31A:
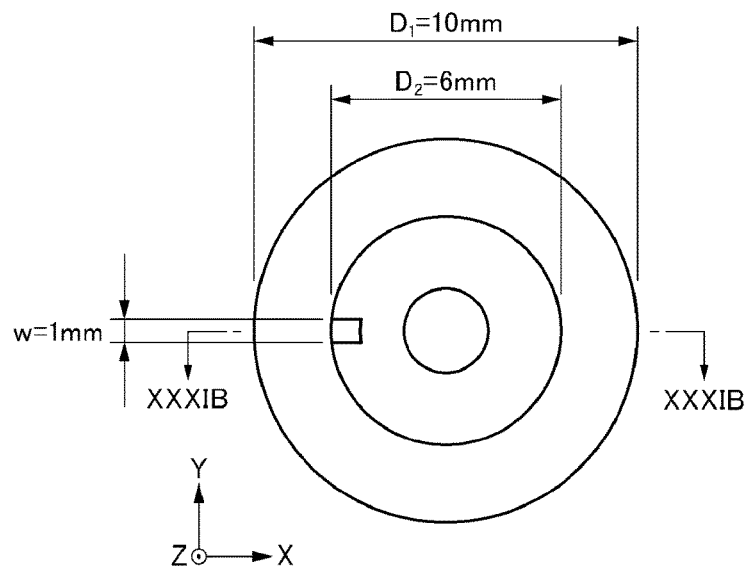

FIG. 31A is a plan view illustrating a configuration of a pressing unit of Example 1-1.

Figure 31B:
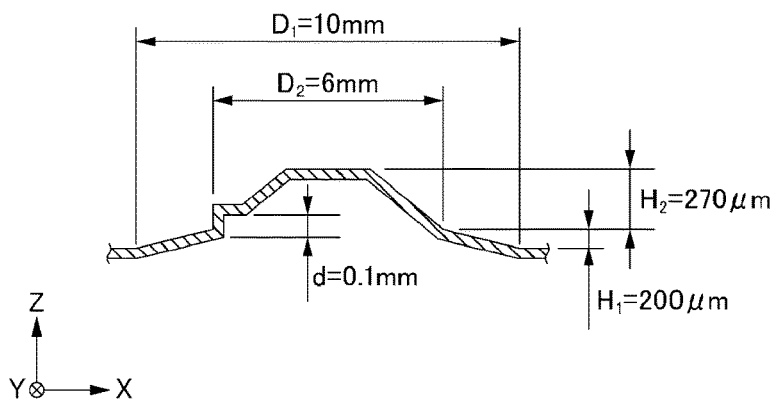

FIG. 31B is a cross-sectional view taken along line XXXIB-XXXIB of FIG. 31A.

Figure 31C:
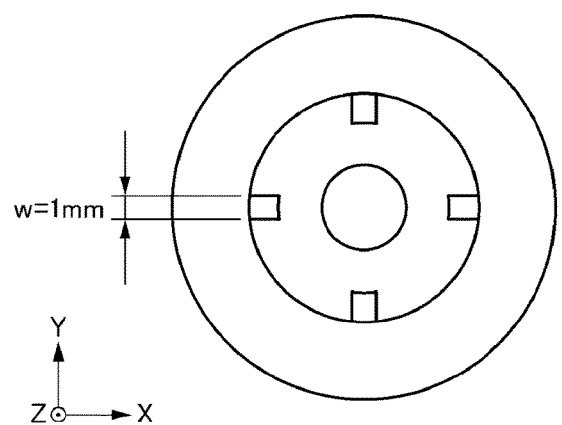

FIG. 31C is a plan view illustrating a configuration of a pressing unit of Example 1-2.

Figure 32A:
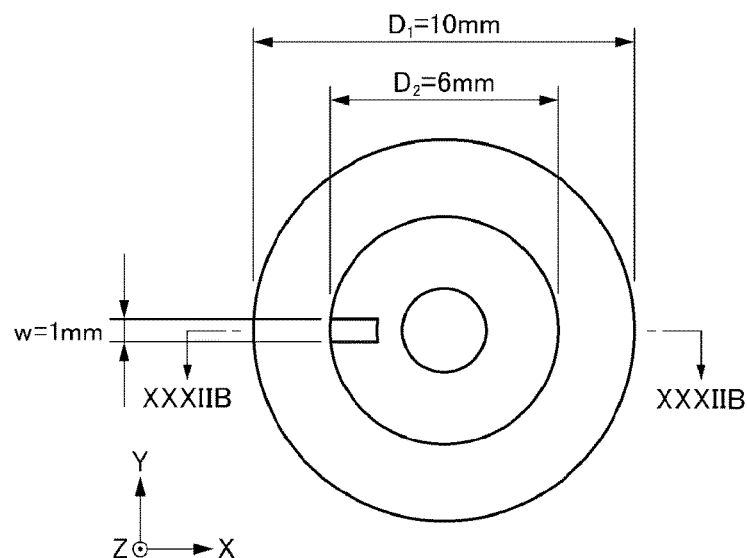

FIG. 32A is a plan view illustrating a configuration of a pressing unit of Example 1-3.

Figure 32B:
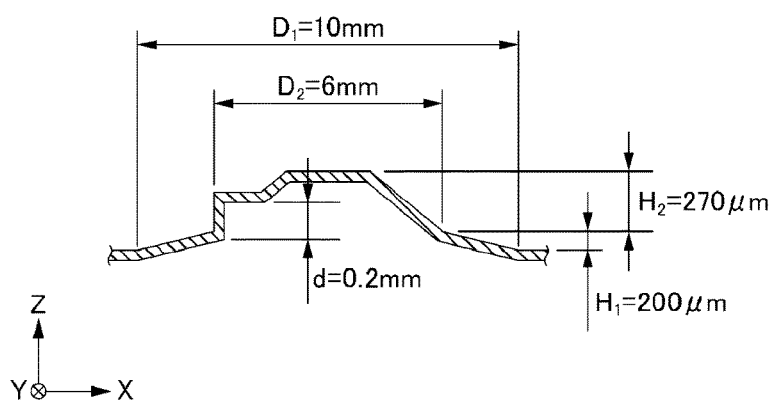

FIG. 32B is a cross-sectional view taken along line XXXIIB-XXXIIB of FIG. 32A.

Figure 32C:
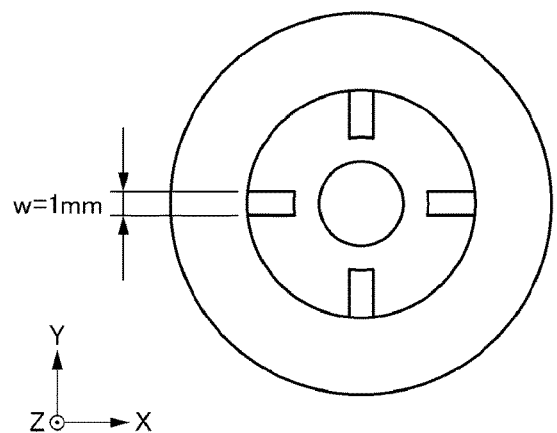

FIG. 32C is a plan view illustrating a configuration of a pressing unit of Example 1-4.

Figure 33A:
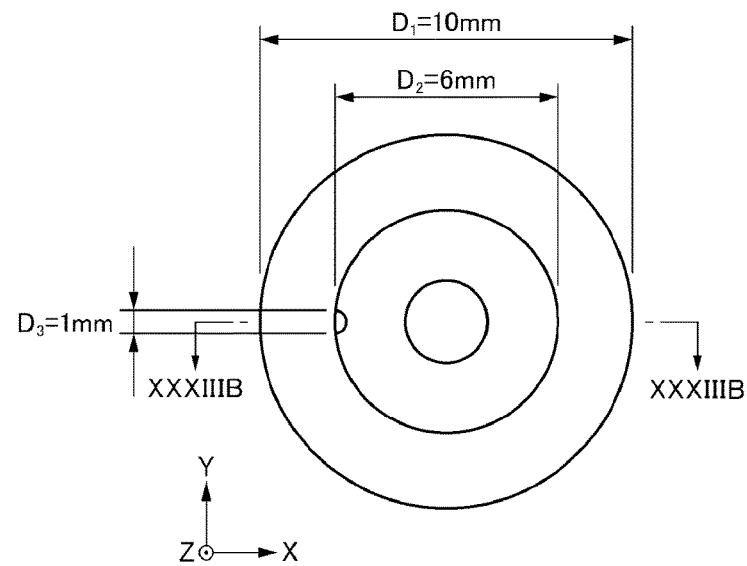

FIG. 33A is a plan view illustrating a configuration of a pressing unit of Example 2-1.

Figure 33B:
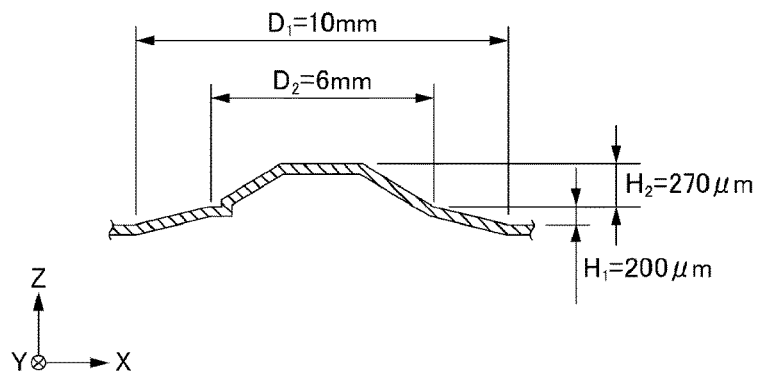

FIG. 33B is a cross-sectional view taken along line XXXIIIB-XXXIIIB of FIG. 33A.

Figure 34A:
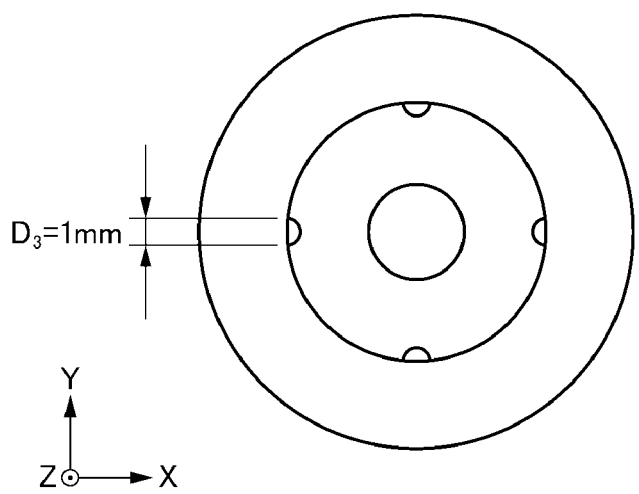

FIG. 34A is a plan view illustrating a configuration of a pressing unit of Example 2-2.

Figure 34B:
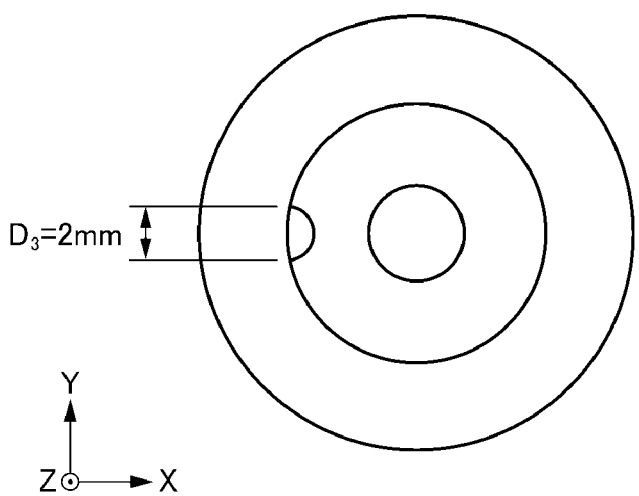

FIG. 34B is a plan view illustrating a configuration of a pressing unit of Example 2-3.

Figure 34C:
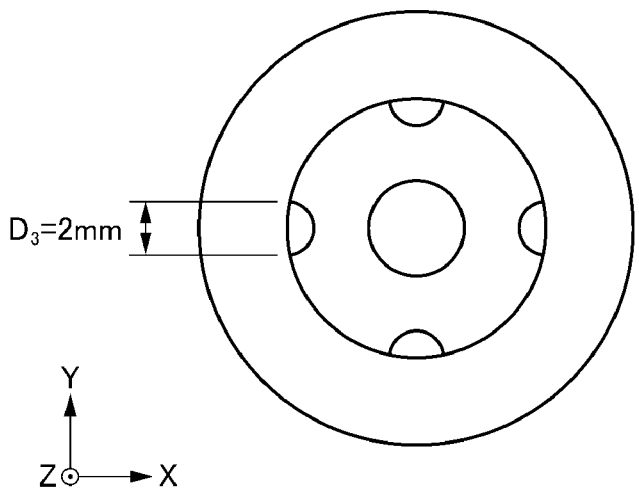

FIG. 34C is a plan view illustrating a configuration of a pressing unit of Example 2-4.

Figure 35A:
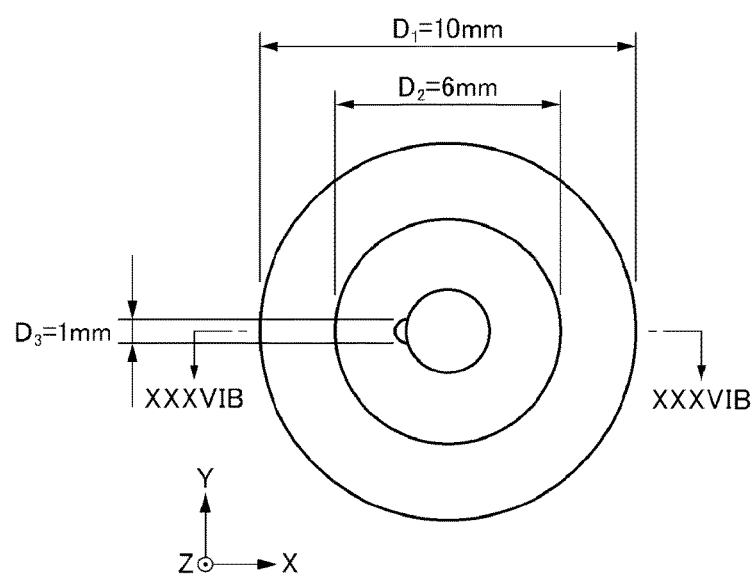

FIG. 35A is a plan view illustrating a configuration of a pressing unit of Example 3-1.

Figure 35B:
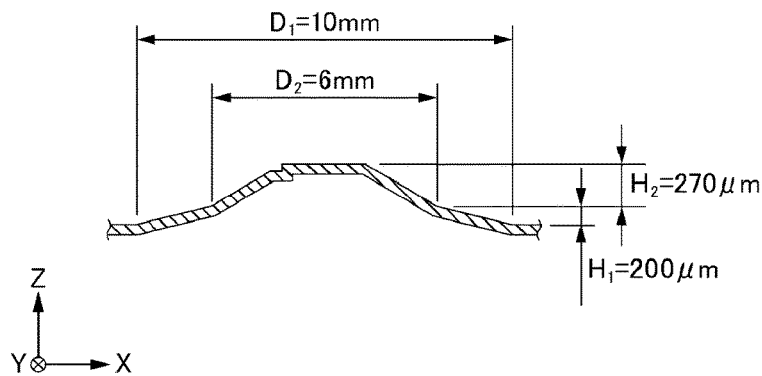

FIG. 35B is a cross-sectional view taken along line XXXVB-XXXVB of FIG. 35A.

Figure 36A:
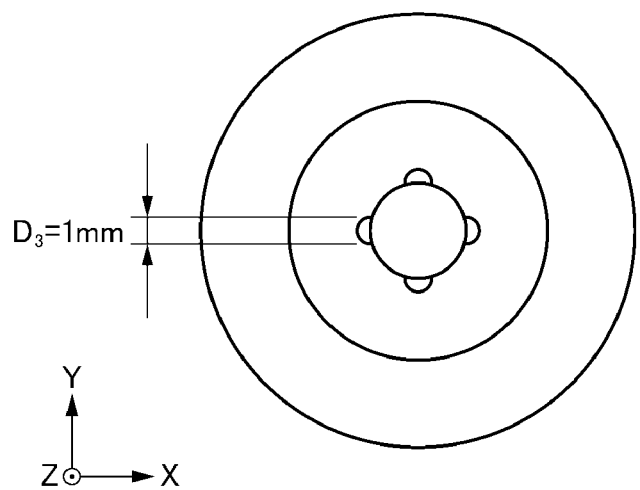

FIG. 36A is a plan view illustrating a configuration of a pressing unit of Example 3-2.

Figure 36B:
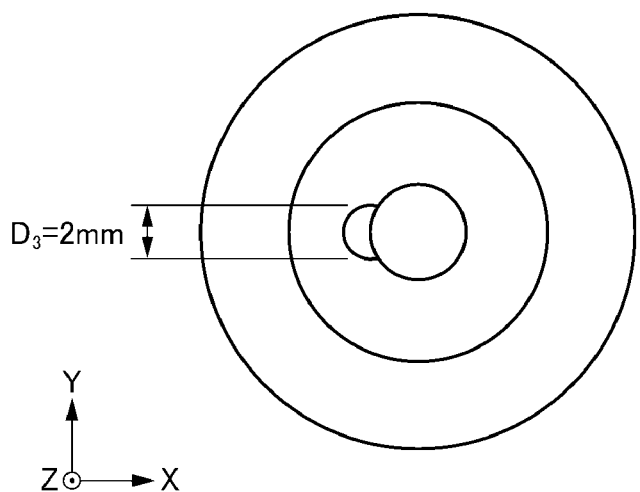

FIG. 36B is a plan view illustrating a configuration of a pressing unit of Example 3-3.

Figure 36C:
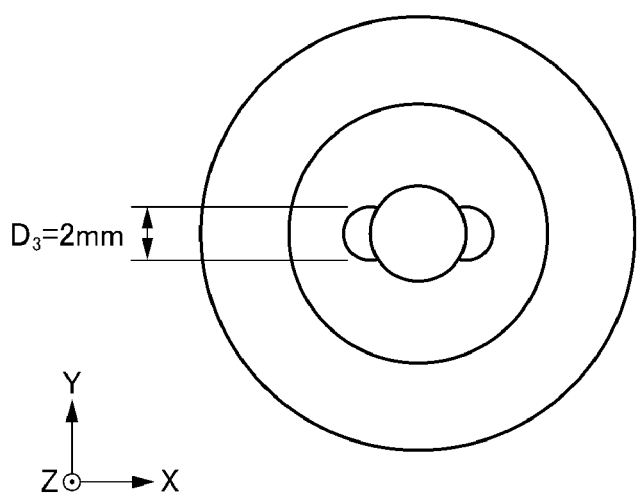

FIG. 36C is a plan view illustrating a configuration of a pressing unit of Example 3-4.

Figure 37A:
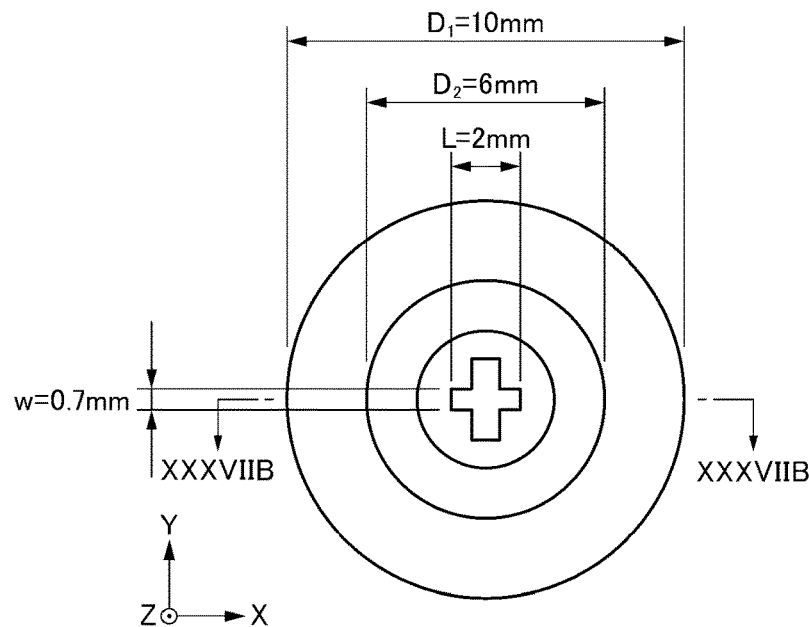

FIG. 37A is a plan view illustrating a configuration of a pressing unit of Example 4-1.

Figure 37B:
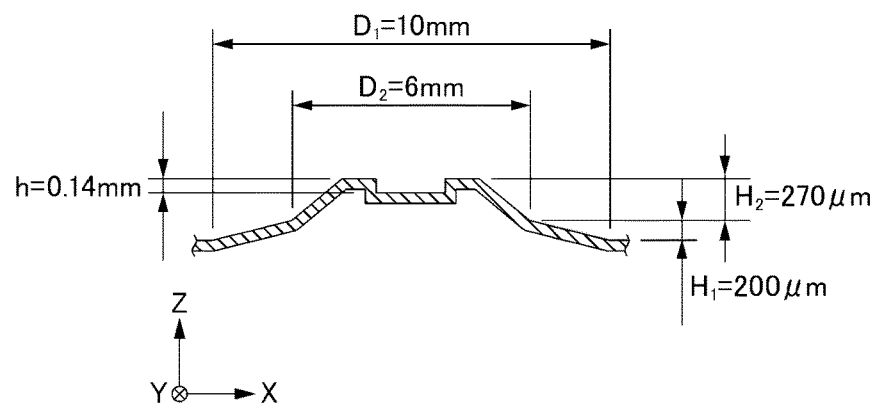

FIG. 37B is a cross-sectional view taken along line XXXVIIB-XXXVIIB of FIG. 37A.

Figure 37C:
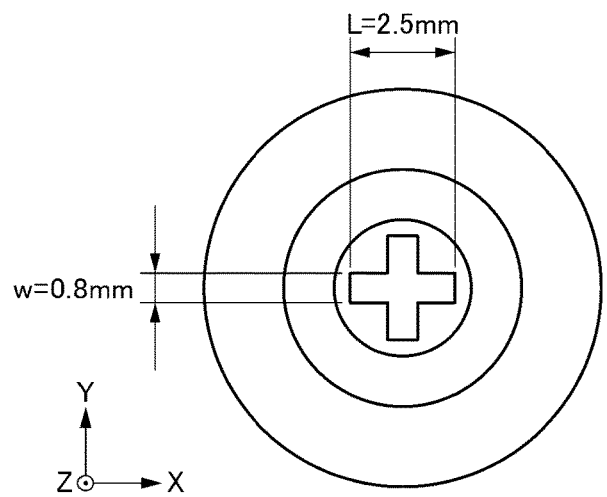

FIG. 37C is a plan view illustrating a configuration of a pressing unit of Example 4-2.

Figure 38A:
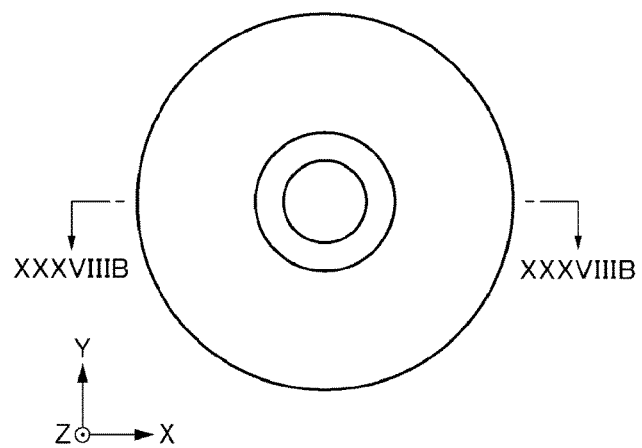

FIG. 38A is a plan view illustrating a configuration of a pressing unit of Example 5-1.

Figure 38B:
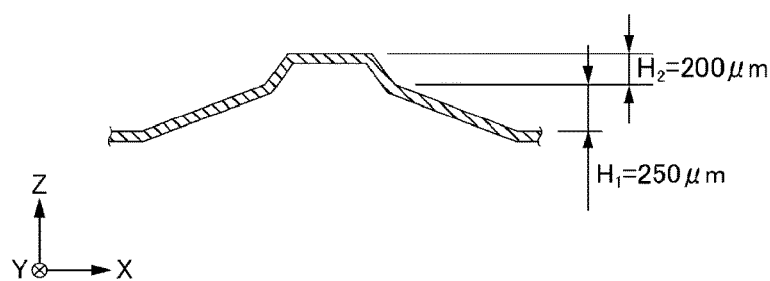

FIG. 38B is a cross-sectional view taken along line XXXVIIIB-XXXVIIIB of FIG. 38A.

Figure 39A:
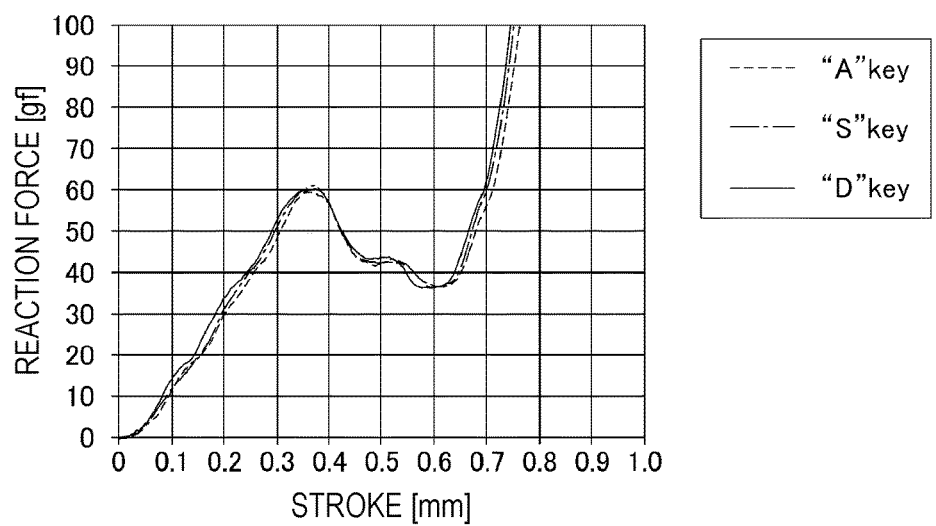

FIG. 39A is a graph illustrating a distance-pressure curve of a sensor of Example 1-3.

Figure 39B:
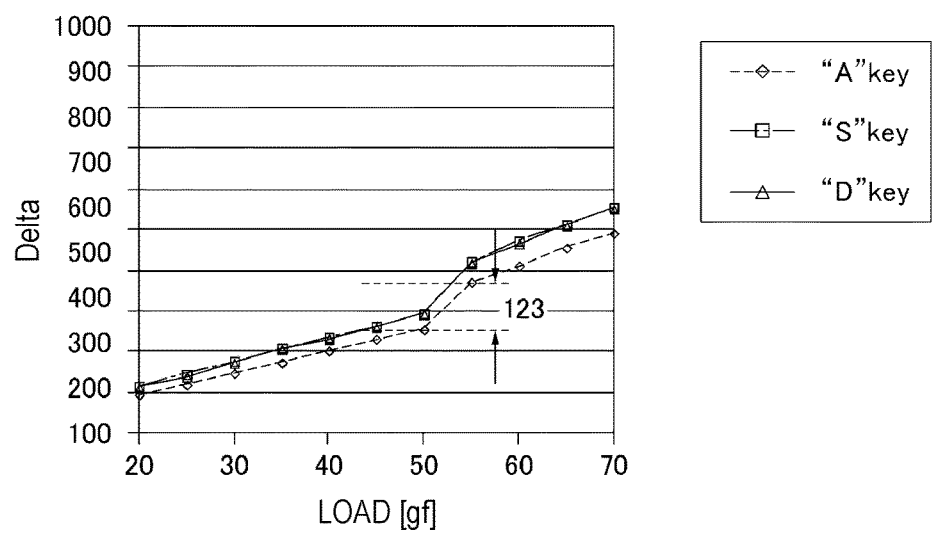

FIG. 39B is a graph illustrating the amount of change in electrostatic capacitance with respect to a load of a sensor of Example 1-1.

Figure 40A:
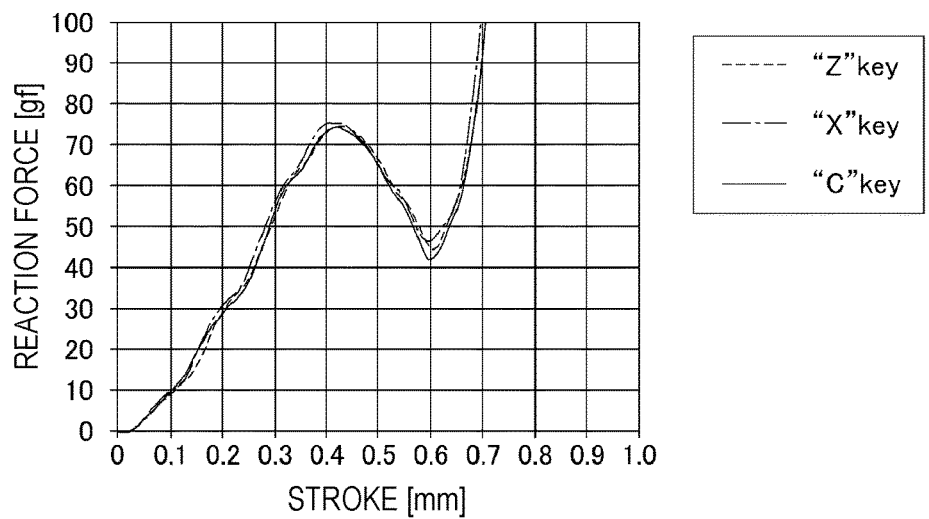

FIG. 40A is a graph illustrating a distance-pressure curve of a sensor of Example 1-4.

Figure 40B:
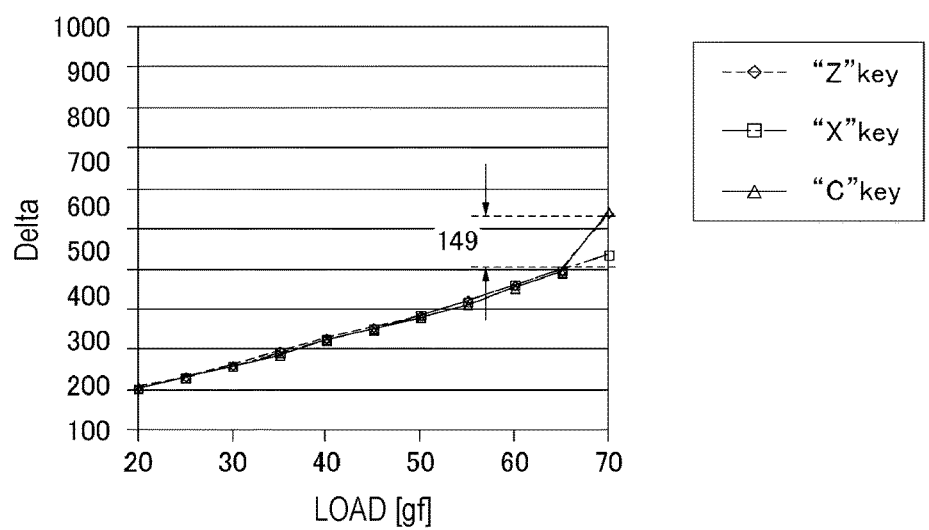

FIG. 40B is a graph illustrating the amount of change in electrostatic capacitance with respect to a load of a sensor of Example 1-2.

Figure 41A:
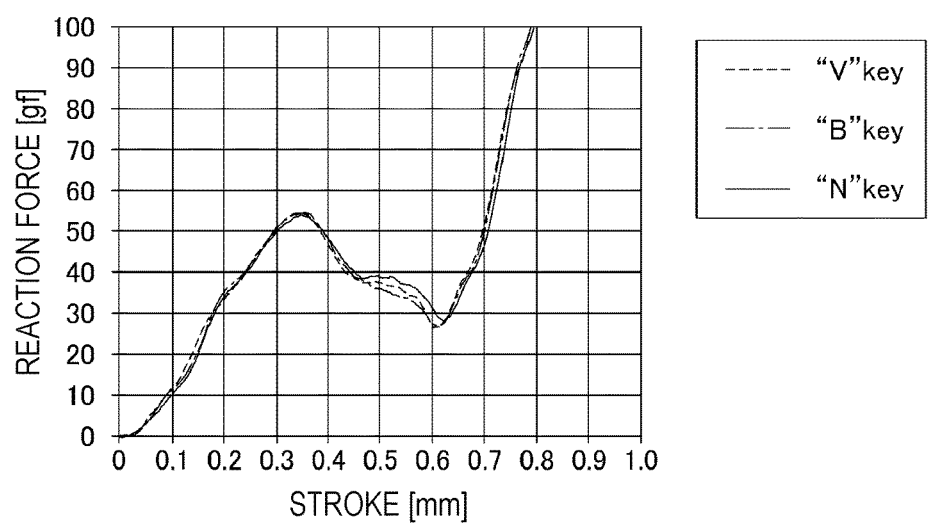

FIG. 41A is a graph illustrating a distance-pressure curve of a sensor of Example 2-3.

Figure 41B:
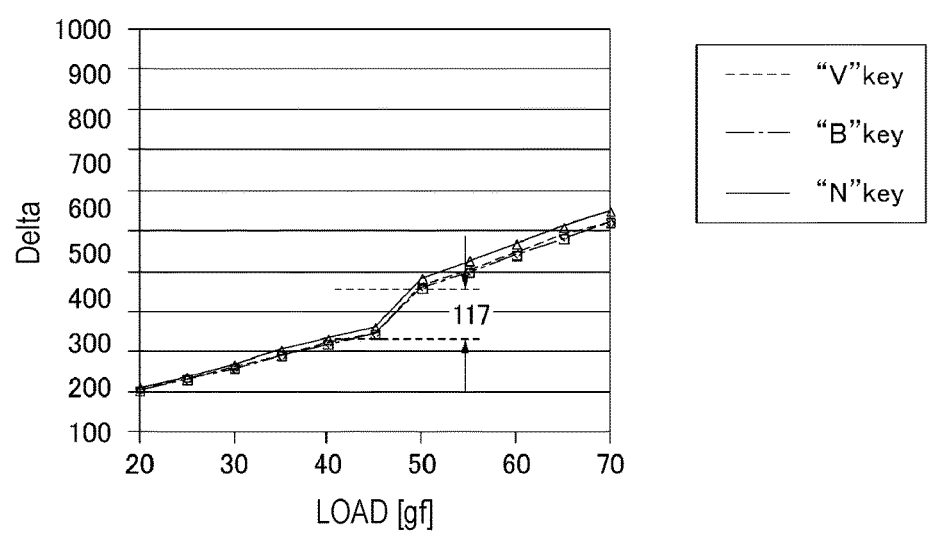

FIG. 41B is a graph illustrating the amount of change in electrostatic capacitance with respect to a load of a sensor of Example 1-3.

Figure 42A:
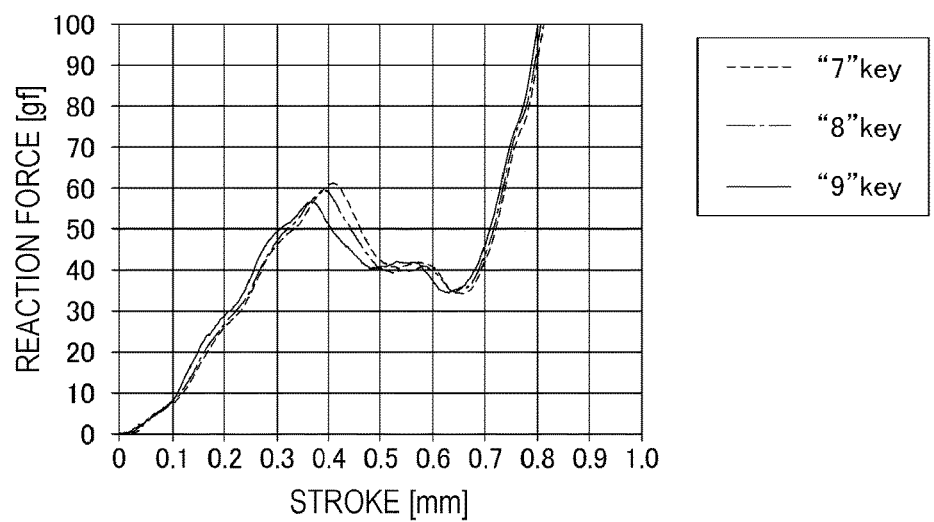

FIG. 42A is a graph illustrating a distance-pressure curve of a sensor of Example 2-4.

Figure 42B:
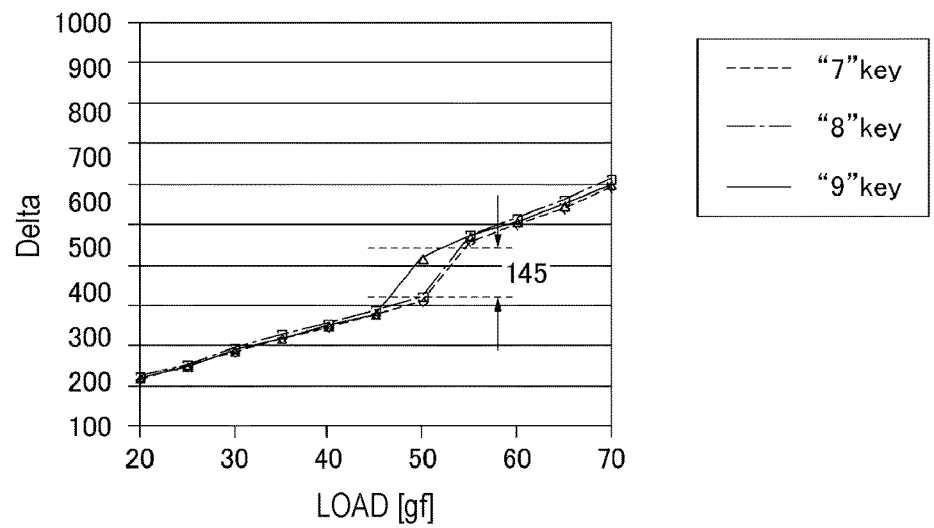

FIG. 42B is a graph illustrating the amount of change in electrostatic capacitance with respect to a load of a sensor of Example 1-4.

Figure 43A:
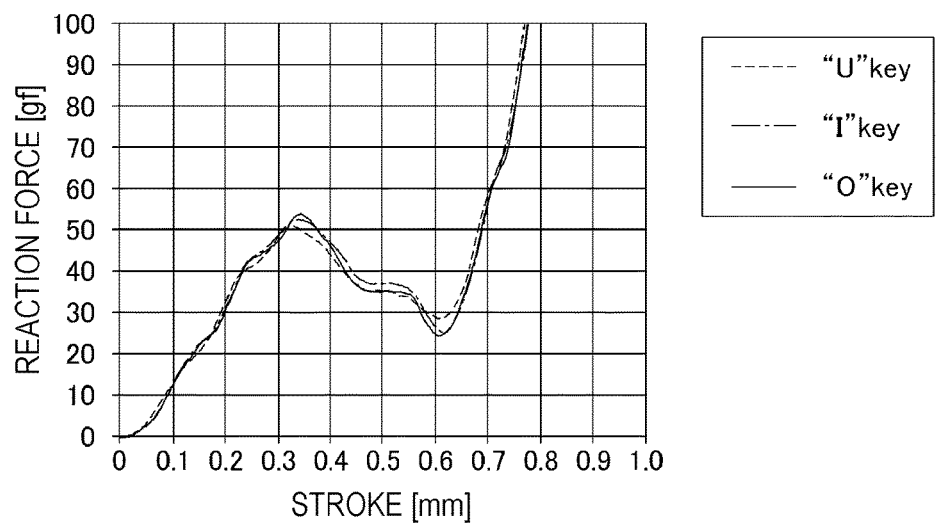

FIG. 43A is a graph illustrating a distance-pressure curve of a sensor of Example 5-1.

Figure 43B:
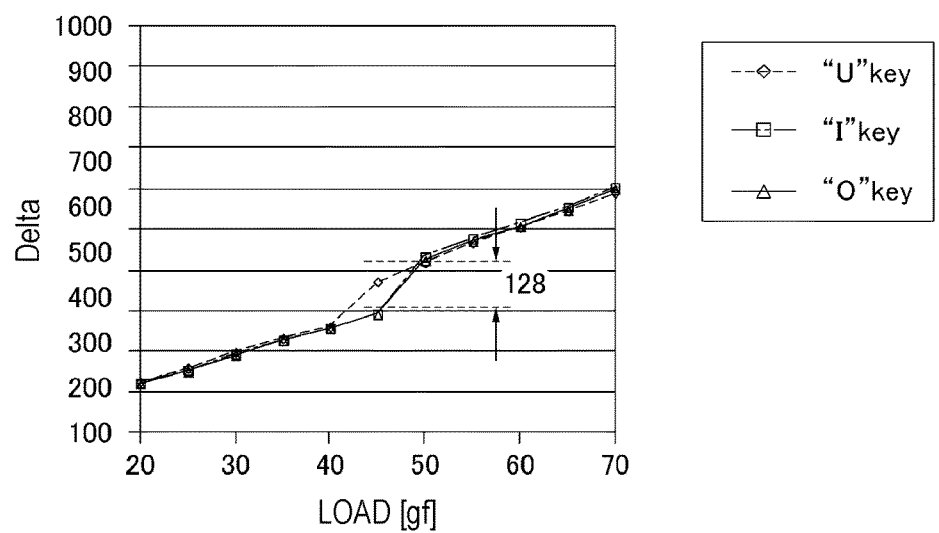

FIG. 43B is a graph illustrating the amount of change in electrostatic capacitance with respect to a load of a sensor of Example 5-1.

Figure 44A:
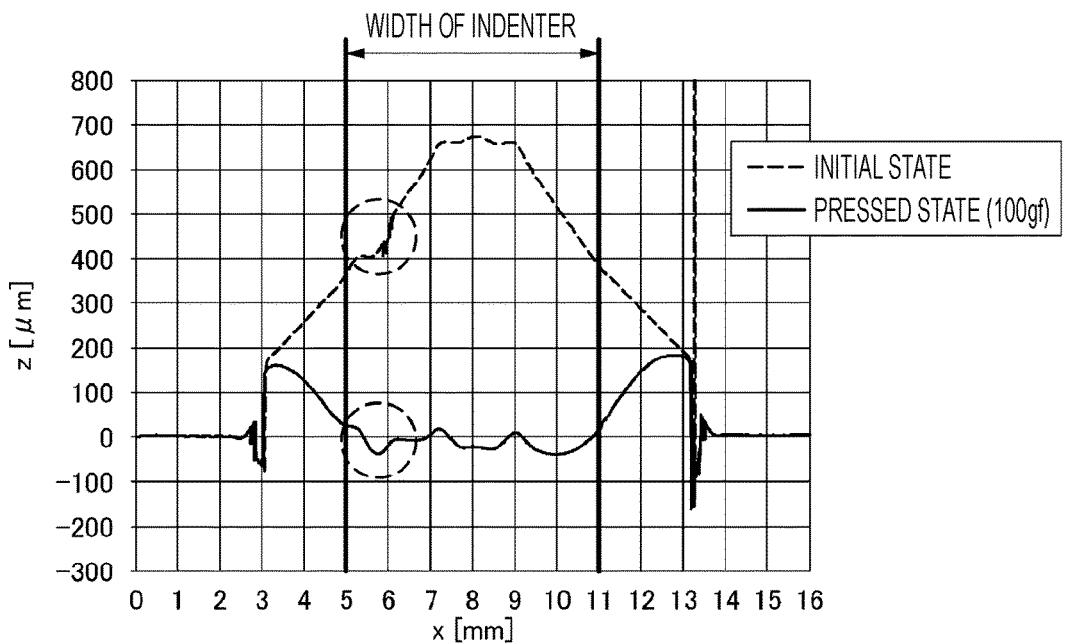

FIG. 44A is a profile illustrating an evaluation result of the shape of a pressing unit of Example 2-3.

Figure 44B:
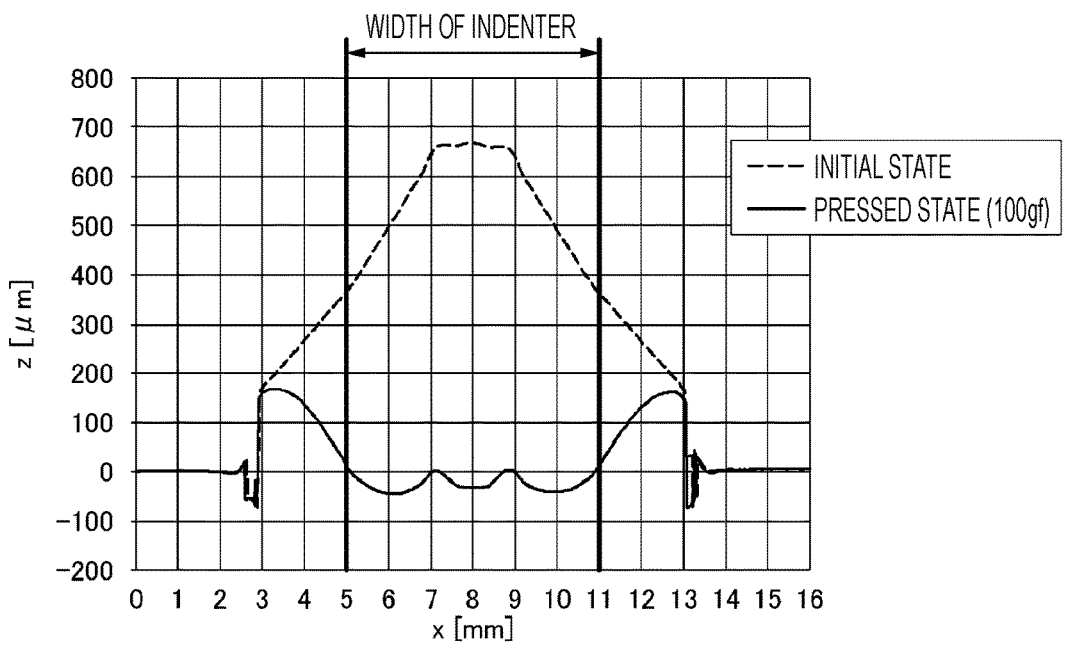

FIG. 44B is a profile illustrating an evaluation result of the shape of a pressing unit of Comparative Example 5-1.

Figure 45A:
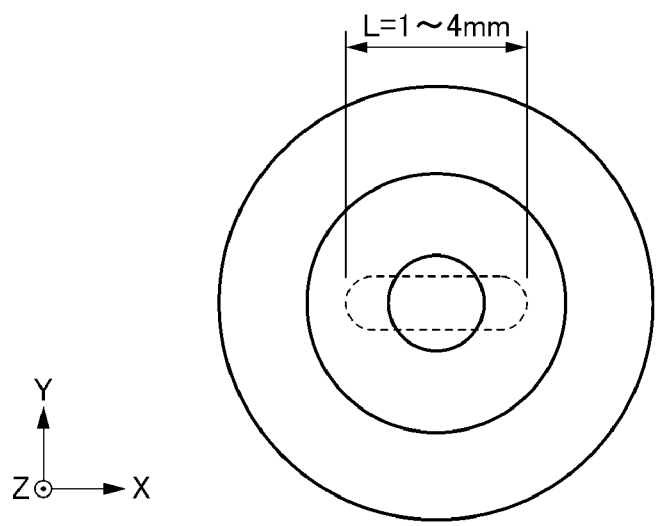

FIG. 45A is a plan view illustrating a configuration of a pressing unit of Example 6-1.

Figure 45B:
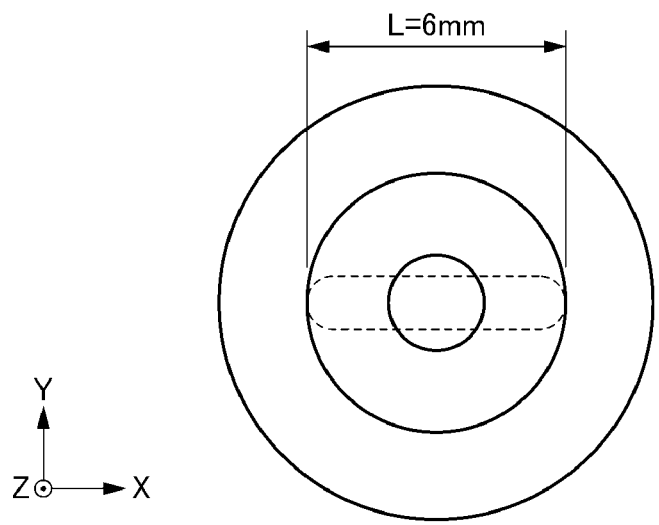

FIG. 45B is a plan view illustrating a configuration of a pressing unit of Example 6-4.

Figure 45C:
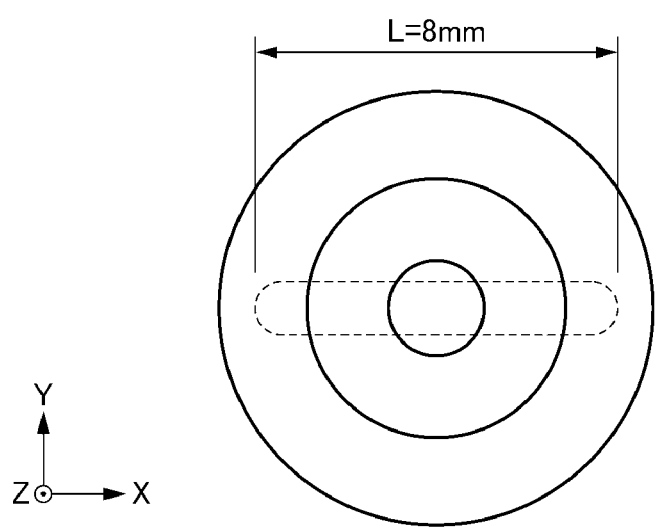

FIG. 45C is a plan view illustrating a configuration of a pressing unit of Example 6-5.

Figure 46A:
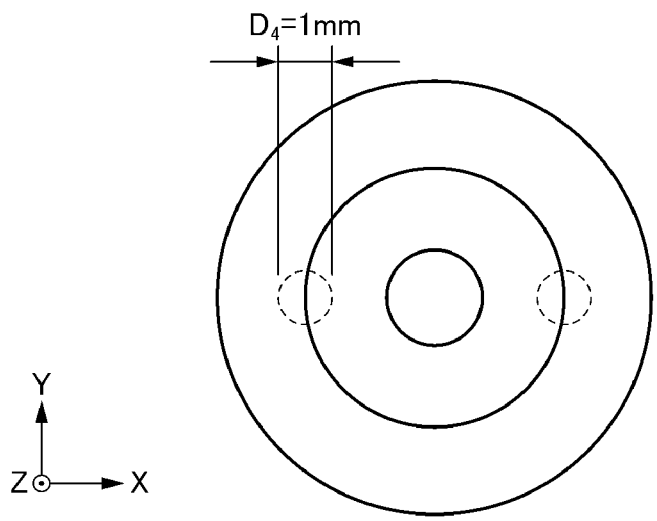
Figure 46B:
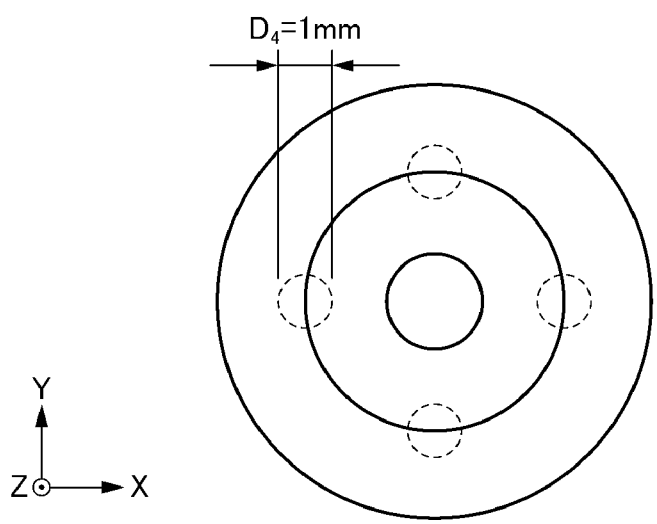

FIGS. 46A and 46B are plan views illustrating a configuration of a pressing unit of Example 7-1.

FIG. 46B is a plan view illustrating a configuration of a pressing unit of Example 7-2.

Figure 47A:
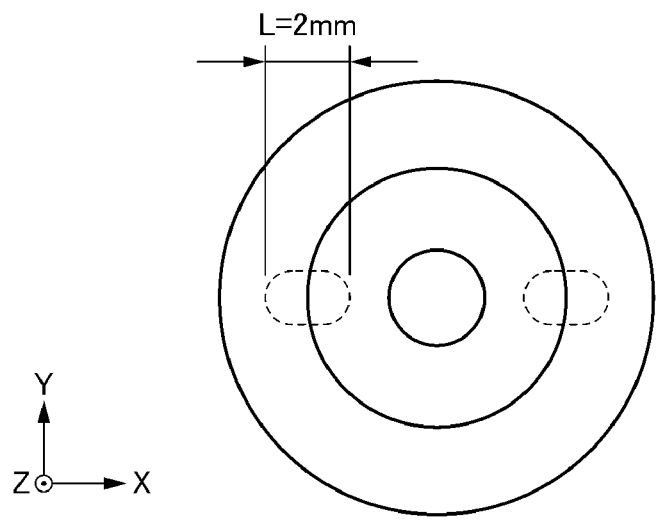
Figure 47B:
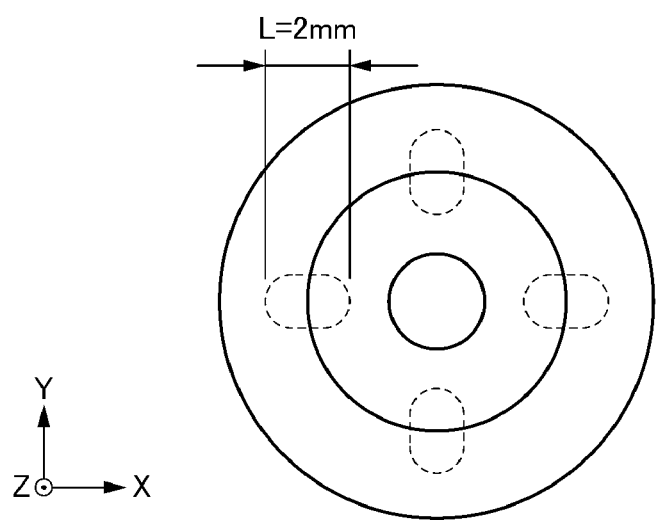

FIG. 47A is a plan view illustrating a configuration of a pressing unit of Example 7-3. FIG. 47B is a plan view illustrating a configuration of a pressing unit of Example 7-4.

Figure 48:
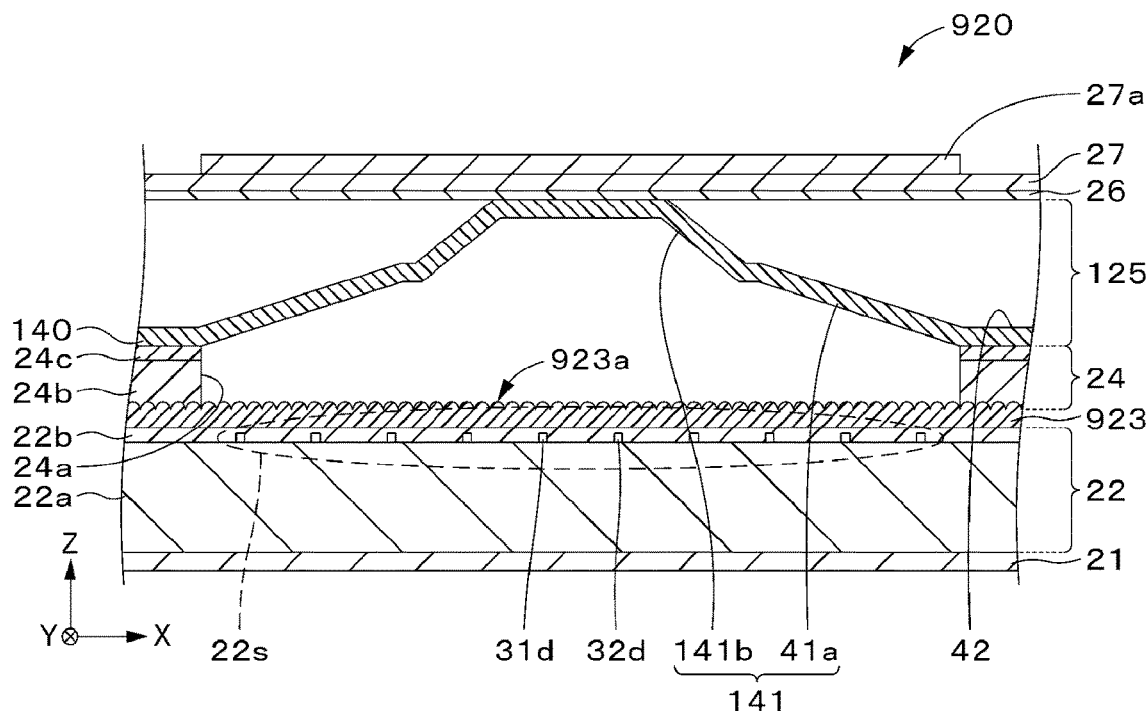

FIG. 48 is a cross sectional view illustrating an example of a configuration of a sensor according to a ninth embodiment of the present technology.

Figure 49:
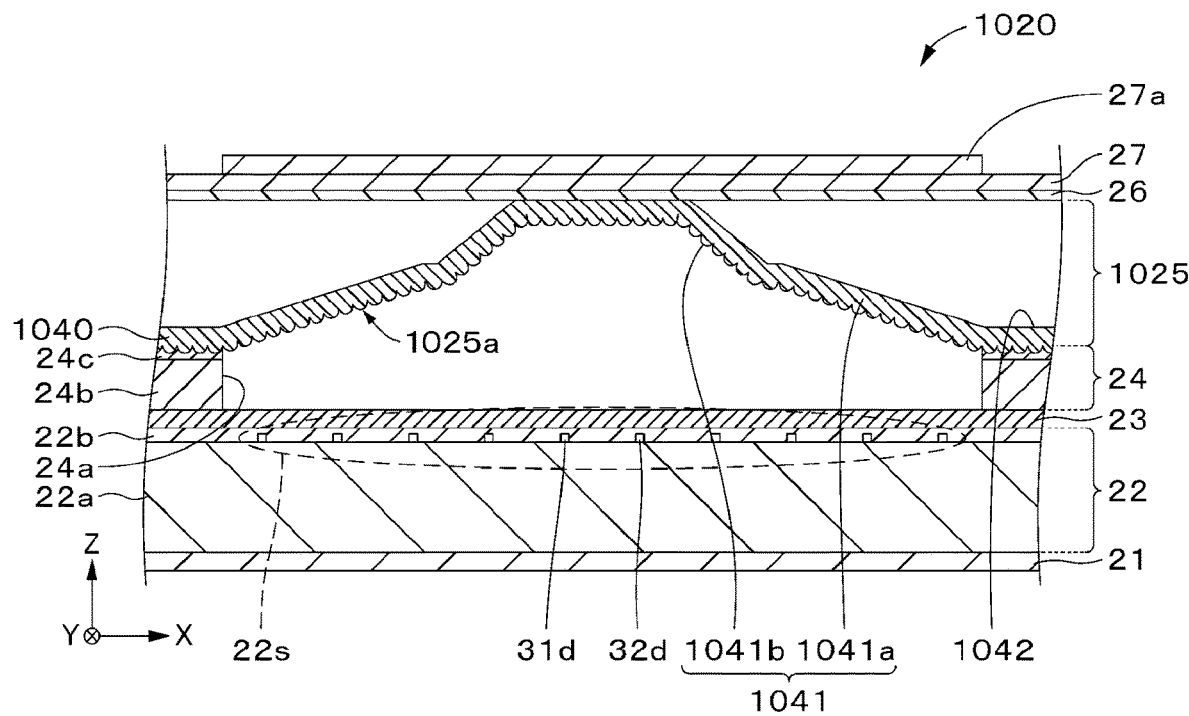

FIG. 49 is a cross sectional view illustrating an example of a configuration of a sensor according to a tenth embodiment of the present technology.

Figure 50:
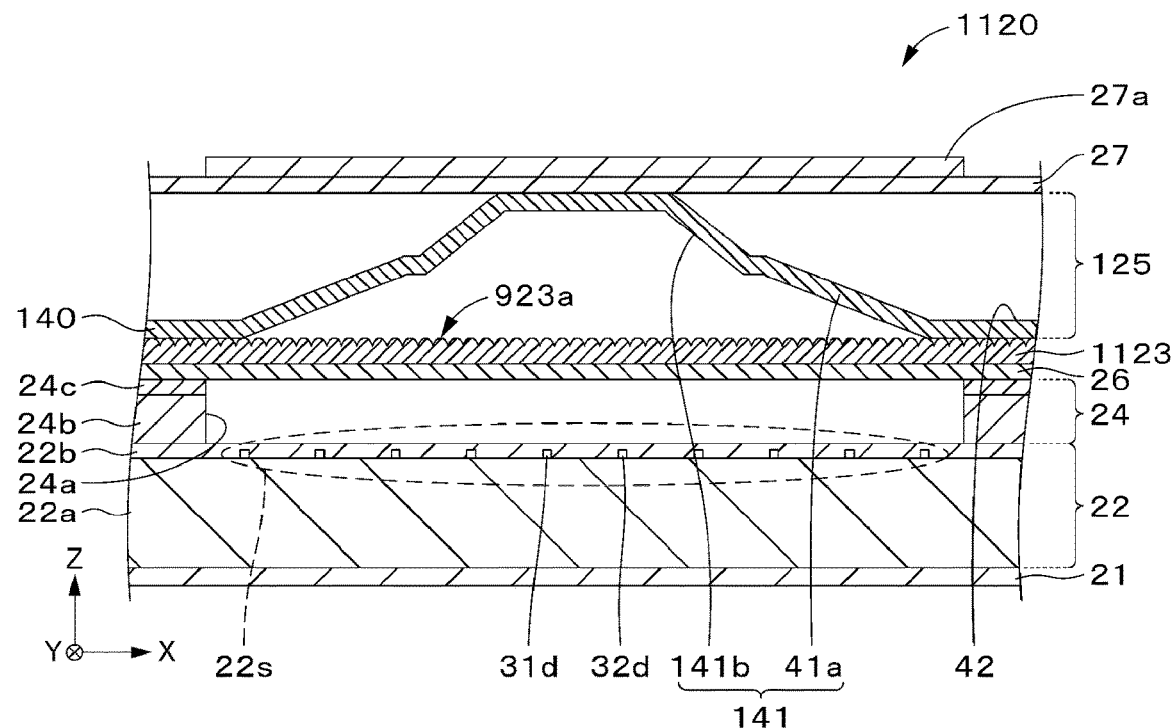

FIG. 50 is a cross sectional view illustrating an example of a configuration of a sensor according to an eleventh embodiment of the present technology.

Figure 51:
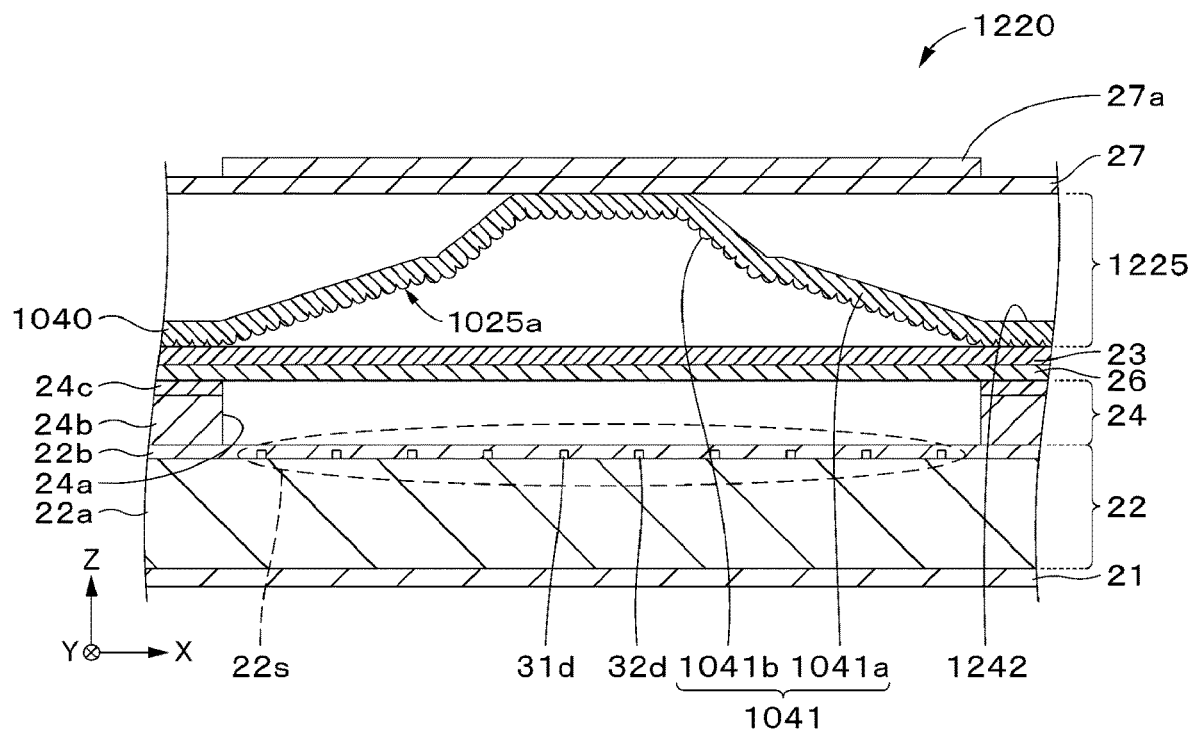

FIG. 51 is a cross sectional view illustrating an example of a configuration of a sensor according to a twelfth embodiment of the present technology.

MODE FOR CARRYING OUT THE INVENTION

Embodiments of the present technology will be described in the following order.

1 First embodiment (examples of a sensor having a shape portion in a second structure unit, an input device including the sensor, and an electronic apparatus including the sensor)
   1.1 Outline
   1.2 Configuration of electronic apparatus
   1.3 Configuration of sensor
   1.4 Operation of sensor
   1.5 Change in electrostatic capacitance with respect to key input operation
   1.6 Operation of controller IC
   1.7 Effect
   1.8 Modified Example
2 Second embodiment (an example of a sensor in which a hole portion is formed in a substrate)
   2.1 Configuration of sensor
   2.2 Operation of sensor during key input operation
   2.3 Effect
   2.4 Modified Example
3 Third embodiment (an example of a sensor having a shape portion on a surface of a sensor layer)
   3.1 Configuration of sensor
   3.2 Operation of sensor during key input operation
   3.3 Effect
   3.4 Modified Example
4 Fourth embodiment (an example of a sensor in which a through hole is formed in a second structure unit)
   4.1 Configuration of sensor
   4.2 Operation of sensor during key input operation
   4.3 Effect
5 Fifth embodiment (an example of a sensor in which a REF electrode layer is disposed between an intermediate layer and a substrate and a shape portion is formed in a second structure unit)
   5.1 Configuration of sensor
   5.2 Operation of sensor
   5.3 Effect
   5.4 Modified Example
6 Sixth embodiment (an example of a sensor in which a REF electrode layer is disposed between an intermediate layer and a substrate and a hole portion is formed in the substrate)
   6.1 Configuration of sensor
   6.2 Effect
   6.3 Modified Example 7 Seventh embodiment (an example of a sensor in which a REF electrode layer is disposed between an intermediate layer and a substrate and a shape portion is formed on a surface of the substrate)
  7.1 Configuration of sensor
  7.2 Effect
  7.3 Modified Example
8 Eighth embodiment (an example of a sensor in which a REF electrode layer is disposed between an intermediate layer and a substrate and a through hole is formed in a second structure unit)
  8.1 Configuration of sensor
  8.2 Effect
  8.3 Modified Example
9 Ninth embodiment (an example of a sensor in which unevenness is formed on a surface of a substrate)
  9.1 Configuration of sensor
  9.2 Effect
10 Tenth embodiment (an example in which unevenness is formed on a back surface of a pressing unit)
  10.1 Configuration of sensor
  10.2 Effect
  10.3 Modified Example
11 Eleventh embodiment (an example of a sensor in which a REF electrode layer is disposed between an intermediate layer and a substrate and unevenness is formed on a surface of the substrate)
  11.1 Configuration of sensor
  11.2 Effect
  11.3 Modified Example
12 Twelfth embodiment (an example of a sensor in which a REF electrode layer is disposed between an intermediate layer and a substrate and unevenness is formed on a back surface of a pressing unit)
  12.1 Configuration of sensor
  12.2 Effect
  12.3 Modified Example

1. First Embodiment

1.1 Outline

Figure 1:
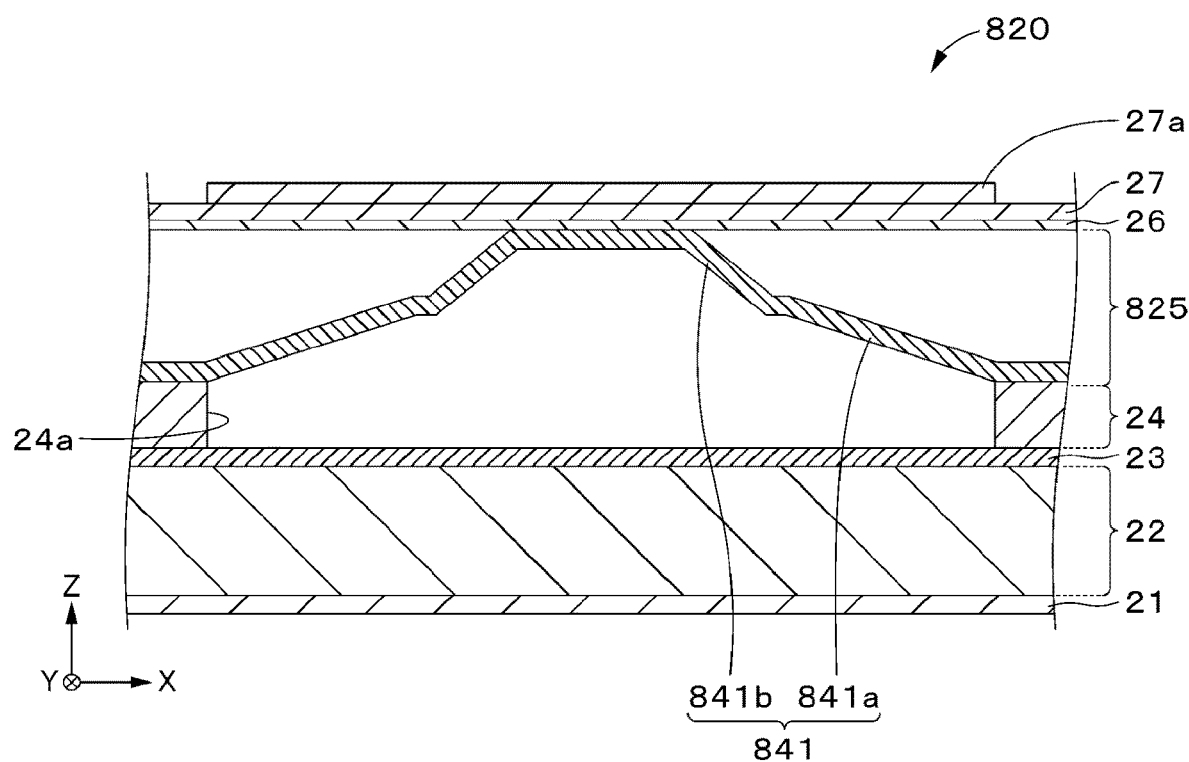
FIG. 1 is a cross-sectional view illustrating an example of a configuration of a sensor.

The present inventors have studied a sensor having the configuration illustrated in FIG. 1 as a thin sensor capable of generating a click feeling. A sensor 820 includes a reference electrode layer (hereinafter referred to as "REF electrode layer") 21, a sensor layer 22, a substrate 23, an intermediate layer 24, an uneven layer 825 including a plurality of pressing units 841, and a REF electrode layer 26. On the REF electrode layer 26, a key top layer 27 having a plurality of keys 27a is disposed. The pressing unit 841 includes a first structure unit 841a and a hollow second structure unit 841b disposed on the first structure unit 841a, protruding with respect to the substrate 23 as a base, and having a bottom side opened.

In the sensor 820 having the above-described configuration, when the key 27a is pressed with a force equal to or higher than a predetermined force, the first structure unit 841a is inverted, and a click feeling is obtained. A click feeling can be obtained even in a pressing unit including only the first structure unit 841a. However, as described above, a click feeling can be improved in the pressing unit 841 including the second structure unit 841b on the first structure unit 841a than in the pressing unit including only the first structure unit 841a.

Figure 2A:
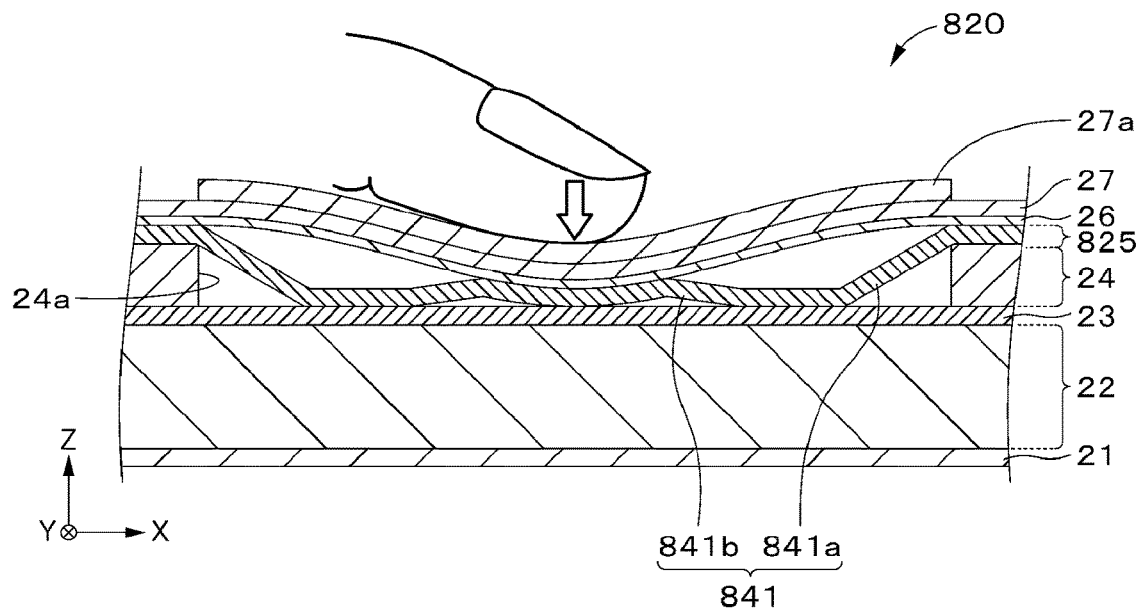
FIG. 2A is a cross-sectional view illustrating an example of a state of the sensor when a key is pressed.
Figure 2B:
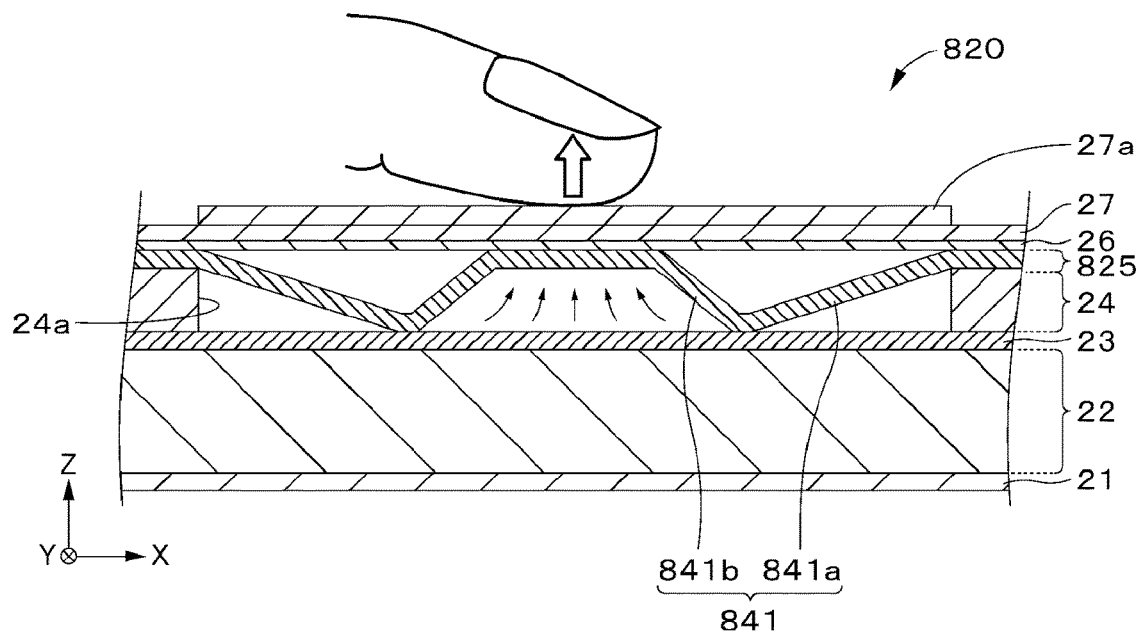
FIG. 2B is a cross-sectional view illustrating an example of a state of the sensor when pressing of the key is released.

However, in the pressing unit 841 including the second structure unit 841b on the first structure unit 841a, a click feeling can be improved, but returning failure may occur. It is considered that this returning failure is caused by the following mechanism. When the key 27a is pressed with a force equal to or higher than a predetermined force, the first structure unit 841a is inverted, and the pressing unit 841 is pushed into a hole portion 24a of the intermediate layer 24. At this time, depending on a pressing force, as illustrated in FIG. 2A, the second structure unit 841b may be deformed and crushed from a boundary portion between the first structure unit 841a and the second structure unit 841b as a starting point to reduce the pressure of the inside of the second structure unit 841b with respect to atmospheric pressure. In this way, when pressing of the key 27a is released in a state where the second structure unit 841b is crushed, as illustrated in FIG. 2B, the second structure unit 841b returns to its original shape and sucks air. As a result, the second structure unit 841b is sucked by a surface of the substrate 23, and returning failure occurs. When returning failure occurs, a return delay of the key 27a occurs or abnormal noise is generated when pressing is released.

Therefore, the present inventors made intensive studies in order to suppress returning failure. As a result, the present inventors have found a configuration in which a shape portion (a recessed shape portion and/or a protruding shape portion) is formed on a surface of the second structure unit 841b facing the sensor layer 22. Hereinafter, a sensor adopting such a configuration, an input device including the sensor, and an electronic apparatus including the sensor will be described.

1.2 Configuration of Electronic Apparatus

Figure 3:
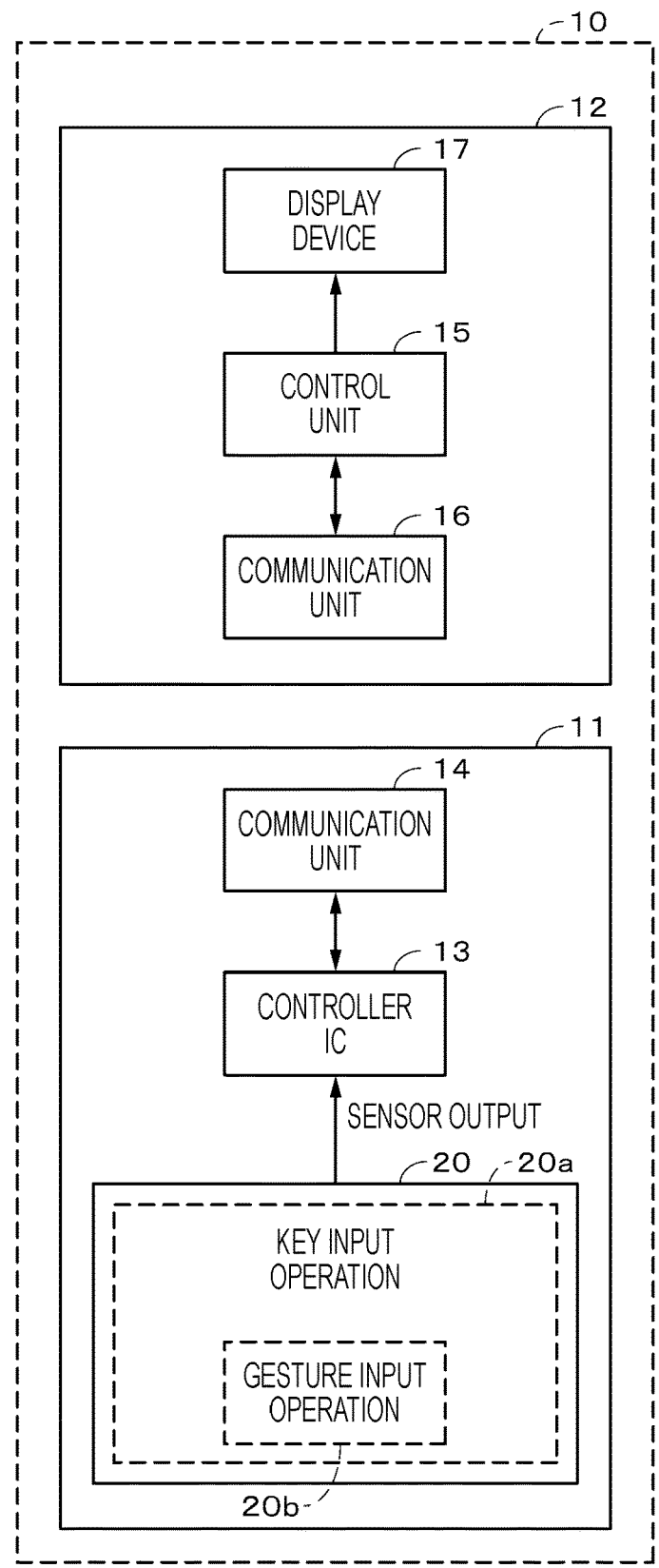
FIG. 3 is a block diagram illustrating an example of a configuration of an electronic apparatus according to a first embodiment of the present technology.

As illustrated in FIG. 3, an electronic apparatus 10 according to the first embodiment of the present technology is a so-called personal computer, and includes an input device 11 and a host apparatus 12 that is a main body of the electronic apparatus 10. Incidentally, in the first embodiment, a configuration in which the input device 11 is disposed as a peripheral apparatus outside the host apparatus 12 is described, but a configuration in which the input device 11 and the host apparatus 12 are integrated with each other may be adopted.

(Input Device)

Figure 4:
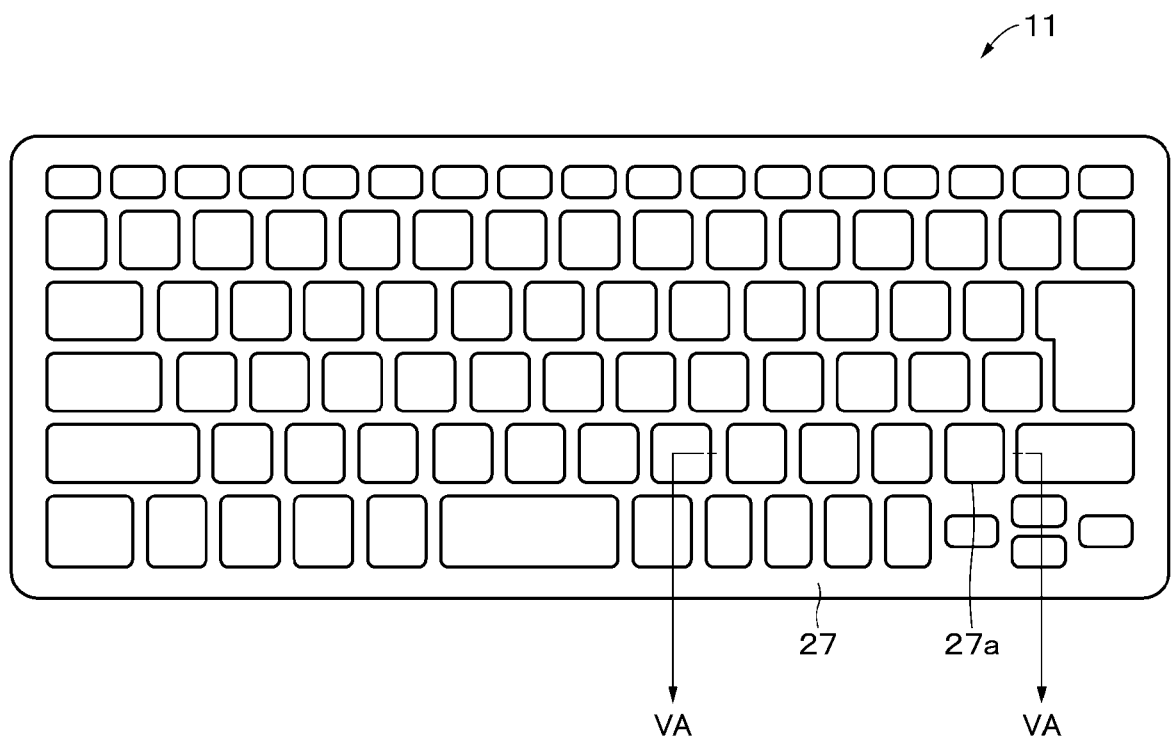
FIG. 4 is a plan view illustrating an example of an appearance of an input device.

The input device 11 is a so-called keyboard, and includes a sensor 20, a controller integrated circuit (IC) 13 as a control unit, and a communication unit 14. In addition, as illustrated in FIG. 4, the input device 11 has a key top layer 27 having the plurality of keys 27a on one main surface thereof. The sensor 20 is disposed under the key top layer 27.

The sensor 20 is a thin sensor capable of performing two kinds of input operations, that is, a key input operation 20a and a gesture input operation 20b on the same operation surface, and capable of generating a click feeling. The sensor 20 detects a change in electrostatic capacitance according to an input operation and outputs an electric signal corresponding to the change to the controller IC 13.

The controller IC 13 judges whether either the gesture or the key input operation has been performed on the operation surface of the sensor 20 on the basis of the electric signal corresponding to the change in electrostatic capacitance supplied from the sensor 20, and outputs information corresponding to the judgement result to the host apparatus 12 via the communication unit 14. Specifically, the controller IC 13 has two threshold values A and B, and performs the above judgement on the basis of these threshold values A and B. For example, in a case where the controller IC 13 judges that the gesture input operation has been performed, the controller IC 13 outputs coordinate information to the host apparatus 12 via the communication unit 14. Meanwhile, in a case where the controller IC 13 judges that the key input operation has been performed, the controller IC 13 outputs information on a key such as a scan code to the host apparatus 12 via the communication unit 14.

The communication unit 14 communicates with the host apparatus 12 according to a predetermined wireless communication standard such as Bluetooth (registered trademark) to exchange information.

(Host Apparatus)

The host apparatus 12 includes a control unit 15, a communication unit 16, and a display device 17. The control unit 15 executes various processes on the basis of information supplied from the input device 11 via the communication unit 16. For example, the control unit 15 executes a process such as display of character information on the display device 17 or movement of a cursor displayed on the display device 17. The communication unit 16 communicates with the input device 11 according to a predetermined wireless communication standard such as Bluetooth (registered trademark) to exchange information.

The display device 17 displays an image (screen) on the basis of a video signal, a control signal, or the like supplied from the host apparatus 12. Examples of the display device 17 include a liquid crystal display, an electro luminescence (EL) display, and a plasma display panel (PDP), but are not limited thereto.

1.3 Configuration of Sensor

Figure 5A:
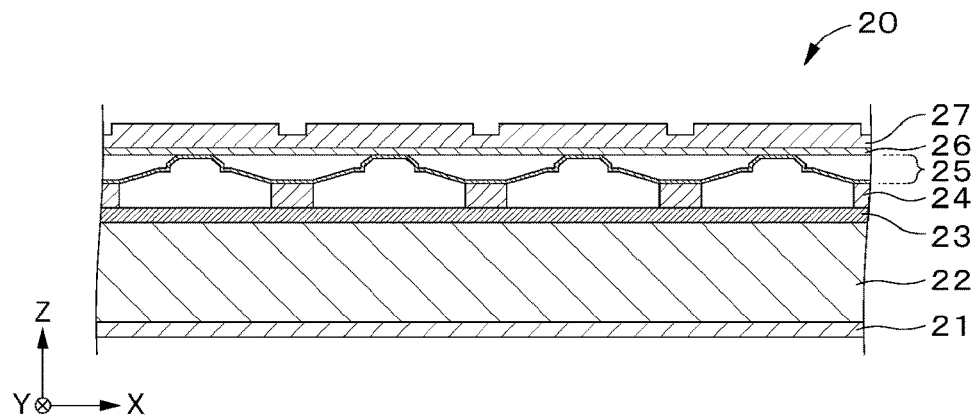
FIG. 5A is a cross-sectional view taken along line VA-VA of FIG. 4.
Figure 5B:
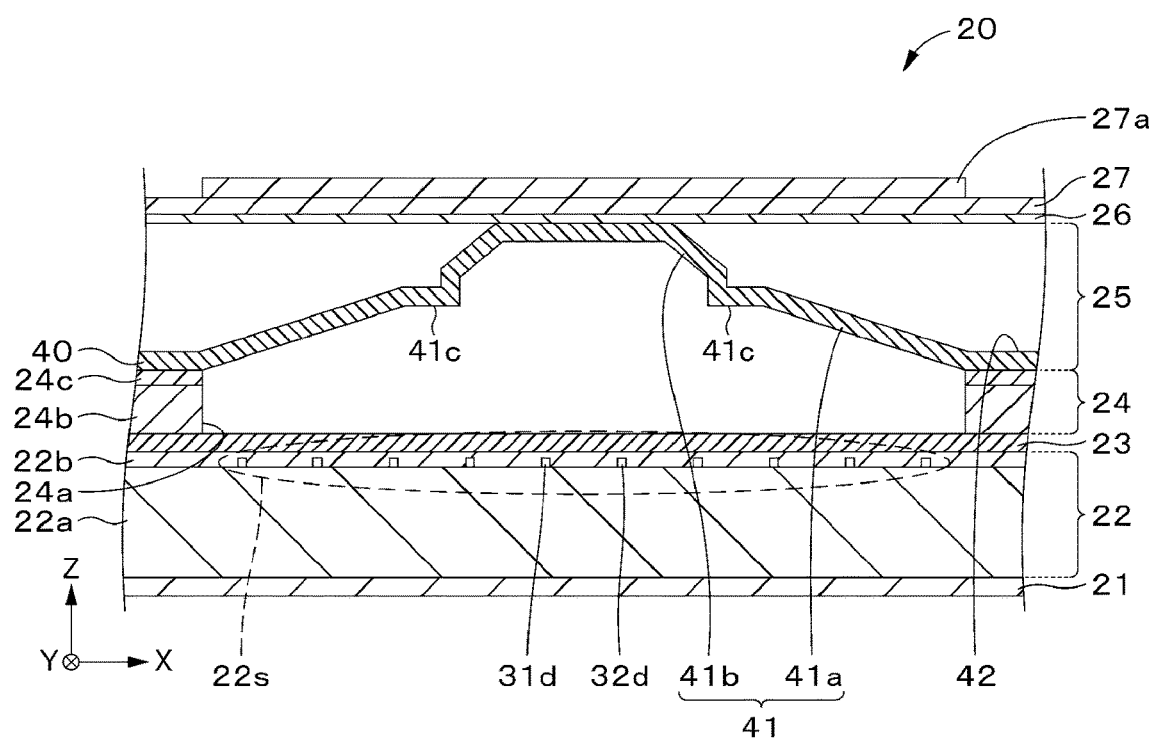
FIG. 5B is an enlarged sectional view illustrating a part of the sensor illustrated in FIG. 5A.

Hereinafter, an example of a configuration of the sensor 20 will be described with reference to FIGS. 5A, 5B, 6, 7, 8A, 8B, and 8C. As illustrated in FIGS. 5A and 5B, the sensor 20 includes the REF electrode layer 21 as a first conductor layer, the sensor layer 22, the substrate 23, the intermediate layer (spacer layer) 24, an uneven layer 25 having a plurality of pressing units 41, and the REF electrode layer 26 as a second conductor layer. Out of both main surfaces of the sensor 20, a surface on a side of the REF electrode layer 26 is a soft operation surface, and the key top layer 27 is disposed on this operation surface. In the first embodiment, a base layer is constituted by a laminate including the sensor layer 22, the substrate 23, and the intermediate layer 24. Hereinafter, out of both main surfaces of each of the sensor 20 and constituent elements (constituent members) thereof, a main surface on an operation surface side is referred to as a front surface (first surface), and the main surface opposite thereto is appropriately referred to as a back surface (second surface).

By electrostatically detecting a change in distance between the REF electrode layer 26 and the sensor layer 22 by an input operation with respect to the key top layer 27, the sensor 20 detects the input operation. The input operation is a key input operation with respect to the key top layer 27 or a gesture operation on the key top layer 27.

The REF electrode layer 26 is disposed with a predetermined distance from the front surface of the sensor layer 22. The REF electrode layer 21 is disposed so as to be adjacent to the back side of the sensor layer 22. By disposing the REF electrode layers 21 and 26 on both sides of the sensor layer 22 as described above, it is possible to prevent external noise (external electric field) from entering the sensor 20.

Between the sensor layer 22 and the REF electrode layer 26, the substrate 23, the intermediate layer 24, and the uneven layer 25 are disposed in this order from the sensor layer 22 toward the REF electrode layer 26. The uneven layer 25 separates the REF electrode layer 26 and the intermediate layer 24 from each other to form a space having a predetermined width.

(REF Electrode Layer)

The REF electrode layer 21 constitutes a back surface of the sensor 20 and is disposed so as to face the REF electrode layer 26 in a thickness direction of the sensor 20. The REF electrode layer 21 has higher bending rigidity than, for example, the sensor layer 22 and the REF electrode layer 26 and functions as a support plate of the sensor 20.

As the REF electrode layer 21, a conductive layer or a conductive substrate can be used. The conductive substrate includes, for example, a substrate and a conductive layer disposed on a surface of the substrate. The substrate has, for example, a film shape or a plate shape. Here, the film also includes a sheet. As the conductive layer, any layer may be used as long as having electric conductivity. Examples of the conductive layer include an inorganic conductive layer containing an inorganic conductive material, an organic conductive layer containing an organic conductive material, and an organic-inorganic conductive layer containing both an inorganic conductive material and an organic conductive material.

Examples of the inorganic conductive material include a metal and a metal oxide. Here, it is defined that the metal includes a semimetal. Examples of the metal include metals such as aluminum, copper, silver, gold, platinum, palladium, nickel, tin, cobalt, rhodium, iridium, iron, ruthenium, osmium, manganese, molybdenum, tungsten, niobium, tantelum, titanium, bismuth, antimony, and lead, and alloys thereof, but are not limited thereto. Examples of the metal oxide include indium tin oxide (ITO), zinc oxide, indium oxide, antimony-added tin oxide, fluorine-added tin oxide, aluminum-added zinc oxide, gallium-added zinc oxide, silicon-added zinc oxide, a zinc oxide-tin oxide-based compound, an indium oxide-tin oxide-based compound, and a zinc oxide-indium oxide-magnesium oxide-based compound, but are not limited thereto.

Examples of the organic conductive material include a carbon material and a conductive polymer. Examples of the carbon material include carbon black, a carbon fiber, fullerene, graphene, a carbon nanotube, a carbon microcoil, and nanohorn, but are not limited thereto. Examples of the conductive polymer include substituted or unsubstituted polyaniline, polypyrrole, polythiophene, and a (co)polymer containing one or two kinds selected therefrom.

Specifically, as the REF electrode layer 21, it is possible to use, for example, a laminate obtained by forming a conductive layer such as a plating film, a vapor deposited film, a sputtering film, or a metal foil on a metal plate containing a metal material such as an Al alloy or a Mg alloy, a conductor plate such as a carbon fiber reinforced plastic, or an insulator layer containing a plastic material or the like. The REF electrode layer 21 is connected to a ground potential, for example.

Examples of the shape of the REF electrode layer 21 include a flat plate shape, but are not limited thereto. For example, the REF electrode layer 21 may have a step portion. In addition, one or more openings may be formed in the REF electrode layer 21. Furthermore, the REF electrode layer 21 may have a mesh-like configuration.

The REF electrode layer 21 is disposed on the pressing unit 41. The REF electrode layer 26 is flexible. Therefore, the REF electrode layer 26 can be deformed according to pressing of an operation surface. The REF electrode layer 26 is, for example, a flexible conductive layer or conductive film. The conductive film includes, for example, a film which is a substrate and a conductive layer disposed on a surface thereof. As a material of the conductive layer, similar materials to those of the above-described conductive layer of the REF electrode layer 21 can be exemplified.

Specific examples of the conductive film include a stainless used steel (SUS) film, a film printed with carbon, an indium tin oxide (ITO) film, and a metal vapor deposited film on which a metal such as Cu is vapor deposited. The REF electrode layer 26 is connected to a ground potential, for example.

(Sensor Layer)

The sensor layer 22 detects pressing of the pressing unit 41. The sensor layer 22 is disposed between the REF electrode layers 21 and 26 and can electrostatically detect a change in distance from the REF electrode layer 26 on an operation surface side. Specifically, the sensor layer 22 includes a plurality of sensing units 22s, and the plurality of sensing units 22s detects electrostatic capacitance that changes according to the distance from the REF electrode layer 26.

The sensor layer 22 is an electrostatic capacitance type sensor layer, and as illustrated in FIG. 5B, includes a substrate 22a, the plurality of sensing units 22s disposed on the substrate 22a, and an insulating layer 22b covering these sensing units 22s.

The substrate 22a has, for example, a film shape or a plate shape. Here, the film also includes a sheet. Examples of a material of the substrate 22a include a polymer resin and glass. Examples of the polymer resin include polyethylene terephthalate (PET), polyethylene naphthalate (PEN), polycarbonate (PC), an acrylic resin (PMMA), polyimide (PI), triacetyl cellulose (TAC), polyester, polyamide (PA), aramid, polyethylene (PE), polyacrylate, polyether sulfone, polysulfone, polypropylene (PP), diacetyl cellulose, polyvinyl chloride, an epoxy resin, a urea resin, a urethane resin, a melamine resin, a cyclic olefin polymer (COP), and a norbornene-based thermoplastic resin. Examples of the glass include soda glass, alkali-free glass, and quartz glass.

Figure 6:
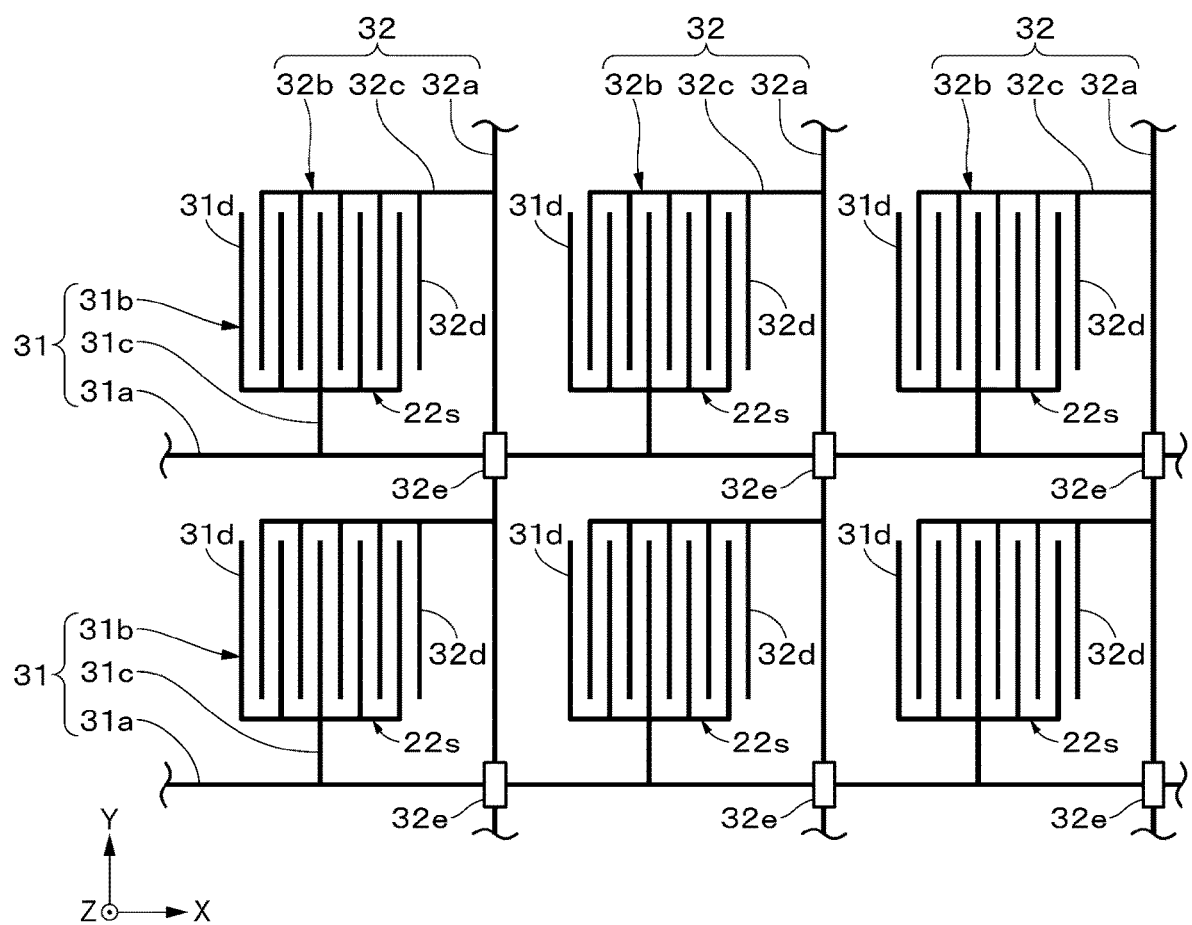
FIG. 6 is a plan view illustrating an example of disposition of X and Y electrodes.

When the plurality of sensing units 22s is viewed in plan view from a Z-axis direction, as illustrated in FIG. 6, the plurality of sensing units 22s is disposed two-dimensionally on a surface of the substrate 22a according to key arrangement of the sensor 20. However, FIG. 6 illustrates a configuration in which the sensing units 22s are disposed two-dimensionally in a matrix in order to facilitate illustration. The sensing units 22s are constituted by a plurality of X electrodes 31 and Y electrodes 32 disposed on a surface of the substrate 22a. Incidentally, in the present specification, axes orthogonal to each other in a surface of the substrate 22a or the sensor 20 are referred to as an X-axis and a Y-axis, respectively, and an axis perpendicular to the surface of the substrate 22a is referred to as the Z-axis.

The X electrodes 31 as first electrodes include an electrode wire unit 31a, a plurality of unit electrode bodies 31b, and a plurality of connection units 31c. The electrode wire unit 31a is extended in the X-axis direction. The plurality of unit electrode bodies 31b is disposed at regular intervals in the X-axis direction. The electrode wire unit 31a and the unit electrode bodies 31b are disposed so as to be spaced apart from each other by a predetermined distance, and connected to each other by the connection units 31c. Note that a configuration in which the unit electrode bodies 31b are directly disposed on the electrode wire unit 31a may be adopted by omitting the connection units 31c.

The Y electrodes 32 as second electrodes include an electrode wire unit 32a, a plurality of unit electrode bodies 32b, and a plurality of connection units 32c. The electrode wire unit 32a is extended in the Y-axis direction. The plurality of unit electrode bodies 32b is disposed at regular intervals in the Y-axis direction. The electrode wire unit 32a and the unit electrode bodies 32b are disposed so as to be spaced apart from each other by a predetermined distance, and connected to each other by the connection units 32c.

Each of the unit electrode bodies 31b has a comb-teeth shape in which a plurality of sub-electrodes 31d is extended in the Y-axis direction. Each of the unit electrode bodies 32b has a comb-teeth shape in which a plurality of sub-electrodes 32d is extended in the Y-axis direction. The unit electrode bodies 31b and 32b are disposed such that the sub-electrodes 31d and 32d thereof are engaged with each other. Specifically, the plurality of sub-electrodes 31d and the plurality of sub-electrodes 32d are alternately disposed, and the adjacent sub-electrode 31d and sub-electrode 32d are spaced apart from each other by a predetermined distance.

The electrode wire unit 32a includes a jumper wiring unit 32e striding over the electrode wire unit 31a at an intersection with the electrode wire unit 31a. An insulating layer (not illustrated) is disposed between the jumper wiring unit 32e and the electrode wire unit 32a.

As a material of the insulating layer 22b, either an inorganic material or an organic material may be used. Examples of the inorganic material include $SiO_2$, SiNx, SiON, $Al_2O_3$, $Ta_2O_5$, $Y_2O_3$, $HfO_2$, HfAlO, $ZrO_2$, and $TiO_2$. Examples of the organic material include a polymer resin such as a polyacrylate including polymethyl methacrylate (PMMA), polyvinyl alcohol (PVA), polystyrene (PS), transparent polyimide, polyester, epoxy, polyvinyl phenol, or polyvinyl alcohol.

(Substrate)

The substrate 23 is not bonded to the sensor layer 22 which is a lower layer of the substrate 23 with an adhesive layer or the like, but is in a state of only being placed on the sensor layer 22. The substrate 23 has the same or nearly the same coefficient of linear expansion as the uneven layer 25. The substrate 23 and the uneven layer 25 may be constituted by the same material, or may be constituted by different materials having the same or nearly the same coefficient of linear expansion.

The substrate 23 has, for example, a film shape or a plate shape. As a material of the substrate 23, similar polymer resins to those of the substrate 22a can be exemplified. Incidentally, the substrate 23 may include a resin layer and an adhesive layer disposed on one surface of the resin layer, and the substrate 23 and the intermediate layer 24 may be bonded to each other via the adhesive layer. In this case, the coefficient of linear expansion of the substrate 23 means the coefficient of linear expansion of the resin layer.

Since the substrate 23 is placed on the sensor layer 22 without being bonded thereto, even in a case where the sensor layer 22 and the uneven layer 25 expand and contract in an in-plane direction of the sensor layer 22 due to a change in ambient temperature or the like, the sensor layer 22 and the uneven layer 25 can be displaced independently. Therefore, it is possible to suppress generation of distortion or the like in a member constituting the sensor 20, and therefore reliability of the sensor 20 can be improved.

(Intermediate Layer)

As illustrated in FIG. 5B, the intermediate layer 24 includes a main body layer 24b of the intermediate layer 24 and an adhesive layer 24c disposed on a surface of the main body layer 24b. In addition, the intermediate layer 24 has a plurality of the hole portions 24a into which the plurality of pressing units 41 is pushed, respectively. Each of the hole portions 24a is, for example, a through hole penetrating the intermediate layer 24 from a front surface thereof to a back surface thereof. The hole portions 24a are disposed at positions corresponding to the sensing units 22s and the pressing units 41. Specifically, the pressing units 41, the hole portions 24a, and the sensing units 22s are disposed so as to overlap with one another in a thickness direction of the sensor 20. As a result, in a case where a key input operation is performed, the first structure unit 41a is inverted, and the pressing unit 41 can enter the hole portion 24a. The intermediate layer 24 is formed, for example, by screen printing or with a molding film. As a material of the main body layer 24b, for example, similar materials to those of the insulating layer 22b can be exemplified. As a material of the main body layer 24b, an energy ray-curable resin such as an ultraviolet curable resin may be used. The intermediate layer 24 and the uneven layer 25 are bonded to each other via the adhesive layer 24c.

(Uneven Layer)

Figure 7:
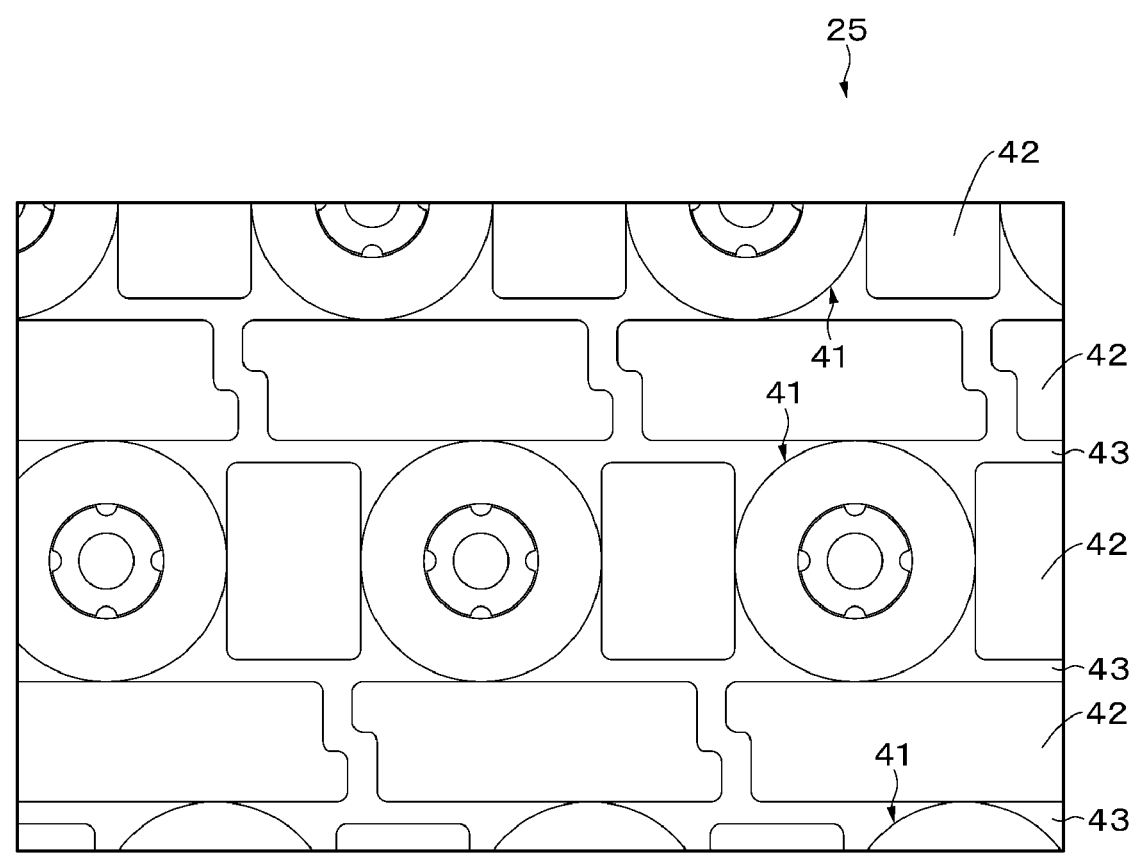
FIG. 7 is a plan view illustrating an example of a configuration of an uneven layer.

The uneven layer 25 is constituted by an embossed film 40. As a material of the embossed film 40, similar polymer resins to those of the substrate 22a can be exemplified. As illustrated in FIGS. 5B and 7, the uneven layer 25 includes the plurality of pressing units 41, a plurality of flat portions 42, and a plurality of vent holes 43. However, in the drawings other than FIG. 7, illustration of the vent holes 43 is omitted.

The plurality of pressing units 41 is two-dimensionally disposed on a surface of the intermediate layer 24 so as to correspond to the plurality of sensing units 22s, respectively. Each of the pressing units 41 has a hollow shape protruding with respect to the sensor layer 22 and having a bottom side opened. The pressing unit 41 separates the intermediate layer 24 and the REF electrode layer 26 from each other and forms a space having a predetermined thickness between the intermediate layer 24 and the REF electrode layer 26. The flat portion 42 is bonded to the intermediate layer 24, and the uneven layer 25 is thereby fixed onto a surface of the intermediate layer 24. The pressing unit 41 is a reaction force structure unit in which a reaction force nonlinearly changes with respect to a pushing amount (with respect to an operation load).

Figure 8A:
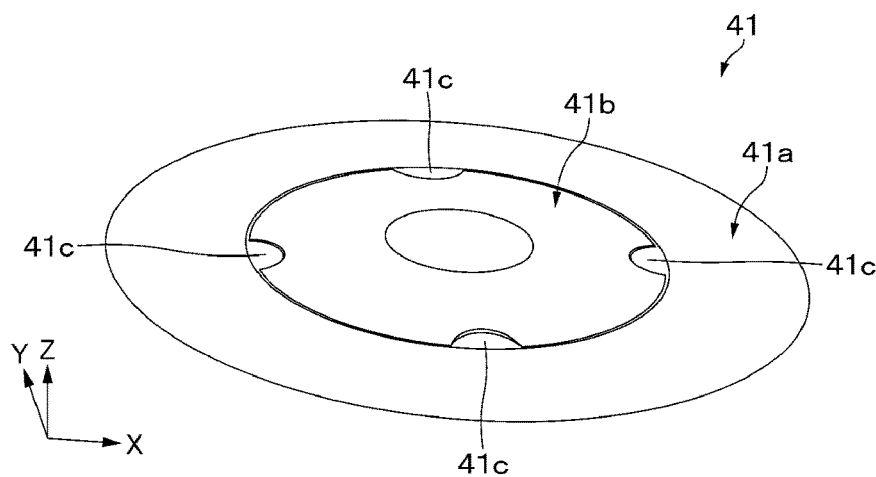
FIG. 8A is a perspective view illustrating an example of a configuration of a pressing unit.
Figure 8B:
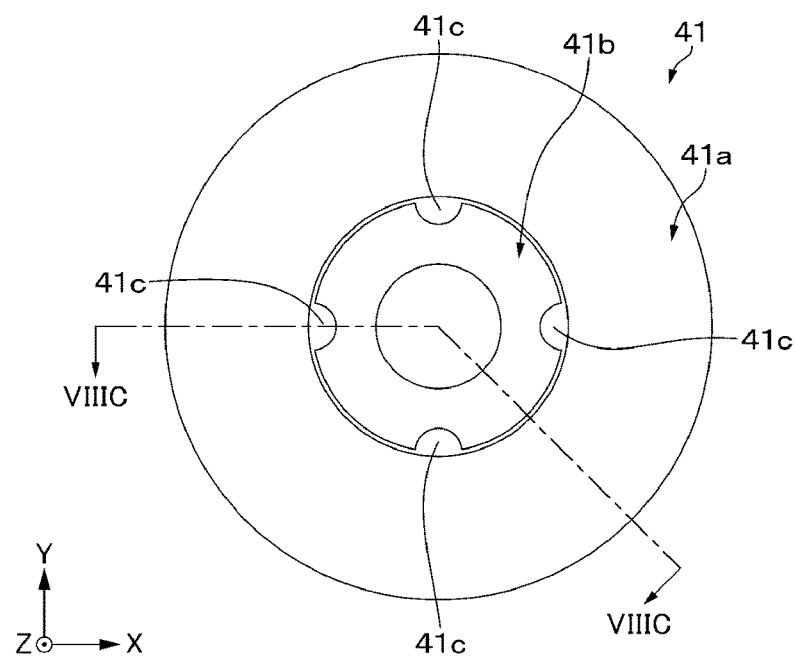
FIG. 8B is a plan view illustrating an example of the configuration of the pressing unit.
Figure 8C:
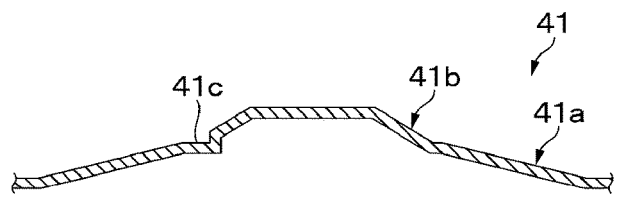
FIG. 8C is a cross-sectional view taken along line VIIIC-VIIIC of FIG. 8B.

As illustrated in FIGS. 8A, 8B, and 8C, the pressing unit 41 includes the hollow first structure unit 41a having a bottom side opened, and the hollow second structure unit 41b disposed on a top of the first structure unit 41a and having a bottom side opened. The first structure unit 41a is a buckling unit that is inverted by pressing of the key 27a and has an inclined surface gradually widening from a top thereof toward a bottom thereof. Examples of the shape of the first structure unit 41a include a hollow frustum shape having a bottom and a top opened. Examples of the shape of the second structure unit 41b include a hollow frustum shape having a bottom opened. Examples of the frustum shapes of the first and second structure units 41a and 41b include a frustum shape of a circular cone and a frustum shape of a quadrangular pyramid. Note that the shapes of the first and second structure units 41a and 41b are not limited thereto, and other shapes may be used. The inclination angle of a side surface of the second structure unit 41b is set so as to be larger than the inclination angle of a side surface of the first structure unit 41a. Here, the inclination angle means an inclination angle with respect to a surface of the sensor layer 22.

The second structure unit 41b has one or more shape portions 41c on a side surface thereof. The shape portion 41c is a protruding shape portion protruding toward the sensor layer 22, and a back side of the shape portion 41c is pushed down and recessed. Here, the shape portion 41c having a back side recessed will be described as an example. However, the back side does not have to be recessed as long as a surface facing the sensor layer 22 has a protruding shape.

The shape portion 41c is partially formed on a periphery of a bottom side of a side surface of the second structure unit 41b. In a case where the number of the shape portions 41c is two or more, the two or more shape portions 41c are disposed at regular intervals or at irregular intervals on a periphery of the second structure unit 41b. Note that an example is illustrated in which four shape portions 41c are disposed at regular intervals on the periphery of the second structure unit 41b in FIGS. 8A and 8B.

When the pressing unit 41 is viewed in plan view from the Z-axis direction, the shape of the shape portion 41c may be a substantially partially circular shape, a substantially partially elliptical shape, a substantially polygonal shape such as a substantially quadrangular shape, an irregular shape, or the like, but is not limited thereto. Here, the "partially circular shape" is a part of a circular shape, for example, a semicircular shape. The partially elliptical shape is a part of an elliptical shape, for example, a semielliptical shape. Examples of the polygonal shape include a triangular shape, a quadrangular shape, and a pentagonal shape, and a curvature R or the like may be given to a top of each of these shapes.

The vent hole 43 connects internal spaces of the adjacent pressing units 41 to each other and also connects the internal spaces of the pressing units 41 to an external space. When the pressing unit 41 is pushed, air in the internal space of the pressing unit 41 is discharged through the vent hole 43. The vent hole 43 is a hole portion constituted by a groove disposed on a back surface of the uneven layer 25 and a surface of the intermediate layer 24. By forming a groove also on a surface of the intermediate layer 24 and combining the groove on the back surface of the uneven layer 25 and the groove on the surface of the intermediate layer 24, the vent hole 43 may be formed.

(Key Top Layer)

The key top layer 27 is flexible. Therefore, the key top layer 27 can be deformed together with the REF electrode layer 26 according to pressing of an operation surface. Examples of the key top layer 27 include a resin film and a soft metal plate. On a surface of the key top layer 27, a plurality of keys 27a is arranged. On the key 27a, a character, a symbol, a function, or the like is printed. By pressing and releasing the key 27a, information such as scan coat is output from the controller IC 13 to the host apparatus 12.

Under the key 27a, the pressing units 41, the hole portions 24a, and the sensing units 22s are disposed. That is, the keys 27a, the pressing units 41, the hole portions 24a, and the sensing units 22s are disposed so as to overlap with one another in a thickness direction of the sensor 20.

1.4 Operation of Sensor

In the sensor 20 having the above-described configuration, when a voltage is applied between the X electrode 31 and the Y electrode 32, the adjacent sub-electrodes 31d and 32d form capacitive coupling. When the REF electrode layer 26 comes close to the sensor layer 22 (that is, the sensing unit 22s) by an input operation in a state where a voltage is applied between the X electrode 31 and the Y electrode 32, the electrostatic capacitance between the adjacent sub-electrodes 31d and 32d changes. Therefore, the electrostatic capacitance of the entire sensing unit 22s constituted by a pair of unit electrode bodies 31b and 32b changes. On the basis of the change in the electrostatic capacitance of the entire sensing unit 22s, the controller IC 13 judges whether a gesture input operation or a key input operation has been performed on the operation surface.

Hereinafter, with reference to FIGS. 9A and 9B, an example of an operation of the sensor 20 during a gesture input operation and a key input operation will be described.

(Gesture Input Operation)

Figure 9A:
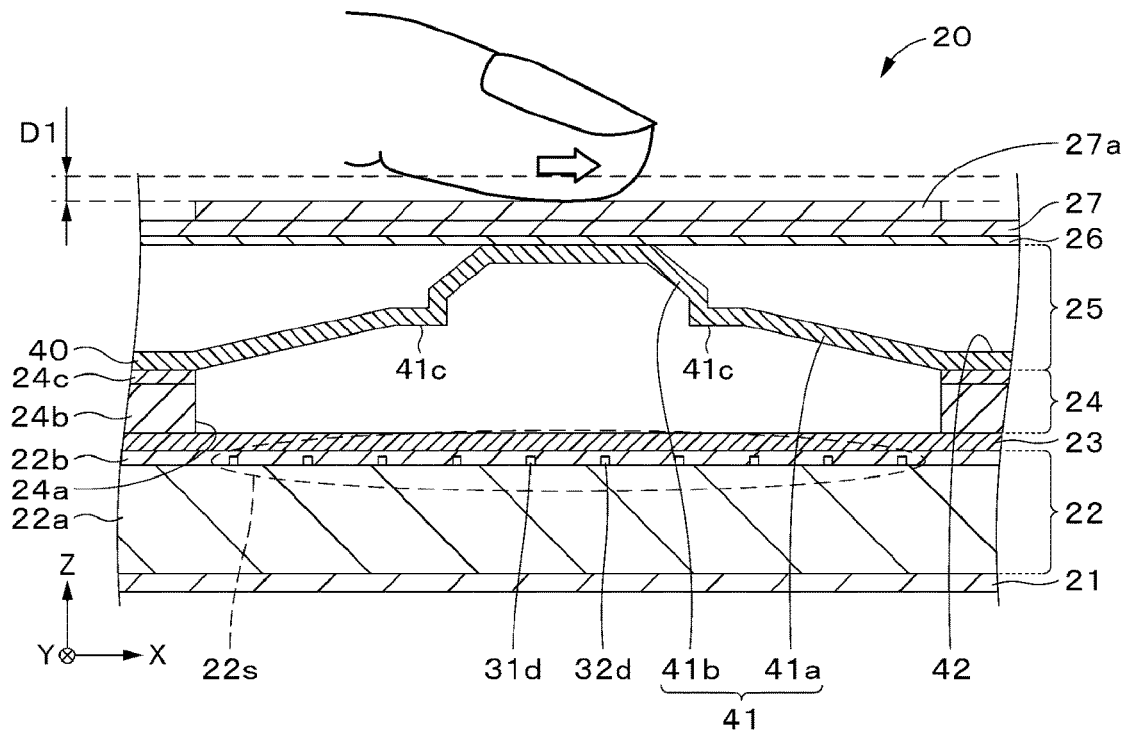
FIG. 9A is a cross-sectional view for explaining an example of an operation of a sensor when a gesture input operation is performed.

As illustrated in FIG. 9A, when the gesture input operation is performed on a surface (operation surface) of the sensor 20, the shape of the pressing unit 41 is slightly deformed, and the key 27a is displaced downward from an initial position by a distance D1. As a result, a distance between the sensor layer 22 and the REF electrode layer 26 is slightly displaced by D1, and the electrostatic capacitance slightly changes. The sensing unit 22s in the sensor layer 22 detects this change in electrostatic capacitance and outputs the change to the controller IC 13 as an electric signal. Here, the change in electrostatic capacitance means a change in electrostatic capacitance of the whole of one of the sensing units 22s.

(Key Input Operation)

Figure 9B:
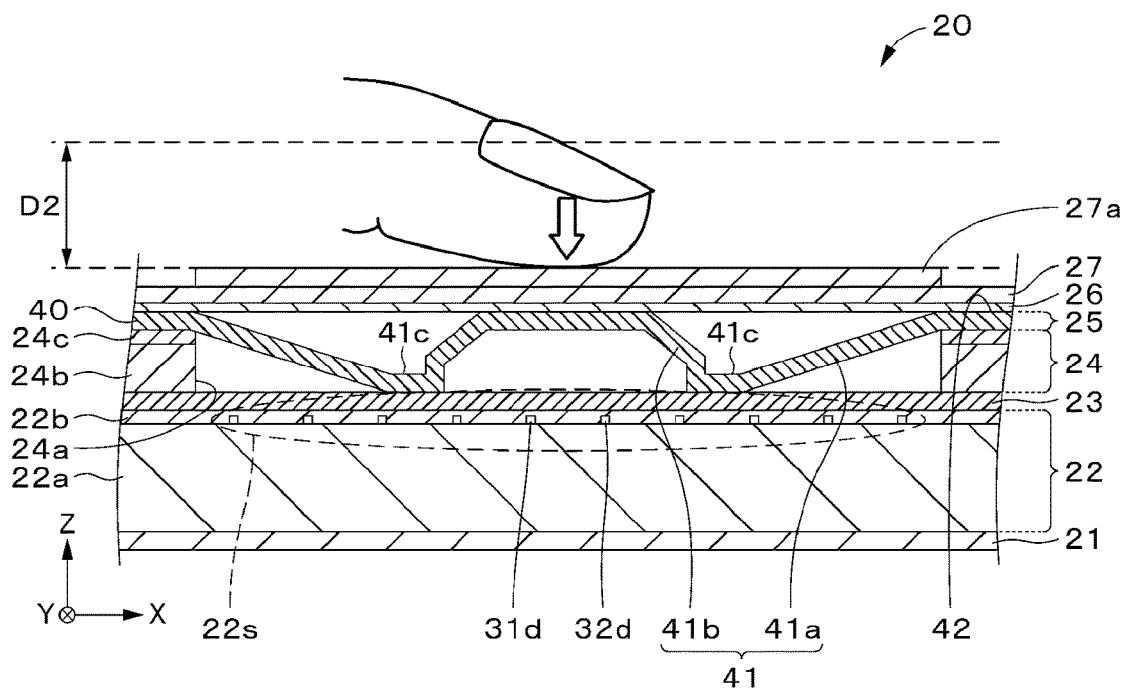
FIG. 9B is a cross-sectional view for explaining an example of an operation of the sensor when a key input operation is performed.

As illustrated in FIG. 9B, when the key 27a of the sensor 20 is pressed and a key input operation is performed, the first structure unit 41a is inverted, and the key 27a is displaced from an initial position by a distance D2. As a result, a distance between the sensor layer 22 and the REF electrode layer 26 is largely displaced by D2, and the electrostatic capacitance largely changes. The sensing unit 22s in the sensor layer 22 detects this change in electrostatic capacitance and outputs the change to the controller IC 13 as an electric signal.

When the key 27a is further pressed in the state illustrated in FIG. 9B, the second structure unit 41b is deformed and crushed with a boundary portion between the first structure unit 41a and the second structure unit 41b pressed against a substrate 123 as a starting point (see FIG. 2A). In the first embodiment, the second structure unit 41b has the shape portion 41c on a side surface thereof. Therefore, in a state where the second structure unit 41b is crushed in this manner, vent holes (not illustrated) are formed on both sides of the shape portion 41c. As a result, a space formed by an inner surface of the second structure unit 41b and a surface of the substrate 23 communicates with the outside of the second structure unit 41b via the vent holes.

When pressing of the key 27a is released, the second structure unit 41b returns to its original shape and sucks air. At this time, air is supplied from the outside of the second structure unit 41b via the vent holes. Therefore, suction of the substrate 23 by the second structure unit 41b is suppressed. Therefore, returning failure of the pressing unit 41 is suppressed.

1.5 Change in Electrostatic Capacitance with Respect to Key Input Operation

Hereinafter, an example of a change in electrostatic capacitance of the sensor 20 during a key input operation will be described with reference to FIGS. 10A, 10B, and 10C.

Figure 10A:
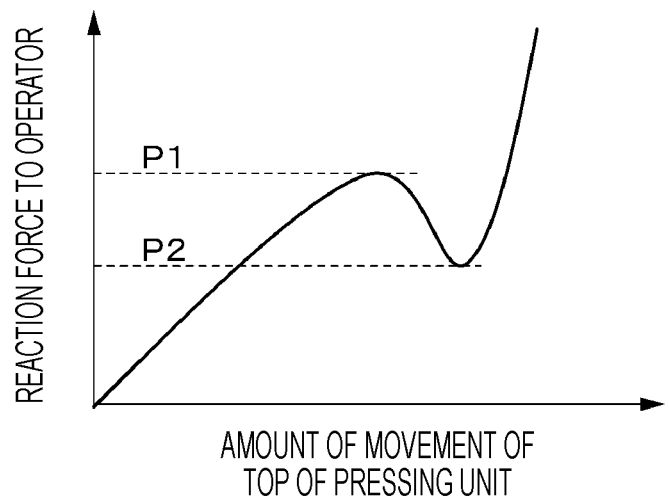
FIG. 10A is a graph illustrating an example of a relationship between the amount of movement of a reference electrode and a reaction force to an operator.

In the sensor 20 having the above-described configuration, as illustrated in FIG. 10A, the pressing unit 41 has a function of nonlinearly changing a reaction force to an operator with respect to the amount of movement of the REF electrode layer 26. Specifically, the pressing unit 41 has a function of increasing a reaction force according to pushing by an operator to raise the reaction force to a maximum value at P1, decreasing the reaction force to a minimum value P2 by further increasing the pushing amount, and increasing the reaction force again by pushing to a limit of pushing deformation.

Figure 10B:
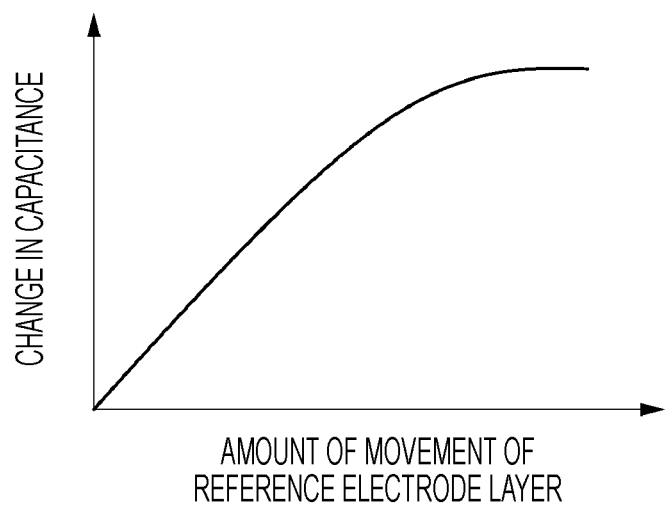
FIG. 10B is a graph illustrating an example of a relationship between the amount of movement of a reference electrode and a change in capacitance.
Figure 10C:
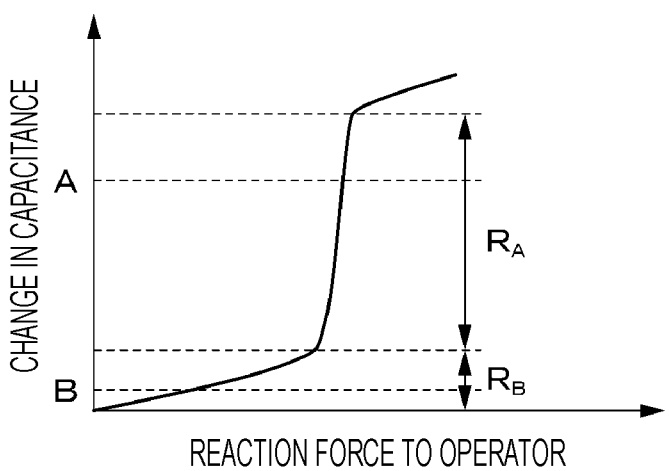
FIG. 10C is a graph illustrating an example of a relationship between a reaction force to an operator and a change in capacitance.

In the sensor 20, as illustrated in FIG. 10B, the change in electrostatic capacitance monotonically increases with respect to the amount of movement of the REF electrode layer 26. In addition, as illustrated in FIG. 10C, the change in electrostatic capacitance gently changes according to an increase in a reaction force to an operator, then sharply changes, and then gently changes again. A region $R_B$ in which the change gently occurs initially corresponds to a region from a point where an operator starts pushing at an initial position to a point where the reaction force reaches the maximum value P1 in FIG. 10A. In addition, a region $R_A$ in which the change sharply occurs corresponds to a region from a point where the reaction force is the maximum value P1 to a point where the reaction force reaches the minimum value P2 in FIG. 10A.

By setting a threshold value A within the region $R_A$ and judging whether or not the electrostatic capacitance exceeds this threshold value A, it can be judged whether or not the key input operation is being performed on the operation surface. Meanwhile, by setting a threshold value B within the region $R_B$ and judging whether or not the electrostatic capacitance exceeds this threshold value B, it can be judged whether or not the gesture operation is being performed on the operation surface.

1.6 Operation of Controller IC

Figure 11:
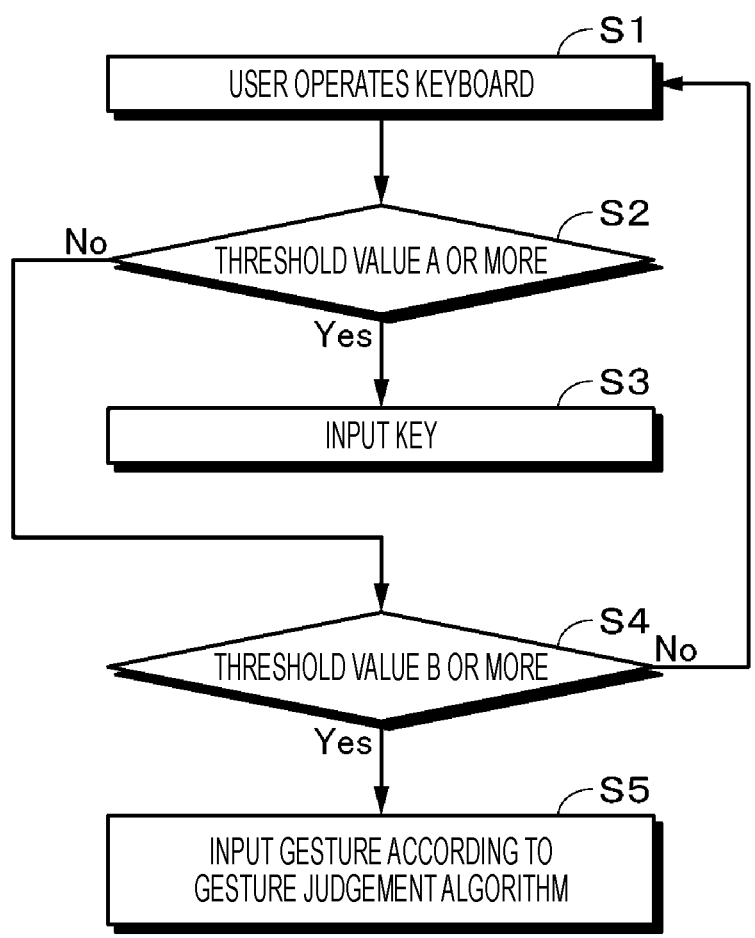
FIG. 11 is a flowchart for explaining an example of an operation of a controller IC.

Hereinafter, an example of an operation of the controller IC 13 will be described with reference to FIG. 11.

First, in step S1, when a user performs an input operation on an operation surface of the input device 11, in step S2, the controller IC 13 judges whether or not a change in electrostatic capacitance of the whole of one of the sensing units 22s is equal to or larger than the threshold value B on the basis of an electric signal corresponding to a change in electrostatic capacitance supplied from the sensor 20. In step S2, in a case where it is judged that the change in electrostatic capacitance is equal to or larger than the threshold value B, in step S3, the controller IC 13 outputs information on a key such as a scan code to the host apparatus 12. Key input is thereby performed. Meanwhile, in step S2, in a case where it is judged that the change in electrostatic capacitance is not equal to or larger than the threshold value B, the process proceeds to step S4.

Subsequently, in step S4, the controller IC 13 judges whether or not a change in electrostatic capacitance of the whole of one of the sensing units 22s is equal to or larger than the threshold value A on the basis of an electric signal corresponding to a change in electrostatic capacitance supplied from the sensor 20. In step S4, in a case where it is judged that the change in electrostatic capacitance is equal to or larger than the threshold value A, in step S5, the controller IC 13 operates according to a gesture judgement algorithm. As a result, gesture input is performed. Meanwhile, in step S4, in a case where it is judged that the change in electrostatic capacitance is not equal to or larger than the threshold value A, the process returns to step S1.

1.7 Effect

In the sensor 20 according to the first embodiment, the second structure unit 41b has one or more shape portions 41c protruding toward the sensor layer 22 on a surface facing the sensor layer 22. Therefore, when the second structure unit 41b is crushed by pressing of the key 27a, vent holes are formed on both sides of each of the shape portions 41c. Therefore, when the second structure unit 41b returns to its original shape by releasing pressing of the key 27a, it is possible to suppress suction of the second structure unit 41b by the substrate 23. Therefore, returning failure of the pressing unit 41 is suppressed.

1.8 Modified Example

In the above-described first embodiment, the case where the input device 11 is a keyboard has been described, but the present technology is not limited to this example. The present technology can also be applied to a sensor including only one pressing unit and an input device including the sensor, such as a switch.

In the above-described first embodiment, the case where the electronic apparatus 10 is a personal computer has been described, but the present technology is not limited to this example. The present technology can be applied to various electronic apparatuses each including an input device such as a keyboard or a switch, for example, a mobile phone such as a smartphone, a tablet computer, a television, a camera, a portable game apparatus, a car navigation system, or a wearable apparatus.

The unit electrode bodies 31b and 32b may each have a concentric shape or a spiral shape. Examples of the concentric shape include a concentric polygonal shape, a concentric circular shape, and a concentric elliptical shape, but are not limited thereto. Examples of the spiral shape include a spiral polygonal shape, a spiral circular shape, and a spiral oval shape, but are not limited thereto.

Figure 12A:
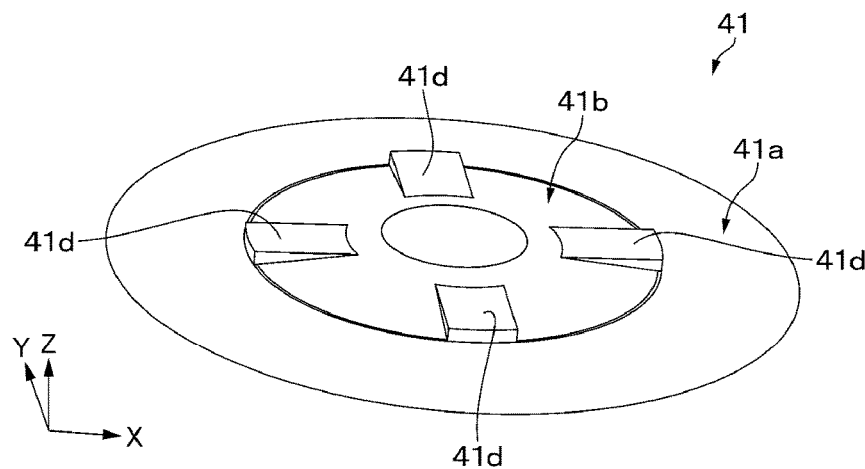
FIG. 12A is a perspective view illustrating an example of a configuration of a pressing unit of a sensor according to a modified example of the first embodiment of the present technology.
Figure 12B:
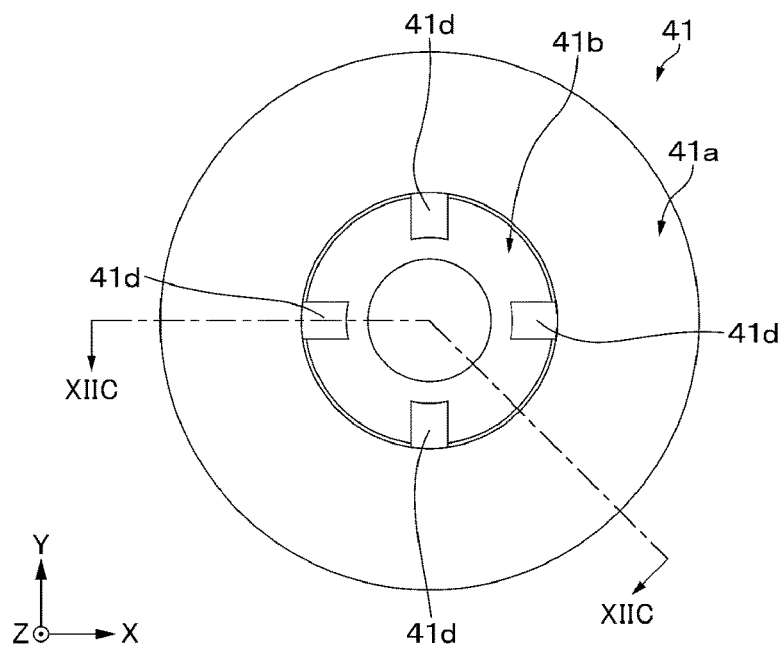
FIG. 12B is a plan view illustrating an example of the configuration of the pressing unit of the sensor according to the modified example of the first embodiment of the technology.
Figure 12C:
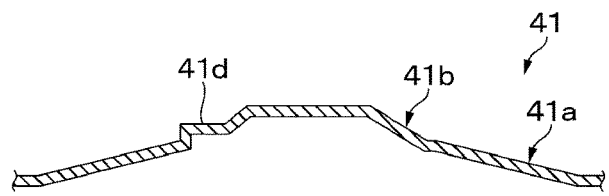
FIG. 12C is a cross-sectional view taken along line XIIC-XIIC of FIG. 12B.

Instead of one or more shape portions 41c protruding toward the sensor layer 22 (see FIGS. 8A, 8B, and 8C), as illustrated in FIGS. 12A, 12B, and 12C, the second structure unit 41b may have one or more shape portions (recessed portions) 41d recessed in a direction away from the sensor layer 22 on a side surface thereof.

In the sensor 20 including the second structure unit 41b having the above-described configuration, the shape portion 41d functions as a vent hole in a state where the second structure unit 41b is crushed by pressing of the key 27a. As a result, a space formed by an inner surface of the second structure unit 41b and a surface of the substrate 123 communicates with the outside of the second structure unit 41b via the vent hole. Therefore, as in the first embodiment, it is possible to suppress returning failure of the pressing unit 41.

Instead of the shape portion 41c disposed on a periphery on a bottom side of a side surface (see FIGS. 8A, 8B, and 8C), the second structure unit 41b may have a shape portion 41e disposed on a periphery on a top side of a side surface as illustrated in FIG. 13A.

In the sensor 20 including the second structure unit 41b having the above-described configuration, when the second structure unit 41b is deformed from a boundary portion between the first structure unit 41a and the second structure unit 41b as a starting point by pressing of the key 27a, a top of the deformed second structure unit 41b is supported by the shape portion 41e. For this reason, crushing of the second structure unit 41b is suppressed. Therefore, when the second structure unit 41b returns to its original shape by releasing pressing of the key 27a, it is possible to suppress suction of the second structure unit 41b by the substrate 23. Therefore, returning failure of the pressing unit 41 is suppressed.

As illustrated in FIG. 13B, the second structure unit 41b may have a shape portion (protruding shape portion) 41f protruding toward the sensor layer 22 at a top thereof. When the pressing unit 41 is viewed in plan view from the Z-axis direction, examples of the shape of the shape portion 41f include a cross shape, an I shape, a circular shape, a polygonal shape, and an irregular shape, but are not limited thereto.

In the sensor 20 in which the shape portion 41f is formed on a top of the second structure unit 41b as described above, when the second structure unit 41b is deformed from a boundary portion between the first structure unit 41a and the second structure unit 41b as a starting point by pressing of the key 27a, a top of the deformed second structure unit 41b is supported by the shape portion 41f. Therefore, similarly to the sensor 20 having the above-described shape portion 41e on a side surface of the second structure unit, returning failure of the pressing unit 41 is suppressed.

Instead of having one or more shape portions 41c protruding toward the sensor layer 22 (see FIGS. 8A, 8B, and 8C), the second structure unit 41b may have a small depth of 200 μm or less. In this case, the amount of crushing of the second structure unit 41b is reduced by pressing of the key 27a, and therefore a suction force weakens when the second structure unit 41b returns from the crushed state. Therefore, returning failure of the pressing unit 41 is suppressed.

As illustrated in FIG. 14A, instead of the intermediate layer 24 (see FIG. 5B), the pressing unit 41 may further include a third structure unit 41g, and the first structure unit 41a may be disposed on the third structure unit 41g. The third structure unit 41g is a raising unit for raising the first structure unit 41a and has a side surface standing substantially perpendicular to a surface of the sensor layer 22 or a side surface inclined at an inclination angle of less than 90° with respect to the surface of the sensor layer 22. The inclination angle of the side surface of the third structure unit 41g is set so as to be larger than the inclination angle of a side surface of the first structure unit 41a. Here, the inclination angle means an inclination angle with respect to a surface of the sensor layer 22.

In a case where the configuration in which the pressing unit 41 further includes the third structure unit 41g as described above is adopted, the intermediate layer 24 can be omitted, and therefore the layer configuration of the sensor 20 can be simplified. However, it is also possible to adopt a configuration in which both the intermediate layer 24 and the third structure unit 41g are disposed.

As illustrated in FIG. 14B, a configuration in which the substrate 23 is not disposed and the intermediate layer 24 is directly disposed on the sensor layer 22 may be adopted. However, the substrate 23 is preferably disposed from a viewpoint of improving reliability of the sensor 20 as described above.

As illustrated in FIG. 15A, the pressing unit 41 may further include a pusher 44 on a top of the second structure unit 41b. The pusher 44 is, for example, a double-sided adhesive film and includes a resin layer 44a and adhesive layers 44b and 44c disposed on both surfaces of the resin layer 44a. The pusher 44 is bonded to a top of the second structure unit 41b via the adhesive layer 44b and bonded to a back surface of the REF electrode layer 26 via the adhesive layer 43c. As described above, in a case where the pusher 44 is further disposed on the top of the second structure unit 41b, a click feeling can be further improved.

As illustrated in FIG. 15B, the sensor 20 may further include a support layer 45 disposed between the pusher 44 and the REF electrode layer 26. By adopting this configuration, it is possible to suppress a granular feeling of the pressing unit 41 felt via the key top layer 27, for example, when a surface of the key top layer 27 is touched with a finger or the like.

When the sensor 20 is viewed in plan view from the Z-axis direction, a periphery of the support layer 45 is preferably disposed outside a periphery of a top of the pressing unit 41 and inside a periphery of the key 27a, and is more preferably disposed outside a periphery of a bottom of the pressing unit 41 and inside the periphery of the key 27a. For example, the periphery of the support layer 45 is disposed so as to overlap or substantially overlap with the periphery of the key 27a. By disposing the periphery of the support layer 45 at such a position, it is possible to further suppress a granular feeling of the pressing unit 41 felt via the key top layer 27.

The support layer 45 is, for example, an adhesive film and includes a resin layer 45a and an adhesive layer 45b disposed on one surface of the resin layer 45a. The support layer 45 is bonded to a back surface of the REF electrode layer 26 via the adhesive layer 45b. The pusher 44 is bonded to a back surface of the support layer 45 via the adhesive layer 45c.

Incidentally, in the above-described configuration example, the configuration in which the support layer 45 and the pusher 44 are separated from each other has been described as an example, but the support layer 45 and the pusher 44 may be integrally formed. In addition, the pressing unit 41 may have the support layer 45 directly disposed thereon without including the pusher 44.

The first structure unit 41a may be constituted by a plurality of legs supporting the second structure unit 41b. A structure in which the uneven layer 25 is disposed directly on the sensor layer 22 such that the first structure unit 41a is not inverted may be adopted.

The sensor layer 22 may include a plurality of X electrodes 31 on a back surface of the substrate 22a and may include a plurality of Y electrodes 32 on a surface of the substrate 22a. In this case, the sensing unit 22s includes the unit electrode bodies 31b and 32b disposed on different surfaces of the substrate 22a.

As illustrated in FIG. 16, the X electrodes 31 include a plurality of the unit electrode bodies 31b disposed at predetermined intervals in the X direction and a plurality of electrode wire units 31f connecting the unit electrode bodies 31b to one another. Each of the unit electrode bodies 31b is a net-shaped body having the plurality of sub-electrodes 31d extended in the X direction.

As illustrated in FIG. 16, the Y electrodes 32 include a plurality of the unit electrode bodies 32b disposed at a predetermined interval in the Y direction and a plurality of electrode wire units 32f connecting the unit electrode bodies 32b to one another. Each of the unit electrode bodies 32b is a net-shaped body having the plurality of sub-electrodes 32d extended in the Y direction.

2. Second Embodiment

2.1 Configuration of Sensor

A sensor 120 according to a second embodiment of the present technology is different from the sensor 20 according to the first embodiment in having, as illustrated in FIG. 17A, one or more hole portions 123a at positions facing a back surface of a second structure unit 41b instead of having one or more shape portions 41c (see FIG. 5B) in the second structure unit 41b. Incidentally, in the second embodiment, the same reference numerals are given to portions similar to the first embodiment, and description thereof will be omitted.

The hole portion 123a is formed in a substrate 123. The hole portion 123a may be a through hole or a hole portion having a bottom. As illustrated in FIG. 17B, the hole portion 123a is formed at a position overlapping with the second structure unit 141b when the sensor 120 is viewed in plan view from the Z-axis direction. A part of the hole portion 123a is extended from the position of the second structure unit 141b to the position of a first structure unit 141a in plan view from the Z-axis direction. That is, a part of the hole portion 123a is extended from the inside to the outside of a boundary portion between the first structure unit 141a and the second structure unit 141b in plan view from the Z-axis direction. When a pressing unit 141 is viewed in plan view from the Z-axis direction, examples of the shape of the hole portion 123a include an elliptical shape, a polygonal shape, an I shape, a cross shape, an oval shape, and an irregular shape, but are not limited thereto. Note that FIG. 17B illustrates an example in which the shape of the hole portion 123a is an I shape when the pressing unit 141 is viewed in plan view from the Z-axis direction.

An uneven layer 125 is constituted by an embossed film 140. The embossed film 140 includes the pressing unit 141. The pressing unit 141 is different from the pressing unit 41 in the first embodiment in including the second structure unit 141b in which the shape portion 41c (see FIG. 5B) is not formed on a side surface thereof.

2.2 Operation of Sensor During Key Input Operation

In a state where the second structure unit 141b is crushed by pressing of a key 27a, the hole portion 123a functions as a vent hole. As a result, a space formed by an inner surface of the second structure unit 141b and a surface of the substrate 123 communicates with the outside of the second structure unit 141b via the hole portion 123a. Therefore, as illustrated in FIG. 18, when pressing of the key 27a is released, the second structure unit 141b returns to its original shape and sucks air. At this time, air is supplied from the outside of the second structure unit 141b via the hole portion 123a. Therefore, suction of the substrate 123 by the second structure unit 141b is suppressed. Therefore, returning failure of the pressing unit 141 is suppressed.

2.3 Effect

In the sensor 120 according to the second embodiment, the hole portion 123a is formed at a position facing a back surface of the second structure unit 141b. Therefore, when pressing of the key 27a is released, suction of the substrate 23 by the second structure unit 141b is suppressed. Therefore, returning failure of the pressing unit 141 is suppressed.

2.4 Modified Example

In plan view from the Z-axis direction, the hole portion 123a may be housed inside a boundary portion between the first structure unit 41a and the second structure unit 141b. In the case of this configuration, since the hole portion 123a is formed, a suction force weakens when the second structure unit 141b returns from a crushed state. Therefore, returning failure of the pressing unit 141 is suppressed.

In the case of the above configuration, the hole portion 123a is preferably a through hole, and a gap is preferably formed between a sensor layer 22 and the substrate 123. This is because air is supplied to an internal space of the second structure unit 141b via the through hole and the gap when the second structure unit 141b returns from a crushed state.

In addition, in the case of the above configuration, the hole portion 123a is preferably a through hole, and a porous layer is preferably further disposed between the sensor layer 22 and the substrate 123. This is because air is supplied to an internal space of the second structure unit 141b via the through hole and the porous layer when the second structure unit 141b returns from a crushed state.

As illustrated in FIGS. 19A and 19B, one or more hole portions 123a may be partially formed at positions facing a boundary portion between the first structure unit 41a and the second structure unit 141b. Note that each of the hole portions 123a is extended from the position of an inner surface of the second structure unit 14b to the position of an inner surface of the first structure unit 141a in plan view from the Z-axis direction. That is, each of the hole portions 123a is extended from the inside to the outside of a boundary portion between the first structure unit 141a and the second structure unit 141b in plan view from the Z-axis direction. In a case where the substrate 123 includes two or more hole portions 123a, the hole portions 123a are disposed at positions facing the boundary portion between the first structure unit 41a and the second structure unit 141b at regular intervals or at irregular intervals. In the case of the above configuration, as in the second embodiment, returning failure of the pressing unit 141 is suppressed.

A porous layer may be disposed between the sensor layer 22 and the substrate 123. In this case, an effect of suppressing returning failure is further improved. The substrate 123 may be a porous layer. In this case, it is not necessary to align the position of a hole portion of the substrate 123 with respect to the second structure unit 141b. Therefore, the sensor 120 is easily manufactured.

3 Third Embodiment

3.1 Configuration of Sensor

A sensor 220 according to a third embodiment of the present technology is different from the sensor 20 according to the first embodiment in partially having, as illustrated in FIGS. 20A and 20B, one or more shape portions 28 in a sensor layer 22 at positions facing a boundary portion between a first structure unit 41a and a second structure unit 141b instead of having one or more shape portions 41c (see FIG. 5B) in the second structure unit 41b. In the third embodiment, a base layer is constituted by the sensor layer 22 and an intermediate layer 24. Incidentally, in the third embodiment, the same reference numerals are given to portions similar to the first embodiment, and description thereof will be omitted.

The shape portion 28 is an island-like portion disposed so as to protrude with respect to a surface of the sensor layer 22. In a case where the sensor layer 22 has two or more shape portions 28 on a surface thereof, the two or more shape portions 28 are disposed at positions facing a boundary portion between the first structure unit 41a and the second structure unit 141b at regular intervals or at irregular intervals. The shape portion 28 preferably has a similar layer configuration to a part or the whole of the intermediate layer 24. This is because the shape portion 28 can also be formed at the same time in a process for manufacturing the intermediate layer 24 and the process for manufacturing the intermediate layer 24 can be simplified.

When the pressing unit 141 is viewed in plan view from the Z-axis direction, examples of the shape of the shape portion 28 include a circular shape, an elliptical shape, a polygonal shape, a partly cut ring shape, and an irregular shape, but are not limited thereto. Note that FIG. 20B illustrates an example in which the shape of the pressing unit 141 is a quadrangular shape when the pressing unit 141 is viewed in plan view from the Z-axis direction.

3.2 Operation of Sensor During Key Input Operation

When a key 27a of the sensor 220 is pressed to perform key input operation, the first structure unit 41a is inverted, and a boundary portion between the first structure unit 41a and the second structure unit 41b is held by the shape portion 28 in a state floating from a surface of the sensor layer 22. In this state, a gap is formed in a part of a space between the boundary portion between the first structure unit 41a and the second structure unit 41b and the surface of the sensor layer 22.

As illustrated in FIG. 21, when pressing of the key 27a is released, the second structure unit 141b returns to its original shape and sucks air. At this time, air is supplied from the outside of the second structure unit 141b via the gap. Therefore, suction of the sensor layer 22 by the second structure unit 141b is suppressed. Therefore, returning failure of the pressing unit 141 is suppressed.

3.3 Effect

In the sensor 220 according to the third embodiment, one or more shape portions 28 are formed at positions facing the boundary portion between the first structure unit 41a and the second structure unit 141b. Therefore, when pressing of the key 27a is released, suction of the sensor layer 22 by the second structure unit 141b is suppressed. Therefore, returning failure of the pressing unit 141 is suppressed.

3.4 Modified Example

Instead of having one or more shape portions 28 (FIGS. 20A and 20B) in the sensor layer 22 at positions facing a boundary portion between the first structure unit 41a and the second structure unit 141b, as illustrated in FIG. 22A, the sensor 220 may include a substrate 223 between the sensor layer 22 and the intermediate layer 24, and the substrate 223 may partially have one or more shape portions 228 at positions facing the boundary portion between the first structure unit 41a and the second structure unit 141b. Even with this configuration, an action and an effect similar to those of the third embodiment can be obtained. The shape portion 228 and the substrate 223 may be integrally formed, or the shape portion 228 and the substrate 223 may be formed so as to be separated from each other.

Instead of having one or more shape portions 28 (FIGS. 20A and 20B) in the sensor layer 22 at positions facing a boundary portion between the first structure unit 41a and the second structure unit 141b, as illustrated in FIG. 22B, the sensor layer 22 may have one or more shape portions 28 at positions facing a back surface of the second structure unit 141b.

In the sensor 20 having the shape portion 28 in the sensor layer 22, when the second structure unit 141b is deformed from a boundary portion between the first structure unit 41a and the second structure unit 41b as a starting point by pressing of the key 27a, a top of the deformed second structure unit 141b is supported by the shape portion 28. For this reason, crushing of the second structure unit 141b is suppressed. Therefore, when the second structure unit 141b returns to its original shape by releasing pressing of the key 27a, it is possible to suppress suction of the second structure unit 141b by the sensor layer 22. Therefore, returning failure of the pressing unit 141 is suppressed.

Instead of having one or more shape portions 28 (FIGS. 20A and 20B) in the sensor layer 22 at positions facing a boundary portion between the first structure unit 41a and the second structure unit 141b, as illustrated in FIG. 23, the sensor 220 may include the substrate 223 between the sensor layer 22 and the intermediate layer 24, and the substrate 223 may have one or more shape portions 228 at positions facing a back surface of the second structure unit 141b. Even with this configuration, an action and an effect similar to those of the Modified Example can be obtained.

4 Fourth Embodiment

4.1 Configuration of Sensor

A sensor 320 according to a fourth embodiment of the present technology is different from the sensor 320 according to the first embodiment in including, as illustrated in FIGS. 24A and 24B, a second structure unit 341b having one or more through holes 341c on a side surface thereof instead of including the second structure unit 41b (see FIG. 5B) having one or more shape portions 41c on a side surface thereof. Incidentally, in the fourth embodiment, the same reference numerals are given to portions similar to the first embodiment, and description thereof will be omitted.

An uneven layer 325 is constituted by an embossed film 340. The embossed film 340 has a pressing unit 341. The pressing unit 341 includes a second structure unit 341b having one or more through holes 341c on a side surface thereof. In a case where the second structure unit 341b has two or more through holes 341c, as illustrated in FIG. 24B, the two or more through holes 341c are disposed in a peripheral direction of a side surface of the second structure unit 341b at regular intervals or at irregular intervals. Examples of the shape of the through hole 341c include a circular shape, an elliptical shape, a polygonal shape, and an irregular shape, but are not limited thereto.

4.2 Operation of Sensor During Key Input Operation

When a key 27a is pressed with a force equal to or higher than a predetermined force, a boundary portion between the first structure unit 41a and the second structure unit 341b is pressed against a substrate 23, and the second structure unit 341b is deformed and crushed with the pressed boundary portion as a starting point. As illustrated in FIG. 25, when pressing of the key 27a is released, the second structure unit 341b returns to its original shape and sucks air. At this time, air is supplied from the outside of the second structure unit 341b via the through hole 341c. Therefore, suction of the substrate 23 by the second structure unit 341b is suppressed. Therefore, returning failure of the pressing unit 341 is suppressed.

4.3 Effect

In the sensor 320 according to the second embodiment, the second structure unit 341b has one or more through holes 341c on a side surface thereof, and therefore returning failure of the pressing unit 341 is suppressed.

5. Fifth Embodiment

5.1 Configuration of Sensor

In a sensor 420 according to a fifth embodiment of the present technology, as illustrated in FIG. 26A, an uneven layer 25 is disposed on a substrate 23, and a REF electrode layer 26 is disposed between an intermediate layer 24 and the substrate 23. The substrate 23 is not bonded to the REF electrode layer 26 which is a lower layer of the substrate 23 with an adhesive layer or the like, but is in a state of only being placed thereon. The uneven layer 25 and the substrate 23 are bonded to each other with an adhesive layer or the like. A bottom of a pressing units 41 is located inside a hole portion 24a of the intermediate layer 24 when the sensor 420 is viewed in plan view from the Z-axis direction. Incidentally, in the configuration in which the uneven layer 25 is disposed on the substrate 23 as in the fifth embodiment, the substrate 23 is a base layer.

The sensor 420 according to the fifth embodiment is similar to the sensor 20 according to the first embodiment in points other than those described above.

5.2 Operation of Sensor (Gesture Input Operation)

As illustrated in FIG. 27A, when gesture input operation is performed on a front surface (operation surface) of the sensor 420, the REF electrode layer 26 is pushed by the bottom of the pressing unit 41, and a portion located above the hole portion 24a in the REF electrode layer 26 slightly falls into the hole portion 24a of the intermediate layer 24. As a result, a distance between a sensor layer 22 and the REF electrode layer 26 is slightly displaced by D1, and the electrostatic capacitance between unit electrode bodies 31b and 32b slightly changes. The sensing unit 22s in the sensor layer 22 detects this change in electrostatic capacitance and outputs the change to the controller IC 13 as an electric signal.

(Key Input Operation)

As illustrated in FIG. 27B, when key input operation is performed on a front surface (operation surface) of the sensor 420, a first structure unit 41a is inverted, the REF electrode layer 26 is pressed against a back surface of the pressing unit 41, and a portion located above the hole portion 24a in the REF electrode layer 26 slightly falls into the hole portion 24a of the intermediate layer 24. At this time, due to the inversion of the first structure unit 41a, a second structure unit 41b also falls into the hole portion 24a of the intermediate layer 24. As a result, a distance between the sensor layer 22 and the REF electrode layer 26 is largely displaced by D2, and the electrostatic capacitance between the unit electrode bodies 31b and 32b largely changes. The sensing unit 22s in the sensor layer 22 detects this change in electrostatic capacitance and outputs the change to the controller IC 13 as an electric signal.

In a case where the second structure unit 41b is pressed against the substrate 23 and crushed by the key input operation, vent holes (not illustrated) are formed on both sides of a shape portion 41c. When pressing of the key 27a is released, the second structure unit 41b returns to its original shape and sucks air. At this time, air is supplied from the outside of the second structure unit 41b via the vent holes. Therefore, suction of the substrate 23 by the second structure unit 41*b* is suppressed.

5.3 Effect

In the sensor 420 having the above-described configuration, vent holes (not illustrated) are formed on both sides of the shape portion 41*c* in a state where the second structure unit 41*b* is crushed. As a result, when pressing of a key 27*a* is released, suction of the substrate 23 by the second structure unit 141*b* is suppressed. Therefore, returning failure of the pressing unit 141 is suppressed. In addition, in the sensor 420 having the above-described configuration, the REF electrode layer 26 is disposed on the intermediate layer 24. This configuration can easily and constantly adjust a distance between the sensor layer 22 and the REF electrode layer 26, as compared with the configuration in which the REF electrode layer 26 is disposed on the uneven layer 25. Therefore, the sensor 420 according to the fifth embodiment is more easily manufactured than the sensor 20 according to the first embodiment.

In the sensor 420 having the above-described configuration, the substrate 23 is only placed without being bonded to the REF electrode layer 26. Therefore, even in a case where the sensor layer 22 and the uneven layer 25 expand and contract in an in-plane direction of the sensor layer 22 due to a change in ambient temperature or the like, the sensor layer 22 and the uneven layer 25 can be displaced independently. Therefore, it is possible to suppress generation of distortion or the like in a member constituting the sensor 420, and therefore reliability of the sensor 420 can be improved.

5.4 Modified Example

In the sensor 420 according to the fifth embodiment, the configuration of Modified Example of the first embodiment may be adopted.

As illustrated in FIG. 26B, a configuration in which the substrate 23 is not disposed and the uneven layer 25 is directly disposed on the REF electrode layer 26 may be adopted. That is, a configuration in which only the REF electrode layer 26 is disposed between the intermediate layer 24 and the uneven layer 25 may be adopted. In this case, the uneven layer 25 and the REF electrode layer 26 may be bonded to each other via an adhesive layer (not illustrated) or the like.

6 Sixth Embodiment

6.1 Configuration of Sensor

A sensor 520 according to a sixth embodiment of the present technology is different from the sensor 420 according to the fifth embodiment in including, as illustrated in FIG. 28A, a substrate 123 having one or more hole portions 123*a* at positions facing a back surface of a second structure unit 141*b* instead of having one or more shape portions 41*c* (see FIG. 26A) in the second structure unit 41*b*. Incidentally, in the sixth embodiment, the same reference numerals are given to portions similar to the fifth embodiment, and description thereof will be omitted.

The substrate 123 and an uneven layer 125 are similar to those in the second embodiment, respectively.

6.2 Effect

In the sensor 520 according to the sixth embodiment, the hole portion 123*a* is formed at a position facing a back surface of the second structure unit 141*b*. Therefore, in a state where the second structure unit 141*b* is crushed by pressing of a key 27*a*, the hole portion 123*a* functions as a vent hole. As a result, when pressing of the key 27*a* is released, suction of the substrate 123 by the second structure unit 141*b* is suppressed. Therefore, returning failure of a pressing unit 141 is suppressed.

6.3 Modified Example

In the sensor 520 according to the sixth embodiment, the configuration of Modified Example of the second embodiment may be adopted. For example, as illustrated in FIG. 28B, one or more hole portions 123*a* may be partially disposed at positions facing a boundary portion between a first structure unit 41*a* and the second structure unit 141*b*. The hole portion 123*a* is similar to that in Modified Example of the second embodiment.

The hole portions 123*a* may be formed in both the substrate 123 and the REF electrode layer 26.

The uneven layer 125 may be directly disposed on the REF electrode layer 26 without disposing the substrate 123, and the hole portion 123*a* may be formed in the REF electrode layer 26.

7 Seventh Embodiment

7.1 Configuration of Sensor

A sensor 620 according to a seventh embodiment of the present technology is different from the sensor 420 according to the fifth embodiment in partially having, as illustrated in FIG. 29A, one or more shape portions 228 in a substrate 223 at positions facing a boundary portion between a first structure unit 41*a* and a second structure unit 141*b* instead of having one or more shape portions 41*c* (see FIG. 26A) in the second structure unit 41*b*. Incidentally, in the seventh embodiment, the same reference numerals are given to portions similar to the fifth embodiment, and description thereof will be omitted.

The shape portion 228 is similar to that in Modified Example of the third embodiment.

7.2 Effect

In the sensor 620 according to the seventh embodiment, one or more shape portions 228 are partially formed at positions facing a boundary portion between the first structure unit 41*a* and the second structure unit 141*b*. Therefore, when a key 27*a* of the sensor 620 is pressed to perform a key input operation, the first structure unit 41*a* is inverted, and the boundary portion between the first structure unit 41*a* and the second structure unit 141*b* is held by the shape portion 228 in a state floating from a surface of the substrate 223. In this state, a gap is formed in a part of a space between the boundary portion between the first structure unit 41*a* and the second structure unit 141*b* and the surface of the substrate 223. Therefore, when pressing of the key 27*a* is released, suction of the substrate 223 by the second structure unit 141*b* is suppressed. Therefore, returning failure of the pressing unit 141 is suppressed.

7.3 Modified Example

Instead of having one or more shape portions 228 (FIG. 29A) in the sensor layer 22 at positions facing a boundary portion between the first structure unit 41*a* and the second structure unit 141b, as illustrated in FIG. 29B, the substrate 223 may have one or more shape portions 228 at positions facing a back surface of the second structure unit 141b.

In the sensor 620 having the shape portion 228 on the substrate 223, when the second structure unit 141b is deformed from a boundary portion between the first structure unit 41a and the second structure unit 141b as a starting point by pressing of the key 27a, a top of the deformed second structure unit 141b is supported by the shape portion 228. For this reason, crushing of the second structure unit 141b is suppressed. Therefore, when the second structure unit 141b returns to its original shape by releasing pressing of the key 27a, it is possible to suppress suction of the second structure unit 141b by the substrate 223. Therefore, returning failure of the pressing unit 141 is suppressed.

The uneven layer 125 may be directly disposed on the REF electrode layer 26 without disposing the substrate 23, and the electrode layer 26 may have one or more shape portions 228 at positions facing a boundary portion between the first structure unit 41a and the second structure unit 141b, or may have one or more shape portions 228 at positions facing a back surface of the second structure unit 141b.

8 Eighth Embodiment

8.1 Configuration of Sensor

A sensor 720 according to an eighth embodiment of the present technology is different from the sensor 420 according to the fifth embodiment in including, as illustrated in FIG. 30, a second structure unit 341b having one or more through holes 341c on a side surface thereof instead of including the second structure unit 41b (see FIG. 26A) having one or more shape portions 41c on a side surface thereof. Incidentally, in the eighth embodiment, the same reference numerals are given to portions similar to the fifth embodiment, and description thereof will be omitted.

An uneven layer 325 is similar to that in the fourth embodiment.

8.2 Effect

In the sensor 320 according to the eighth embodiment, the second structure unit 341b has one or more through holes 341c on a side surface thereof. Therefore, when pressing of a key 27a is released, air is supplied from the outside of the second structure unit 341b via the through hole 341c. Therefore, suction of the substrate 23 by the second structure unit 341b is suppressed. Therefore, returning failure of a pressing unit 341 is suppressed.

8.3 Modified Example

A configuration in which the substrate 23 is not disposed and the uneven layer 125 is directly disposed on the REF electrode layer 26 may be adopted. Even with this configuration, an action and an effect similar to those of the eighth embodiment can be obtained.

9 Ninth Embodiment

9.1 Configuration of Sensor

A sensor 920 according to a ninth embodiment of the present technology is different from the sensor 120 according to the second embodiment in including, as illustrated in FIG. 48, a substrate 923 having unevenness 923a on a surface facing a back surface of a pressing unit 141 instead of including the substrate 123 (see FIG. 17A) having the hole portion 123a in a surface facing a back surface of the pressing unit 141. Incidentally, in the ninth embodiment, the same reference numerals are given to portions similar to the second embodiment, and description thereof will be omitted.

In the ninth embodiment, a base layer is constituted by a laminate including a sensor layer 22, the substrate 923, and an intermediate layer 24. The base layer includes the substrate 23 facing the pressing unit 141, and the unevenness 923a is formed on the substrate 923. The unevenness 923a may be formed on the entire surface facing a back surface of the pressing unit 141 out of both surfaces of the substrate 923, may be formed only in a portion facing the pressing unit 141, or may be formed only in a portion facing a boundary portion between a first structure unit 41a and a second structure unit 141b. However, the unevenness 923a is preferably formed on the entire surface facing a back surface of the pressing unit 141 out of both surfaces of the substrate 923 from a viewpoint of productivity.

The unevenness 923a has an arithmetic average roughness Ra of 0.48 μm or more, more preferably 2.43 μm or more. If the arithmetic average roughness Ra is 0.48 μm or more, when pressing of a key 27a is released, it is possible to suppress occurrence of returning failure in the pressing unit 141 due to suction of the second structure unit 141b by a surface of the substrate 923. An upper limit value of the arithmetic average roughness Ra of the unevenness 923a is not particularly limited, but is, for example, 100 μm or less.

The unevenness 923a may be regular or irregular. Examples of a method for forming the unevenness 923a include a thermal transfer method, a light transfer method such as a UV transfer method, a printing method, a sandblasting method, and a method for applying and curing a coating material containing fine particles, but are not limited thereto.

9.2 Effect

In the sensor 920 according to the ninth embodiment, the substrate 923 has the unevenness 923a on a surface facing a back surface of the pressing unit 141. Therefore, in a state where the second structure unit 141b is crushed, the unevenness 923a forms a fine vent hole between a boundary portion between the first structure unit 41a and the second structure unit 141b and the substrate 923. As a result, when pressing of the key 27a is released, suction of the substrate 923 by the second structure unit 141b is suppressed. Therefore, returning failure of the pressing unit 141 is suppressed.

10 Tenth Embodiment

10.1 Configuration of Sensor

A sensor 1020 according to a tenth embodiment of the present technology is different from the sensor 20 according to the first embodiment in including, as illustrated in FIG. 49, an uneven layer 1025 having unevenness 1025a on a surface facing a substrate 23 instead of including the uneven layer 25 (see FIG. 5B) having the shape portion 41c in the second structure unit 1041b. Incidentally, in the tenth embodiment, the same reference numerals are given to portions similar to the first embodiment, and description thereof will be omitted. In addition, in the tenth embodiment, a base layer is constituted by a laminate including a sensor layer 22, the substrate 23, and an intermediate layer 24.

The uneven layer 1025 is constituted by an embossed film 1040 having a plurality of pressing units 1041 and a flat portion 1042. Each of the pressing units 1041 includes a first structure unit 1041a and the second structure unit 1041b disposed on the first structure unit 1041a. The first and second structure units 1041a and 1041b are similar to the first and second structure units 141a and 41b in the second embodiment except for having the unevenness 1025a on a surface facing the substrate 23. The unevenness 1025a may be formed on the entire surface facing the substrate 23 out of both surfaces of the embossed film 1040, may be formed only in a portion of the pressing unit 141, or may be formed only in a boundary portion between the first structure unit 1041a and the second structure unit 1041b.

The unevenness 1025a has an arithmetic average roughness Ra of 0.48 μm or more, more preferably 2.43 μm or more. If the arithmetic average roughness Ra is 0.48 μm or more, when pressing of a key 27a is released, it is possible to suppress occurrence of returning failure in the pressing unit 141 due to suction of the second structure unit 1041b by a surface of the substrate 23. An upper limit value of the arithmetic average roughness Ra of the unevenness 1025a is not particularly limited, but is, for example, 100 μm or less.

10.2 Effect

In the sensor 1020 according to the tenth embodiment, the uneven layer 1025 has the unevenness 1025a on a surface facing the substrate 23. Therefore, in a state where the second structure unit 41b is crushed, the unevenness 1025a forms a fine vent hole between a boundary portion between the first structure unit 1041a and the second structure unit 1041b and the substrate 23. As a result, when pressing of the key 27a is released, suction of the substrate 23 by the second structure unit 1041b is suppressed. Therefore, returning failure of the pressing unit 141 is suppressed.

10.3 Modified Example

The sensor 1020 may include the substrate 923 in the ninth embodiment instead of the substrate 23.

11 Eleventh Embodiment

11.1 Structure of Sensor

A sensor 1120 according to an eleventh embodiment of the present technology is different from the sensor 520 according to the sixth embodiment in including, as illustrated in FIG. 50, a substrate 1123 having unevenness 923a on a surface facing a back surface of a pressing unit 141 instead of including the substrate 123 (see FIG. 28A) having the hole portion 123a. Incidentally, in the eleventh embodiment, the same reference numerals are given to portions similar to the sixth embodiment, and description thereof will be omitted. In addition, in the eleventh embodiment, the substrate 1123 is a base layer.

The substrate 1123 is similar to the substrate 923 in the ninth embodiment.

11.2 Effect

In the sensor 1120 according to the eleventh embodiment, the substrate 1123 has the unevenness 923a on a surface facing a back surface of the pressing unit 141. Therefore, in a state where the second structure unit 141b is crushed by pressing of a key 27a, the unevenness 923a forms a fine vent hole between a boundary portion between a first structure unit 41a and a second structure unit 141b and the substrate 1123. As a result, when pressing of the key 27a is released, suction of the substrate 1123 by the second structure unit 141b is suppressed. Therefore, returning failure of the pressing unit 141 is suppressed.

11.3 Modified Example

A configuration in which the substrate 1123 is not disposed between an uneven layer 125 and a REF electrode layer 26 and the unevenness 923a is formed on a surface facing a back surface of the pressing unit 141 out of both surfaces of the REF electrode layer 26 may be adopted.

12 Twelfth Embodiment

12.1 Configuration of Sensor

A sensor 1220 according to a twelfth embodiment of the present technology is different from the sensor 420 according to the fifth embodiment in including an uneven layer 1225 having unevenness 1025a on a surface facing a substrate 23 instead of including the uneven layer 25 (see FIG. 26A) having the shape portion 41c in the second structure unit 41b. Incidentally, in the twelfth embodiment, the same reference numerals are given to portions similar to the fifth embodiment, and description thereof will be omitted. In addition, in the twelfth embodiment, the substrate 23 is a base layer.

The uneven layer 1225 is similar to the uneven layer 1025 in the tenth embodiment.

12.2 Effect

In the sensor 1220 according to the twelfth embodiment, the uneven layer 1225 has the unevenness 1025a on a surface facing the substrate 23. Therefore, in a state where a second structure unit 141b is crushed by pressing of a key 27a, the unevenness 1025a forms a fine vent hole between a boundary portion between a first structure unit 1041a and the second structure unit 1041b and the substrate 23. As a result, when pressing of the key 27a is released, suction of the substrate 23 by the second structure unit 1041b is suppressed. Therefore, returning failure of a pressing unit 1041 is suppressed.

12.3 Modified Example

The sensor 1220 may include the substrate 1123 in the eleventh embodiment instead of the substrate 23.

EXAMPLES

Hereinafter, the present technology will be described specifically with Examples, but the present technology is not limited only to these Examples.

Examples will be described in the following order.

i Sensor having shape portion in second structure unit ii Sensor having hole portion in substrate iii Sensor having fine unevenness on underlying film i Sensor Having Shape Portion in Second Structure Unit Example 1-1

First, a transfer master plate was manufactured by cutting aluminum. Subsequently, the transfer master plate and a PC film having a thickness of 100 μm were superimposed and set in a high temperature vacuum press machine, and thermally pressed to form a pressing unit having the configuration illustrated in FIGS. 31A and 31B on the PC film. At this time, as illustrated in FIGS. 31A and 31B, one recessed shape portion having a substantially rectangular shape with a width w of 1 mm and a depth d of 0.1 mm was formed on a back surface of a second structure unit. The recessed shape portion was formed on a bottom side periphery of a side surface of the second structure unit. In addition, a height $H_1$ of a first structure unit was set to 200 μm, and a height $H_2$ of the second structure unit was set to 270 μm. As a result, an embossed film was obtained. Thereafter, the PC film as a substrate was bonded to a back surface of the embossed film via an adhesive layer to obtain a structure.

Subsequently, an electrostatic capacitance type sensor layer was prepared, and a REF electrode layer was formed on a back side of this sensor layer. Subsequently, an insulating layer and an adhesive layer were sequentially formed on a surface of the sensor layer by a printing method to form an intermediate layer in which a plurality of hole portions was two-dimensionally disposed. Thereafter, the REF electrode layer was bonded to a surface of the intermediate layer via the adhesive layer. Subsequently, a structure was placed on the REF electrode layer such that the plurality of pressing units of the embossed film coincided with the positions of the plurality of hole portions of the intermediate layer, respectively. Subsequently, a key top layer was prepared, and the key top layer was bonded to a top of the pressing unit of the structure via an adhesive layer. As a result, an objective sensor was obtained.

Example 1-2

As illustrated in FIG. 31C, a sensor was obtained in a similar manner to Example 1-1 except that four recessed shape portions were formed on a bottom side periphery of a side surface of the second structure unit at regular intervals.

Example 1-3

As illustrated in FIGS. 32A and 32B, a sensor was obtained in a similar manner to Example 1-1 except that a depth d of the recessed shape portion was set to 0.2 mm and the length of the recessed shape portion was made long.

Example 1-4

As illustrated in FIG. 32C, a sensor was obtained in a similar manner to Example 1-3 except that four recessed shape portions were formed on a bottom side periphery of a side surface of the second structure unit at regular intervals.

Example 2-1

As illustrated in FIGS. 33A and 33B, a sensor was obtained in a similar manner to Example 1-1 except that one protruding shape portion having a substantially semicircular shape with a diameter D3 of 1 mm was formed on a back surface of the second structure unit.

Example 2-2

As illustrated in FIG. 34A, a sensor was obtained in a similar manner to Example 2-1 except that four protruding shape portions were formed on a bottom side periphery of a side surface of the second structure unit at regular intervals.

Example 2-3

As illustrated in FIG. 34B, a sensor was obtained in a similar manner to Example 2-1 except that the diameter D3 of the protruding shape portion was set to 2 mm.

Example 2-4

As illustrated in FIG. 34C, a sensor was obtained in a similar manner to Example 2-3 except that four protruding shape portion were formed on a bottom side periphery of a side surface of the second structure unit at regular intervals.

Example 3-1

As illustrated in FIGS. 35A and 35B, a sensor was obtained in a similar manner to Example 2-1 except that one protruding shape portion having a substantially semicircular shape with a diameter D3 of 1 mm was formed on a top side periphery of a side surface of the second structure unit.

Example 3-2

As illustrated in FIG. 36A, a sensor was obtained in a similar manner to Example 3-1 except that four protruding shape portions were formed on a top side periphery of a side surface of the second structure unit at regular intervals.

Example 3-3

As illustrated in FIG. 36B, a sensor was obtained in a similar manner to Example 3-1 except that the diameter D3 of the protruding shape portion was set to 2 mm.

Example 3-4

As illustrated in FIG. 36C, a sensor was obtained in a similar manner to Example 3-3 except that two protruding shape portion were formed on a top side periphery of a side surface of the second structure unit at regular intervals.

Example 4-1

As illustrated in FIGS. 37A and 37B, a sensor was obtained in a similar manner to Example 1-1 except that a cross-shaped protruding shape portion was formed on a back surface of a top of the second structure unit.

Example 4-2

As illustrated in FIG. 37C, a sensor was obtained in a similar manner to Example 4-2 except that the size of the cross-shaped protruding shape portion was changed.

Example 5-1

A sensor was obtained in a similar manner to Example 1-1 except that, as illustrated in FIGS. 38A and 38B, the height $H_1$ of the first structure unit was set to 250 μm and the height $H_2$ of the second structure unit was set to 200 μm instead of forming the recessed shape portion on a back side periphery of a side surface of the second structure unit.

Comparative Example 5-1

A sensor was obtained in a similar manner to Example 5-1 except that the height $H_1$ of the first structure unit was set to 200 μm and the height $H_2$ of the second structure unit was set to 270 μm.

Comparative Example 5-2

A sensor was obtained in a similar manner to Example 5-1 except that the height $H_1$ of the first structure unit was set to 225 μm and the height $H_2$ of the second structure unit was set to 235 μm.

(Evaluation of Returning Failure)

Each of the keys of the sensors obtained as described above in Examples 1-1 to 5-1 and Comparative Examples 5-1 and 5-2 was strongly pressed with a finger cushion, and abnormal noise generated upon returning of a pressing unit was evaluated in five stages. Incidentally, by evaluating no generation of abnormal noise as "0" and evaluating abnormal noise in Comparative Example 5-1 as "5", evaluation was performed in five stages.

(Evaluation of Click Feeling)

A click feeling of each of the sensors obtained as described above in Examples 1-3, 1-4, 2-3, 2-4, and 5-1 was evaluated as follows. First, using a robot, the robot was moved in a z direction (direction perpendicular to an operation surface) at 1 mm/s, and a key of each of the sensors was pressed with an indenter (silicone pseudo finger, φ 6 mm) attached to the robot. At that time, a pressure applied to the indenter was measured with a load cell. A distance-pressure curve (hereinafter referred to as "F-S curve") was thereby obtained. Subsequently, a click ratio ((P1−P2)/P1) was calculated using P1 as a maximum value appearing initially in the F-S curve and P2 as a minimum value appearing after the P1, and used as an index of a click feeling.

The above evaluation of a click feeling was performed on three different keys for each sensor (for example, "V", "B", and "N" keys in the sensor of Example 1-1).

(Evaluation of Amount of Change in Electrostatic Capacitance)

The amount of change in electrostatic capacitance of each of the sensors obtained as described above in Examples 1-3, 1-4, 2-3, 2-4, and 5-1 was evaluated as follows. First, a controller IC was connected to each of the sensors. Subsequently, using the above robot, a load was applied to a key of each of the sensors, and the amount of change in electrostatic capacitance supplied from the controller IC was measured. While the load applied to the key of each of the sensors was increased by a predetermined amount, this measurement operation was performed for each load, and a change in the amount of change in electrostatic capacitance with respect to the load was determined.

The above evaluation of the amount of change in electrostatic capacitance was performed on three different keys for each sensor (for example, "A", "S", and "D" keys in the sensor in Example 1-3).

(Evaluation of Deformed Shape of Pressing Unit)

The deformed shape of each of the pressing units obtained as described above in Example 2-3 and Comparative Example 5-1 was evaluated as follows. First, in an initial state in which no pressing force was applied to a pressing unit of an embossed film, a profile of the pressing unit was measured with a laser displacement meter. Subsequently, using a robot, the robot was moved in a z direction (direction perpendicular to an operation surface), and the pressing unit was pressed with an indenter (silicone pseudo finger, φ 6 mm) attached to the robot. Subsequently, a profile of the pressing unit in this state was measured with a laser displacement meter.

(Result)

Table 1 illustrates the configurations of sensors and evaluation results of returning failure.

TABLE 1

| | Height $H_1$ of first structure unit $H_1$[mm] | Height $H_2$ of second structure unit $H_2$[mm] | Shape portion | | | | | | Evaluation result of returning failure |
|---|---|---|---|---|---|---|---|---|---|
| | | | Uneven shape | Entire shape | Disposition position | Number | Width w, Diameter $D_3$ [mm] | Depth d, Height h [mm] | |
| Example 1-1 | 200 | 270 | Recessed shape | Substantially rectangular shape | Side surface (bottom side) | 1 | 1 | 0.1 | 4 |
| Example 1-2 | | | | | | 4 | 1 | 0.1 | 3 |
| Example 1-3 | | | | | | 1 | 1 | 0.2 | 1 |
| Example 1-4 | | | | | | 4 | 1 | 0.2 | 0 |
| Example 2-1 | | | Protruding shape | Substantially semicircular shape | Side surface (bottom side) | 1 | 1 | — | 4 |
| Example 2-2 | | | | | | 4 | 1 | — | 4 |
| Example 2-3 | | | | | | 1 | 2 | — | 1 |
| Example 2-4 | | | | | | 4 | 2 | — | 0 |
| Example 3-1 | | | Protruding shape | Substantially semicircular shape | Side surface (top side) | 1 | 1 | — | 4 |
| Example 3-2 | | | | | | 4 | 1 | — | 4 |
| Example 3-3 | | | | | | 1 | 2 | — | 4 |
| Example 3-4 | | | | | | 2 | 2 | — | 4 |
| Example 4-1 | | | Protruding shape | Cross shape | Top | 1 | 0.7, 2 | 0.14 | 4 |
| Example 4-2 | | | | | | 1 | 0.8, 2.5 | 0.18 | 4 |
| Example 5-1 | 250 | 200 | — | — | — | — | — | — | 4 |
| Comparative Example 5-1 | 200 | 270 | — | — | — | — | — | — | 5 |
| Comparative Example 5-3 | 225 | 235 | — | — | — | — | — | — | 5 |

However, in Table 1, the "protruding shape" means a protruding shape protruding toward a sensor layer, and the "recessed shape" means a recessed shape recessed in a direction away from the sensor layer.

Table 1 indicates the following. By forming a recessed shape portion or a protruding shape portion on a back surface of a side surface of a second structure unit, returning failure is suppressed. As the size of the recessed shape portion or the protruding shape portion is increased or the number of the recessed shape portions or the protruding shape portions is increased, an effect of suppressing returning failure is improved. A configuration in which a recessed shape portion or a protruding shape portion is formed on a bottom side periphery of a side surface of a second structure unit can obtain a higher effect of suppressing returning failure than a configuration in which a recessed shape portion or a protruding shape portion is formed on a top side periphery of a side surface of the second structure unit.

Also in a case where the recessed shape portion is formed on a top of the second structure unit, returning failure is suppressed. However, a configuration in which a recessed shape portion or a protruding shape portion is formed on a back surface of a side surface of a second structure unit can obtain a higher effect of suppressing returning failure than a configuration in which a protruding shape portion is formed on a back surface of a top of the second structure unit. Also by setting the depth of the second structure unit to 200 μm or less, returning failure is suppressed.

Table 2 illustrates evaluation results of a click ratio.

TABLE 2

|  | P1 [gf] | P2 [gf] | Click ratio [%] |
| --- | --- | --- | --- |
| Example 1-3 | 61 | 37 | 40 |
| Example 1-4 | 75 | 44 | 41 |
| Example 2-3 | 54 | 27 | 50 |
| Example 2-4 | 59 | 35 | 42 |
| Example 5-1 | 53 | 26 | 50 |

However, in Table 2, the click ratio is a value obtained by averaging click ratios of three different keys.

FIGS. 39A, 40A, 41A, 42A, and 43A illustrate evaluation results of F-S curves of the sensors in Examples 1-3, 1-4, 2-3, 2-4, and 5-1, respectively. FIGS. 39B, 40B, 41B, 42B, and 43B illustrate evaluation results of the amounts of change in electrostatic capacitance of the sensors in Examples 1-3, 1-4, 2-3, 2-4, and 5-1, respectively. Note that the numerical values illustrated in FIGS. 39B, 40B, 41B, 42B, and 43B each indicate "a difference in the amount of change in electrostatic capacitance" when the first structure unit is inverted (buckled).

FIGS. 39A to 43B and Table 2 indicate the following. A sensor in which a recessed shape portion or a protruding shape portion is formed on a back surface of a side surface of a second structure unit to suppress returning failure has keying characteristics equal to or higher than a sensor in which the height of the second structure unit is reduced to suppress returning failure. That is, by forming a recessed shape portion or a protruding shape portion on a back surface of a side surface of the second structure unit, it is possible to suppress returning failure while suppressing reduction in the keying characteristics.

FIG. 44A illustrates evaluation results of the shape of the pressing unit in Example 2-3. FIG. 44B illustrates evaluation results of the shape of the pressing unit in Comparative Example 5-1. Note that a portion surrounded by a broken line in FIG. 44A indicates the profile of a protruding shape portion. These evaluation results indicate the following. In a sensor in which a protruding shape portion is formed on a bottom side periphery of a side surface of a second structure unit, in a state where the second structure unit is crushed, vent holes (gaps) are formed on both sides of the protruding shape portion (both sides in the Y-axis direction in FIG. 44A). Therefore, an internal space of the second structure unit communicates with the outside. Meanwhile, in a sensor in which a protruding shape portion is not formed on a bottom side periphery of a side surface of the second structure unit, in a state where the second structure unit is crushed, an internal space of the second structure unit is closed.

ii Sensor with Hole Portion in Substrate

Examples 6-1 to 6-3

A sensor was obtained in a similar manner to Example 1-1 except that a slit-shaped hole portion passing through the center of a second structure unit and having both ends located inside first and second boundaries was formed in a substrate as illustrated in FIG. 45A instead of forming a protruding shape portion on a side surface of the second structure unit. Note that the length L of the hole portion was changed for each sample so as to be 1 mm, 2 mm, or 4 mm.

Example 6-4

As illustrated in FIG. 45B, a sensor was obtained in a similar manner to Example 6-1 except that both ends of a slit-shaped hole portion were extended to the positions of first and second boundaries.

Example 6-5

As illustrated in FIG. 45C, a sensor was obtained in a similar manner to Example 6-1 except that both ends of a slit-shaped hole portion were extended to positions beyond first and second boundaries.

Example 7-1

A sensor was obtained in a similar manner to Example 1-1 except that two hole portions each having a circular shape of D4=2 mm and disposed at the positions of a boundary portion between first and second structure units were formed as illustrated in FIG. 46A instead of forming a protruding shape portion on a side surface of the second structure unit. Note that the positions at which the two hole portions were disposed were positions facing each other across the center of the second structure unit.

Example 7-2

As illustrated in FIG. 46B, a sensor was obtained in a similar manner to Example 7-1 except that the number of hole portions was four and the hole portions were disposed in a boundary portion between first and second structure units at regular intervals.

Example 7-3

As illustrated in FIG. 47A, a sensor was obtained in a similar manner to Example 7-1 except that the shape of a hole portion was an oval shape having a length L of 2 mm.

Example 7-4

As illustrated in FIG. 47B, a sensor was obtained in a similar manner to Example 7-1 except that the number of hole portions was four and the hole portions were disposed in a boundary portion between first and second structure units at regular intervals.

Examples 8-1 to 8-5 and 9-1 to 9-4

A sensor was obtained in a similar manner to Examples 6-1 to 6-5 and 7-1 to 7-4 except that a porous plate was disposed between a sensor layer and a PC film as a substrate.

(Evaluation of Returning Failure)

Returning failure of each of the sensors obtained as described above in Examples 6-1 to 6-5, 7-1 to 7-4, 8-1 to 8-5, and 9-1 to 9-4 was evaluated. An evaluation method was similar to the method for evaluating returning failure described above.

(Evaluation of Click Feeling)

A click feeling obtained as described above in each of Example 6-1 and Comparative Example 5-1 was evaluated. An evaluation method was similar to the method for evaluating a click feeling described above.

(Result)

Table 3 illustrates the configurations of sensors and evaluation results of returning failure.

TABLE 3

| | Presence or absence of porous plate | Slit of base layer | | | Evaluation result of returning failure |
|---|---|---|---|---|---|
| | | Disposition position | Number | Length L [mm] | |
| Example 6-1 | Absence | Position facing second structure unit | 1 | 1 | 3 |
| Example 6-2 | | | 1 | 2 | 3 |
| Example 6-3 | | | 1 | 4 | 3 |
| Example 6-4 | | | 1 | 6 | 0 |
| Example 6-5 | | | 1 | 8 | 0 |
| Example 7-1 | | Position facing boundary portion between first and second structure units | 2 | 1 | 1 |
| Example 7-2 | | | 4 | 1 | 0 |
| Example 7-3 | | | 2 | 2 | 0 |
| Example 7-4 | | | 4 | 2 | 0 |
| Example 8-1 | Presence | Position facing second structure unit | 1 | 1 | 0 |
| Example 8-2 | | | 1 | 2 | 0 |
| Example 8-3 | | | 1 | 4 | 0 |
| Example 8-4 | | | 1 | 6 | 0 |
| Example 8-5 | | | 1 | 8 | 0 |
| Example 9-1 | | Position facing boundary portion between first and second structure units | 2 | 1 | 1 |
| Example 9-2 | | | 4 | 1 | 0 |
| Example 9-3 | | | 2 | 2 | 0 |
| Example 9-4 | | | 4 | 2 | 0 |

Table 3 indicates the following. By forming a hole portion at a surface position of a substrate facing a second structure unit, it is possible to suppress occurrence of returning failure. In this case, in plan view from the Z-axis direction, by extending the hole portion to a boundary portion between first and second structure units or extending the hole portion from the inside to the outside of the boundary portion between the first and second structure units, occurrence of returning failure can be particularly suppressed.

Also in a case where a hole portion is formed at a surface position of the substrate facing a boundary portion between the first and second structure units, an effect of suppressing returning failure can be obtained. In this case, a particularly excellent effect can be obtained by increasing the number of hole portions or by forming each of the hole portions in an elongated shape radially extending from the center of a pressing unit.

Table 4 illustrates evaluation results of a click ratio.

TABLE 4

| | P1 [gf] | P2 [gf] | Click ratio [%] |
|---|---|---|---|
| Example 6-5 | 57 | 26 | 55 |
| Comparative Example 5-1 | 57 | 25 | 57 |

Table 4 indicates the following. A sensor with a hole portion in a substrate to suppress returning failure has almost the same keying characteristics as a sensor having no hole portion in the substrate. That is, by forming a hole portion in the substrate, it is possible to suppress returning failure while suppressing reduction in the keying characteristics.

iii Sensor with Fine Unevenness on Underlying Film

Examples 10-1 to 1-7

First, an embossed film was obtained in a similar manner to Example 1-1 except that a recessed shape portion was not formed on a side surface of a second structure unit. Subsequently, a commercially available PC film was prepared, and one surface of the PC film was subjected to unevenness processing to form fine unevenness having an arithmetic average roughness Ra illustrated in Table 5. An underlying film was thereby obtained.

Subsequently, an insulating layer and an adhesive layer were sequentially formed on a surface of the underlying film by a printing method to form an intermediate layer in which a plurality of hole portions was two-dimensionally disposed. Thereafter, an embossed film was bonded to the intermediate layer via an adhesive layer such that a plurality of pressing units of the embossed film coincided with positions of the plurality of hole portions of the intermediate layer, respectively. Subsequently, a REF electrode layer was bonded to the pressing unit of the embossed film via an adhesive layer, and then a key top layer was bonded to the REF electrode layer via an adhesive layer.

Subsequently, an electrostatic capacitance type sensor layer was prepared, and a REF electrode layer was formed on a back surface of the sensor layer. Thereafter, an underlying film having an intermediate layer, an embossed layer, and a key top layer formed thereon was placed on a surface of the sensor layer. At this time, the underlying film was placed on the sensor layer such that a plurality of sensing units of the sensor layer coincided with the positions of the plurality of hole portions of the intermediate layer, respectively. As a result, an objective sensor was obtained.

Comparative Example 10-1

A sensor was obtained in a similar manner to Example 10-1 except that one surface of a commercially available PC film was not subjected to unevenness processing but was used as an underlying film.

Evaluation of Arithmetic Average Roughness Ra

An arithmetic average roughness Ra of a surface of each of the underlying films obtained as described above and used in the sensors of Examples 10-1 to 10-7 and Comparative Example 10-1 was determined with a contact type profilometer (P-15 manufactured by KLA-Tencor). Measurement conditions are illustrated below.

Measurement range: 5 mm×5 mm, interval of 265 µm x 20 scan

Resolution: 0.2 µm

Measuring needle 2 mm (conical angle 60°), made of diamond (Evaluation of Returning Failure)

Each of the keys of the sensors obtained as described above in Examples 10-1 to 10-7 and Comparative Example 10-1 was strongly pressed with a finger cushion, and a state of returning of a pressing unit was evaluated in the following six stages.

5: Returning failure occurs (returning does not completely occur)

4: Returning failure occurs in some keys (returning does not completely occur)

3: Returning failure occurs in some keys (it takes time for returning)

2: Returning occurs but abnormal noise is generated

1: Returning occurs in some keys but abnormal noise is generated

0: No returning failure occurs

Table 5 illustrates the configurations of sensors and evaluation results in Examples 10-1 to 10-7 and Comparative Example 10-1.

TABLE 5

|  | Presence or absence of uneven processing | Ra [µm] | Evaluation result of returning failure |
|---|---|---|---|
| Example 10-1 | Presence | 0.48 | 4 |
| Example 10-2 | Presence | 0.59 | 4 |
| Example 10-3 | Presence | 1.18 | 3 |
| Example 10-4 | Presence | 2.43 | 0 |
| Example 10-5 | Presence | 3.28 | 0 |
| Example 10-6 | Presence | 10.14 | 0 |
| Example 10-7 | Presence | 15.44 | 0 |
| Comparative Example 10-1 | Absence | 0.07 | 5 |

Table 5 indicates the following. If the arithmetic average roughness Ra is 0.48 µm or more, it is possible to suppress returning failure of a key. In addition, if the arithmetic average roughness Ra is 2.43 µm or more, it is possible to prevent returning failure of a key.

Hereinabove, embodiments of the present technology have been described specifically. However, the present technology is not limited to the above-described embodiments, but various modifications based on a technical idea of the present technology can be made.

For example, the configurations, the methods, the steps, the forms, the materials, the numerical values, and the like exemplified in the above-described embodiments are only examples, and a configuration, a method, a step, a form, a material, a numerical value, and the like different therefrom may be used, as necessary.

In addition, the configurations, the methods, the steps, the forms, the materials, the numerical values, and the like in the above-described embodiments can be combined to one another as long as not departing from the gist of the present technology.

In addition, in the first to twelfth embodiments and Modified Examples thereof, a sensor may further include an air layer (space layer) between a sensor layer and a REF electrode layer disposed on a back side of the sensor layer.

In addition, the configurations of the X and Y electrodes illustrated in FIG. 16 in Modified Example of the first embodiment can be adopted in the second to twelfth embodiments and Modified Examples thereof. In a case of adopting such a configuration, an air layer (space layer) may be disposed between the sensor layer and the REF electrode layer disposed on a back side of the sensor layer.

In addition, the present technology can adopt the following configurations.

(1)

A sensor including:

a base layer; and a pressing unit protruding with respect to the base layer, in which the pressing unit includes a first structure unit and a hollow second structure unit disposed on the first structure unit and having a bottom side opened, and the second structure unit has a shape portion on a surface facing the base layer.

(2)

The sensor according to (1), in which the base layer includes an intermediate layer having a hole portion into which the pressing unit is pushed.

(3)

The sensor according to (1) or (2), in which the second structure unit has a frustum shape, and the shape portion is formed on a side surface of the second structure unit.

(4)

The sensor according to (3), in which the shape portion is formed on a periphery on a bottom side of the side surface.

(5)

The sensor according to (3), in which the shape portion is formed on a periphery on a top side of the side surface.

(6)

The sensor according to (1), in which the shape portion is formed on a top of the second structure unit, and the shape portion protrudes toward the base layer.

(7)

The sensor according to any one of (1) to (6), in which the pressing unit is constituted by an embossed film.

(8)

The sensor according to any one of (1) to (7), in which the pressing unit further includes a third structure unit, and the first structure unit is disposed on the third structure unit.

(9)

The sensor according to any one of (1) to (8), in which the base layer includes a sensor layer including a sensing unit, and the pressing unit is disposed corresponding to the sensing unit.

(10)

The sensor according to any one of (1) to (9), further including a flexible conductor layer, in which the conductor layer is disposed on the pressing unit.

(11)

The sensor according to (2), further including a flexible conductor layer, in which the conductor layer is disposed between the intermediate layer and the pressing unit.

(12)

The sensor according to any one of (1) to (11), in which the first structure unit is a buckling unit that is inverted by pressing.

(13)

A sensor including:

a base layer; and a pressing unit protruding with respect to the base layer, in which the pressing unit includes a first structure unit and a hollow second structure unit disposed on the first structure unit and having a bottom side opened, and the base layer has a shape portion at a position facing the second structure unit and/or at a position facing a boundary portion between the first structure unit and the second structure unit.

(14)

The sensor according to (13), in which the base layer includes an intermediate layer having a hole portion into which the pressing unit is pushed, and the shape portion has a similar layer configuration to a part or the whole of the intermediate layer.

(15)

The sensor according to (13), in which the base layer includes a substrate facing the pressing unit, and the shape portion is integrally formed with the substrate.

(16)

A sensor including:

a base layer; and a pressing unit protruding with respect to the base layer, in which the pressing unit includes a first structure unit and a hollow second structure unit disposed on the first structure unit and having a bottom side opened, and the base layer has a hole portion at a position facing the second structure unit and/or at a position facing a boundary portion between the first structure unit and the second structure unit.

(17)

The sensor according to (16), in which the hole portion is extended from the inside to the outside of the boundary portion when the hole portion is viewed from a direction perpendicular to a surface of the base layer.

(18)

A sensor including:

a base layer; and a pressing unit protruding with respect to the base layer, in which the pressing unit includes a first structure unit and a hollow second structure unit disposed on the first structure unit and having a bottom side opened, and the second structure unit has a through hole.

(19)

A sensor including:

a base layer; and a pressing unit protruding with respect to the base layer, in which the pressing unit includes a first structure unit and a hollow second structure unit disposed on the first structure unit and having a bottom side opened, the base layer has unevenness on a surface facing the pressing unit, and the unevenness has an arithmetic average roughness Ra of 0.48 µm or more.

(20)

The sensor according to (19), in which the arithmetic average roughness Ra of the unevenness is 2.43 µm or more.

(21)

The sensor according to (19) or (20), in which the unevenness is formed at least in a portion facing the pressing unit on a surface facing the pressing unit.

(22)

The sensor according to (19) or (20), in which the unevenness is formed on the entire surface facing the pressing unit.

(23)

The sensor according to any one of (19) to (22), in which the base layer includes a substrate facing the pressing unit, and the unevenness is formed on the substrate.

(24)

A sensor including:

a base layer; and a pressing unit protruding with respect to the base layer, in which the pressing unit includes a first structure unit and a hollow second structure unit disposed on the first structure unit and having a bottom side opened, the pressing unit has unevenness on a surface facing the base layer, and the unevenness has an arithmetic average roughness Ra of 0.48 µm or more.

(25)

The sensor according to (24), in which the arithmetic average roughness Ra of the unevenness is 2.43 µm or more.

(26)

The sensor according to (24) or (25), in which the pressing unit is constituted by an embossed film.

(27)

The sensor according to (26), in which the unevenness is formed on the entire surface facing the base layer out of surfaces of the embossed film.

(28)

An input device including the sensor according to any one of (1) to (27).

(29)

An electronic apparatus including the sensor according to any one of (1) to (27).

(30)

A structure disposed on an electrostatic capacitance type sensor, including:

a base layer; and a pressing unit protruding with respect to the base layer, in which the pressing unit includes a first structure unit and a hollow second structure unit disposed on the first structure unit and having a bottom side opened, and the second structure unit has a shape portion on a surface facing the base layer.

(31)

A structure disposed on an electrostatic capacitance type sensor, including:

a base layer; and a pressing unit protruding with respect to the base layer, in which the pressing unit includes a first structure unit and a hollow second structure unit disposed on the first structure unit and having a bottom side opened, and the base layer has a shape portion at a position facing the second structure unit and/or at a position facing a boundary portion between the first structure unit and the second structure unit.

(32)
A structure disposed on an electrostatic capacitance type sensor, including:
a base layer; and
a pressing unit protruding with respect to the base layer, in which
the pressing unit includes a first structure unit and a hollow second structure unit disposed on the first structure unit and having a bottom side opened, and
the base layer has a hole portion at a position facing the second structure unit and/or at a position facing a boundary portion between the first structure unit and the second structure unit.
(33)
A structure disposed on an electrostatic capacitance type sensor, including:
a base layer; and
a pressing unit protruding with respect to the base layer, in which
the pressing unit includes a first structure unit and a hollow second structure unit disposed on the first structure unit and having a bottom side opened, and
the second structure unit has a through hole.

REFERENCE SIGNS LIST

10 Electronic apparatus
11 Input device
12 Host apparatus
13 Controller IC
14, 16 Communication unit
15 Control unit
17 Display device
20 Sensor
21, 26 REF electrode layer
22 Sensor layer
22s Sensing unit
23, 123 Substrate
24 Intermediate layer
25 Uneven layer
27 Key top layer
27a Key
28, 41c, 41d, 41e, 41f Shape portion
X electrode
Y electrode
41 Pressing unit
41a First structure unit
41b Second structure unit
41g Third structure unit
123a Hole portion
341c Through hole

The invention claimed is:
1. A sensor, comprising:
a base layer including an intermediate layer;
a flexible conductor layer; and
a pressing unit that protrudes with respect to the base layer, wherein
the pressing unit includes:
 a first structure unit; and
 a hollow second structure unit on the first structure unit,
 the hollow second structure unit is open from a bottom side of the hollow second structure unit,
 the hollow second structure unit includes a through hole, and
the pressing unit is between the flexible conductor layer and the intermediate layer.

2. An input device, comprising:
a sensor, wherein the sensor includes:
 a base layer including an intermediate layer;
 a flexible conductor layer; and
 a pressing unit that protrudes with respect to the base layer, wherein
  the pressing unit includes:
   a first structure unit;
   a hollow second structure unit on the first structure unit; and
   a shape portion on a surface of the pressing unit,
  the surface of the pressing unit faces the base layer,
  the hollow second structure unit is open from a bottom side of the hollow second structure unit, and
  the pressing unit is between the flexible conductor layer and the intermediate layer.

3. An electronic apparatus, comprising:
a sensor, wherein the sensor includes:
 a base layer including an intermediate layer;
 a flexible conductor layer; and
 a pressing unit that protrudes with respect to the base layer, wherein
  the pressing unit includes:
   a first structure unit;
   a hollow second structure unit on the first structure unit; and
   a shape portion on a surface of the pressing unit,
  the surface of the pressing unit faces the base layer,
  the hollow second structure unit is open from a bottom side of the hollow second structure unit, and
  the pressing unit is between the flexible conductor layer and the intermediate layer.

4. A sensor, comprising:
a base layer including an intermediate layer;
a flexible conductor layer; and
a pressing unit that protrudes with respect to the base layer, wherein
 the pressing unit includes:
  a first structure unit; and
  a hollow second structure unit on the first structure unit,
 the hollow second structure unit is open from a bottom side of the hollow second structure unit,
 the pressing unit is between the flexible conductor layer and the intermediate layer,
 the base layer includes a hole portion at least at one of a first position or a second position,
 the first position faces the hollow second structure unit, and
 the second position faces a boundary portion between the first structure unit and the hollow second structure unit.

5. The sensor according to claim 4, wherein the hole portion extends from an inside of the boundary portion to an outside of the boundary portion when the hole portion is viewed from a direction perpendicular to a surface of the base layer.

6. A sensor, comprising:
a base layer including an intermediate layer;
a flexible conductor layer; and
a pressing unit that protrudes with respect to the base layer, wherein
 the pressing unit includes:
  a first structure unit; and
  a hollow second structure unit on the first structure unit, the hollow second structure unit is open from a bottom side of the hollow second structure unit, the pressing unit is between the flexible conductor layer and the intermediate layer, the pressing unit includes a surface that is uneven, the surface of the pressing unit faces the base layer, and unevenness of the surface of the pressing unit has an arithmetic average roughness (Ra) of at least 0.48 μm.

7. The sensor according to claim 6, wherein the Ra of the unevenness is at least 2.43 μm.

8. The sensor according to claim 6, further comprising an embossed film, wherein the embossed film includes the pressing unit.

9. The sensor according to claim 8, wherein the entire surface of the pressing unit is uneven.

10. A sensor, comprising:
a base layer including an intermediate layer;
a flexible conductor layer; and
a pressing unit that protrudes with respect to the base layer, wherein
the pressing unit includes:
a first structure unit;
a hollow second structure unit on the first structure unit; and
a shape portion on a specific surface of the pressing unit,
the specific surface of the pressing unit faces the base layer,
the hollow second structure unit is open from a bottom side of the hollow second structure unit, and
the pressing unit is between the flexible conductor layer and the intermediate layer.

11. The sensor according to claim 10, wherein
the intermediate layer includes a hole portion, and
the hole portion is configured to receive the pressing unit by a push operation on the pressing unit.

12. The sensor according to claim 10, wherein
the shape portion is on top of the hollow second structure unit, and
the shape portion protrudes toward the base layer.

13. The sensor according to claim 10, further comprising an embossed film, wherein the embossed film includes the pressing unit.

14. The sensor according to claim 10, wherein
the pressing unit further includes a third structure unit, and
the first structure unit is on the third structure unit.

15. The sensor according to claim 10, wherein
the base layer includes a sensor layer including a sensing unit, and
the pressing unit corresponds to the sensing unit.

16. The sensor according to claim 10, wherein the flexible conductor layer is on the pressing unit.

17. The sensor according to claim 10, wherein the first structure unit is a buckling unit configured to be inverted by a pressing operation.

18. The sensor according to claim 10, wherein
the hollow second structure unit has a frustum shape, and
the shape portion is on a side surface of the hollow second structure unit.

19. The sensor according to claim 18, wherein the shape portion is on a periphery of a bottom side of the side surface.

20. The sensor according to claim 18, wherein the shape portion is on a periphery of a top side of the side surface.

21. A sensor, comprising:
a base layer; and
a pressing unit that protrudes with respect to the base layer, wherein
the pressing unit includes:
a first structure unit; and
a hollow second structure unit on the first structure unit,
the hollow second structure unit is open from a bottom side of the hollow second structure unit,
the base layer includes a shape portion at least at one of a first position or a second position,
the first position faces the hollow second structure unit, and
the second position faces a boundary portion between the first structure unit and the hollow second structure unit.

22. The sensor according to claim 21, wherein
the base layer includes an intermediate layer,
the intermediate layer includes a hole portion configured to receive the pressing unit by a push operation on the pressing unit, and
the shape portion includes a layer configuration similar to that of the intermediate layer.

23. The sensor according to claim 21, wherein
the base layer includes a substrate,
the substrate faces the pressing unit, and
the shape portion is integral with the substrate.

24. A sensor, comprising:
a base layer; and
a pressing unit that protrudes with respect to the base layer, wherein
the pressing unit includes:
a first structure unit; and
a hollow second structure unit on the first structure unit,
the hollow second structure unit is open from a bottom side of the hollow second structure unit,
the base layer includes a surface that is uneven,
the surface of the base layer faces the pressing unit, and
unevenness of the surface of the base layer has an arithmetic average roughness (Ra) of at least 0.48 μm.

25. The sensor according to claim 24, wherein the Ra of the unevenness is at least 2.43 μm.

26. The sensor according to claim 24, wherein the entire surface of the base layer is uneven.

27. The sensor according to claim 24, wherein
the base layer includes a substrate,
the substrate faces the pressing unit, and
the substrate includes the surface that is uneven.

* * * * *